(12) United States Patent
Lin et al.

(10) Patent No.: US 9,847,324 B2
(45) Date of Patent: Dec. 19, 2017

(54) SEMICONDUCTOR DEVICE AND METHOD OF FORMING A VERTICAL INTERCONNECT STRUCTURE FOR 3-D FO-WLCSP

(71) Applicant: STATS ChipPAC, Ltd., Singapore (SG)

(72) Inventors: Yaojian Lin, Singapore (SG); Kang Chen, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 14/730,030

(22) Filed: Jun. 3, 2015

(65) Prior Publication Data

US 2015/0294962 A1 Oct. 15, 2015

Related U.S. Application Data

(60) Division of application No. 13/191,318, filed on Jul. 26, 2011, now Pat. No. 9,082,806, which is a
(Continued)

(51) Int. Cl.
*H01L 25/00* (2006.01)
*H01L 21/683* (2006.01)
(Continued)

(52) U.S. Cl.
CPC ............ *H01L 25/50* (2013.01); *H01L 21/568* (2013.01); *H01L 21/6835* (2013.01);
(Continued)

(58) Field of Classification Search
None
See application file for complete search history.

(56) References Cited

U.S. PATENT DOCUMENTS

| | | | |
|---|---|---|---|
| 5,250,843 | A | 10/1993 | Eichelberger |
| 5,353,498 | A | 10/1994 | Fillion et al. |

(Continued)

FOREIGN PATENT DOCUMENTS

| | | | |
|---|---|---|---|
| CN | 101075580 A | 11/2007 | |
| CN | 101996893 A | 3/2011 | |

(Continued)

*Primary Examiner* — Long Pham
(74) *Attorney, Agent, or Firm* — Robert D. Atkins; Patent Law Group: Atkins and Associates, P.C.

(57) ABSTRACT

A semiconductor device has a temporary carrier. A semiconductor die is oriented with an active surface toward, and mounted to, the temporary carrier. An encapsulant is deposited with a first surface over the temporary carrier and a second surface, opposite the first surface, is deposited over a backside of the semiconductor die. The temporary carrier is removed. A portion of the encapsulant in a periphery of the semiconductor die is removed to form an opening in the first surface of the encapsulant. An interconnect structure is formed over the active surface of the semiconductor die and extends into the opening in the encapsulant layer. A via is formed and extends from the second surface of the encapsulant to the opening. A first bump is formed in the via and electrically connects to the interconnect structure.

20 Claims, 37 Drawing Sheets

Related U.S. Application Data continuation-in-part of application No. 12/572,590, filed on Oct. 2, 2009, now Pat. No. 8,796,846, which is a division of application No. 12/333,977, filed on Dec. 12, 2008, now Pat. No. 7,642,128.

(60) Provisional application No. 61/441,561, filed on Feb. 10, 2011, provisional application No. 61/444,914, filed on Feb. 21, 2011.

(51) Int. Cl.

| | | |
|---|---|---|
| *H01L 23/498* | (2006.01) | |
| *H01L 23/538* | (2006.01) | |
| *H01L 23/552* | (2006.01) | |
| *H01L 25/065* | (2006.01) | |
| *H01L 25/10* | (2006.01) | |
| *H01L 25/07* | (2006.01) | |
| *H01L 21/56* | (2006.01) | |
| *H01L 23/31* | (2006.01) | |
| *H01L 23/00* | (2006.01) | |

(52) U.S. Cl.
CPC .. *H01L 23/49816* (2013.01); *H01L 23/49827* (2013.01); *H01L 23/5389* (2013.01); *H01L 23/552* (2013.01); *H01L 24/11* (2013.01); *H01L 24/81* (2013.01); *H01L 24/82* (2013.01); *H01L 24/96* (2013.01); *H01L 24/97* (2013.01); *H01L 25/0655* (2013.01); *H01L 25/0657* (2013.01); *H01L 25/074* (2013.01); *H01L 25/105* (2013.01); *H01L 21/561* (2013.01); *H01L 23/3157* (2013.01); *H01L 24/04* (2013.01); *H01L 24/16* (2013.01); *H01L 2221/68345* (2013.01); *H01L 2221/68381* (2013.01); *H01L 2223/54426* (2013.01); *H01L 2224/03002* (2013.01); *H01L 2224/03003* (2013.01); *H01L 2224/0401* (2013.01); *H01L 2224/04105* (2013.01); *H01L 2224/0557* (2013.01); *H01L 2224/0613* (2013.01); *H01L 2224/12105* (2013.01); *H01L 2224/131* (2013.01); *H01L 2224/13014* (2013.01); *H01L 2224/13021* (2013.01); *H01L 2224/13025* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/14104* (2013.01); *H01L 2224/16111* (2013.01); *H01L 2224/16145* (2013.01); *H01L 2224/16237* (2013.01); *H01L 2224/16238* (2013.01); *H01L 2224/73253* (2013.01); *H01L 2224/76155* (2013.01); *H01L 2224/81191* (2013.01); *H01L 2224/81193* (2013.01); *H01L 2224/82005* (2013.01); *H01L 2224/92* (2013.01); *H01L 2224/94* (2013.01); *H01L 2224/96* (2013.01); *H01L 2224/97* (2013.01); *H01L 2225/06513* (2013.01); *H01L 2225/06541* (2013.01); *H01L 2225/06544* (2013.01); *H01L 2225/06548* (2013.01); *H01L 2225/1035* (2013.01); *H01L 2225/1058* (2013.01); *H01L 2924/0002* (2013.01); *H01L 2924/00014* (2013.01); *H01L 2924/014* (2013.01); *H01L 2924/01004* (2013.01); *H01L 2924/01006* (2013.01); *H01L 2924/01013* (2013.01); *H01L 2924/01023* (2013.01); *H01L 2924/01024* (2013.01); *H01L 2924/01029* (2013.01); *H01L 2924/01033* (2013.01); *H01L 2924/01046* (2013.01); *H01L 2924/01047* (2013.01); *H01L 2924/01049* (2013.01); *H01L 2924/01072* (2013.01); *H01L 2924/01073* (2013.01); *H01L 2924/01074* (2013.01); *H01L 2924/01078* (2013.01); *H01L 2924/01079* (2013.01); *H01L 2924/01082* (2013.01); *H01L 2924/01322* (2013.01); *H01L 2924/09701* (2013.01); *H01L 2924/12041* (2013.01); *H01L 2924/12042* (2013.01); *H01L 2924/1306* (2013.01); *H01L 2924/13091* (2013.01); *H01L 2924/14* (2013.01); *H01L 2924/1433* (2013.01); *H01L 2924/1532* (2013.01); *H01L 2924/15311* (2013.01); *H01L 2924/15331* (2013.01); *H01L 2924/181* (2013.01); *H01L 2924/1815* (2013.01); *H01L 2924/18161* (2013.01); *H01L 2924/19041* (2013.01); *H01L 2924/19042* (2013.01); *H01L 2924/19043* (2013.01); *H01L 2924/3025* (2013.01); *H01L 2924/30105* (2013.01); *H01L 2924/3511* (2013.01)

(56) References Cited

U.S. PATENT DOCUMENTS

| | | | |
|---|---|---|---|
| 5,841,193 A * | 11/1998 | Eichelberger | H01L 23/5389 257/723 |
| 5,987,744 A | 11/1999 | Lan et al. | |
| 6,002,169 A | 12/1999 | Chia et al. | |
| 6,423,570 B1 | 7/2002 | Ma et al. | |
| 6,750,547 B2 * | 6/2004 | Jeung | H01L 23/3114 257/778 |
| 6,753,602 B2 | 6/2004 | Wu | |
| 6,958,546 B2 * | 10/2005 | Fan | H01L 24/11 257/773 |
| 6,998,344 B2 | 2/2006 | Akram et al. | |
| 7,545,047 B2 | 6/2009 | Bauer et al. | |
| 7,548,430 B1 | 6/2009 | Huemoeller et al. | |
| 7,619,901 B2 | 11/2009 | Eichelberger et al. | |
| 7,737,565 B2 | 6/2010 | Coffy | |
| 7,777,351 B1 | 8/2010 | Berry et al. | |
| 7,816,183 B2 | 10/2010 | Kawata | |
| 7,834,462 B2 | 11/2010 | Dobritz et al. | |
| 7,851,259 B2 | 12/2010 | Kim | |
| 8,101,460 B2 | 1/2012 | Pagaila et al. | |
| 2003/0042581 A1 | 3/2003 | Fee et al. | |
| 2004/0145044 A1 | 7/2004 | Sugaya et al. | |
| 2005/0236709 A1 | 10/2005 | Eng et al. | |
| 2006/0278972 A1 | 12/2006 | Bauer et al. | |
| 2007/0249102 A1 | 10/2007 | Brunnbauer et al. | |
| 2008/0111233 A1 | 5/2008 | Pendse | |
| 2008/0157328 A1 | 7/2008 | Kawata | |
| 2008/0169546 A1 | 7/2008 | Kwon et al. | |
| 2008/0258289 A1 | 10/2008 | Pendse et al. | |
| 2008/0284045 A1 | 11/2008 | Gerber et al. | |
| 2008/0308928 A1 | 12/2008 | Chang et al. | |
| 2008/0315385 A1 | 12/2008 | Gerber et al. | |
| 2009/0075428 A1 | 3/2009 | Tang et al. | |
| 2009/0212420 A1 | 8/2009 | Hedler et al. | |
| 2009/0236686 A1 | 9/2009 | Shim et al. | |
| 2009/0309212 A1 | 12/2009 | Shim et al. | |
| 2010/0120813 A1 | 5/2010 | Bazhina et al. | |
| 2010/0171205 A1 | 7/2010 | Chen et al. | |
| 2010/0171207 A1 | 7/2010 | Shen et al. | |
| 2010/0224974 A1 | 9/2010 | Shim et al. | |
| 2010/0317153 A1 | 12/2010 | Do et al. | |
| 2011/0031634 A1 | 2/2011 | Pagaila | |
| 2011/0117700 A1 | 5/2011 | Weng et al. | |
| 2011/0204509 A1 | 8/2011 | Lin et al. | |
| 2011/0227220 A1 | 9/2011 | Chen et al. | |
| 2013/0249106 A1 | 9/2013 | Lin et al. | |
| 2014/0103509 A1 | 8/2014 | Yoon et al. | |

(56) References Cited

U.S. PATENT DOCUMENTS

FOREIGN PATENT DOCUMENTS

| | | |
|---|---|---|
| CN | 102194711 A | 9/2011 |
| KR | 20100009941 A | 1/2010 |
| TW | 201104770 A | 2/2011 |

\* cited by examiner

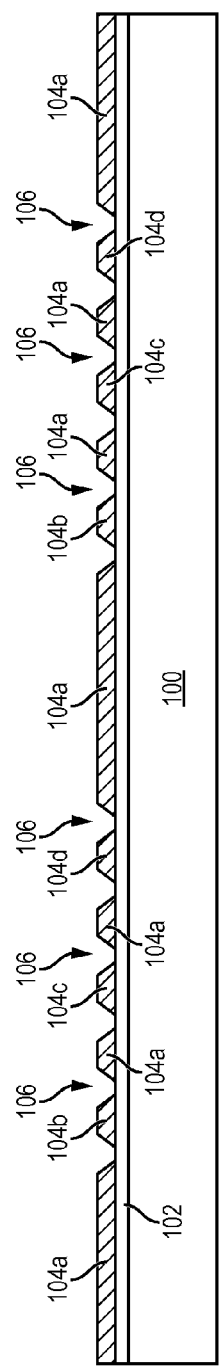
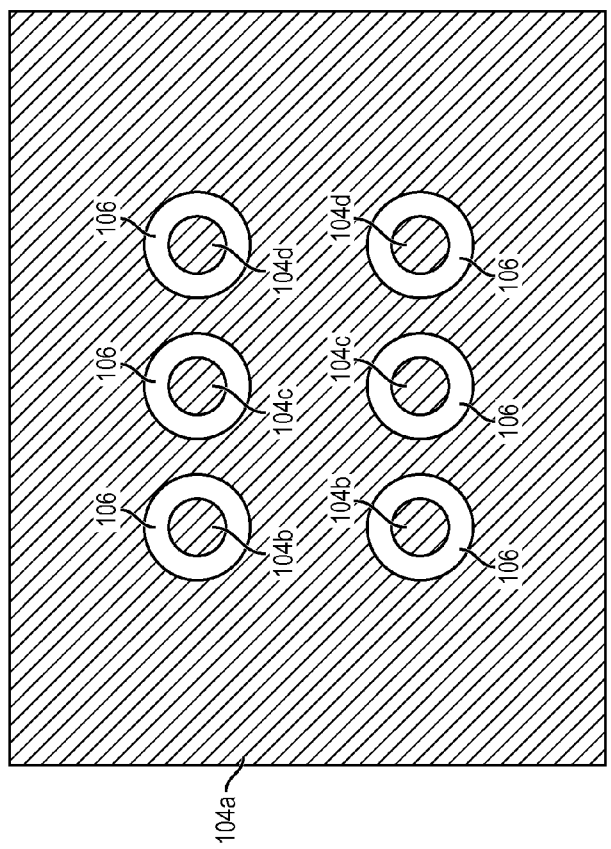
FIG. 4a
FIG. 4b

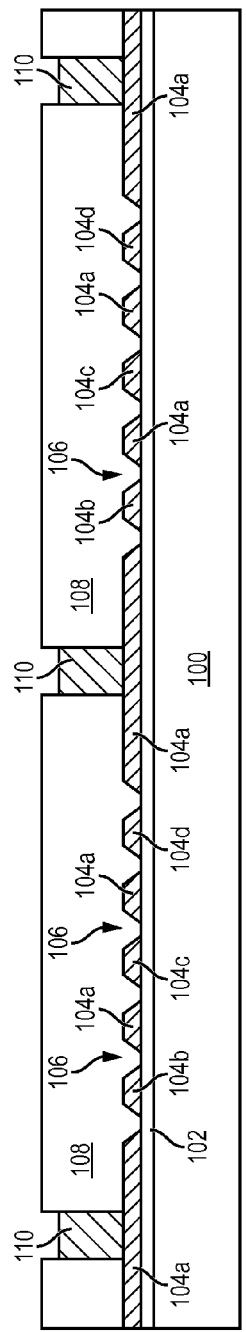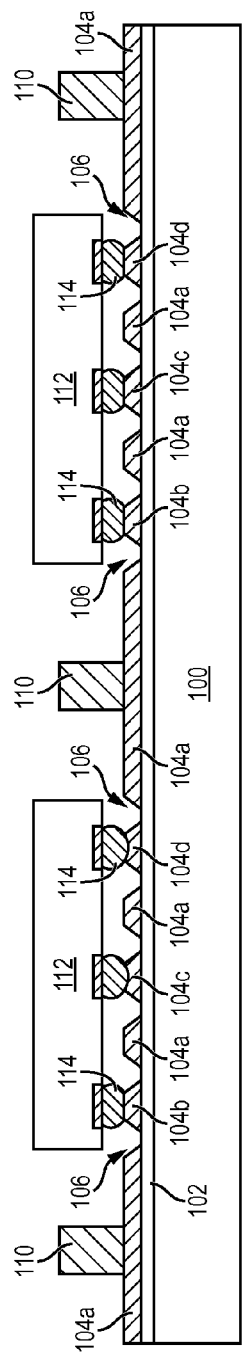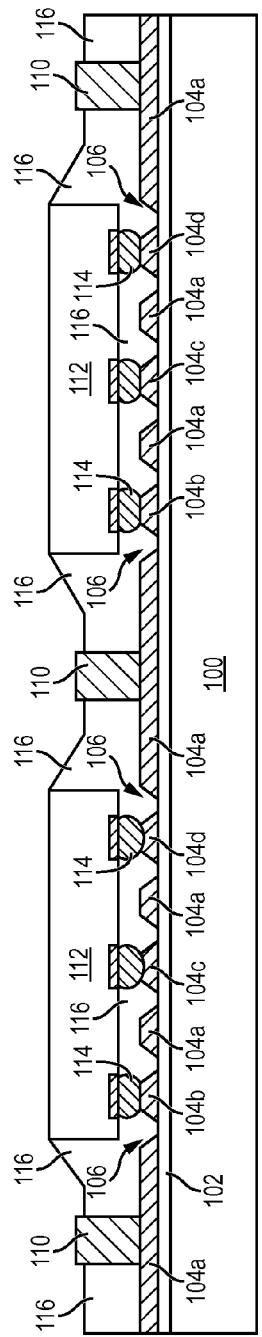

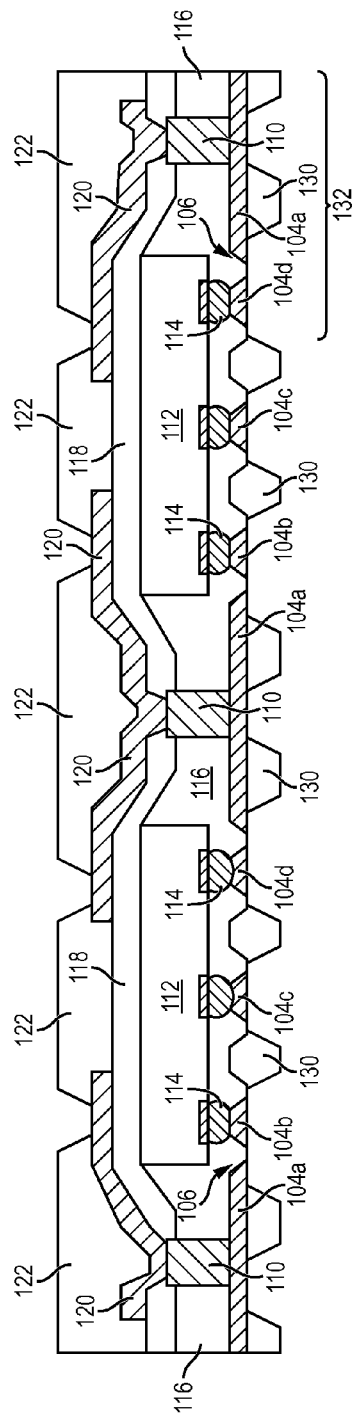
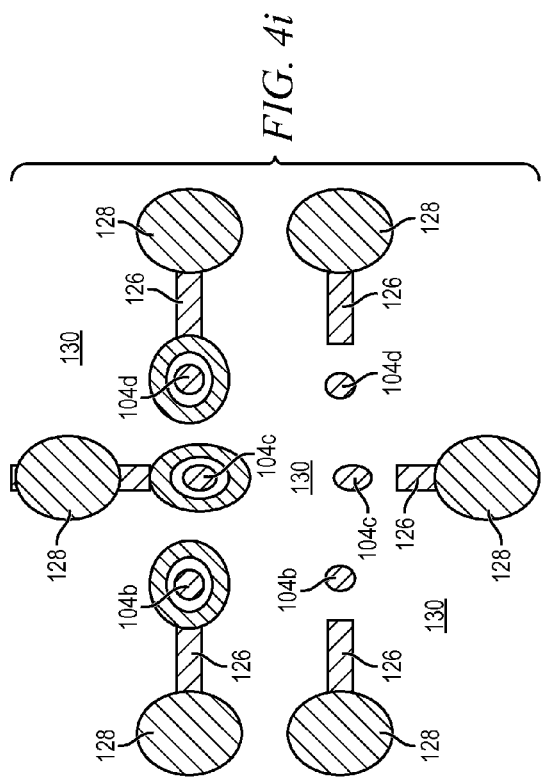
FIG. 4h
FIG. 4i

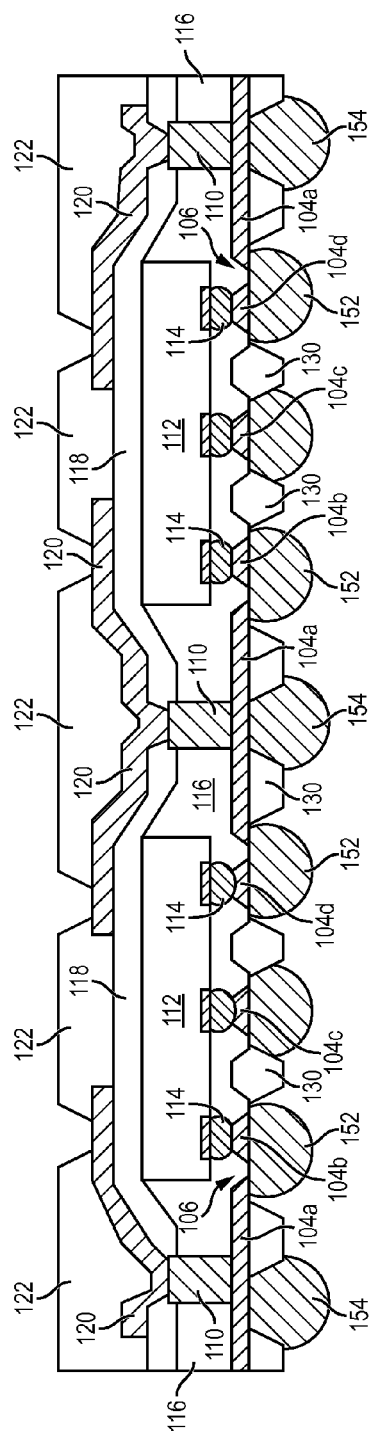
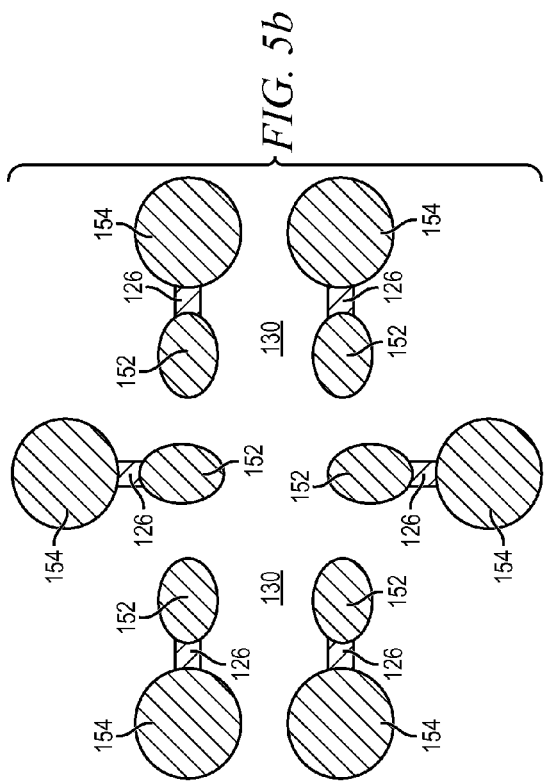
FIG. 5a
FIG. 5b

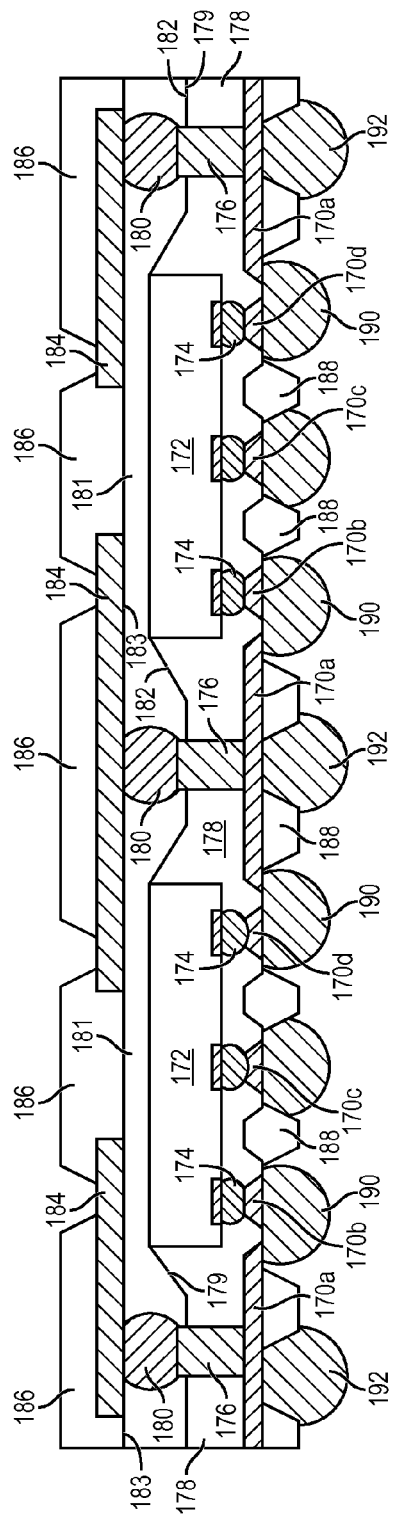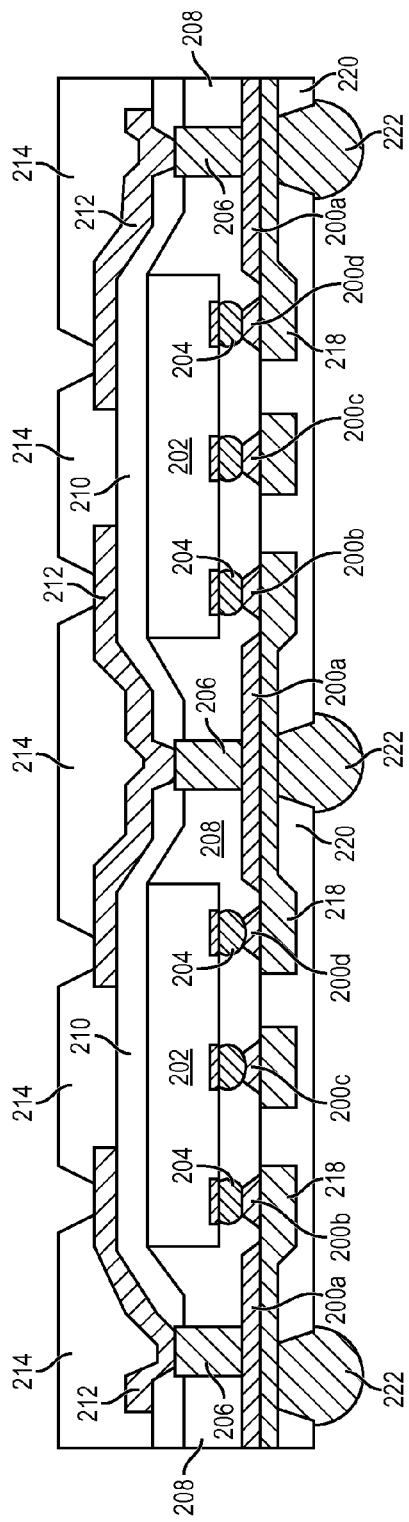
FIG. 8
FIG. 9a

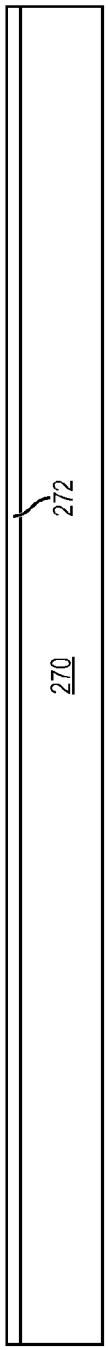
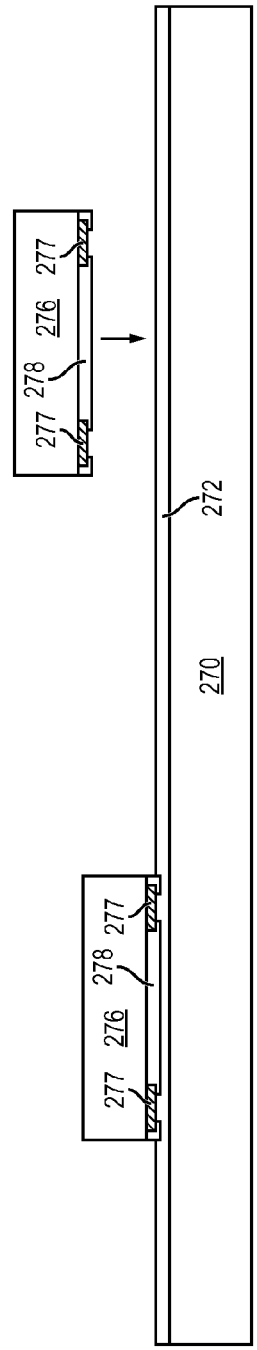
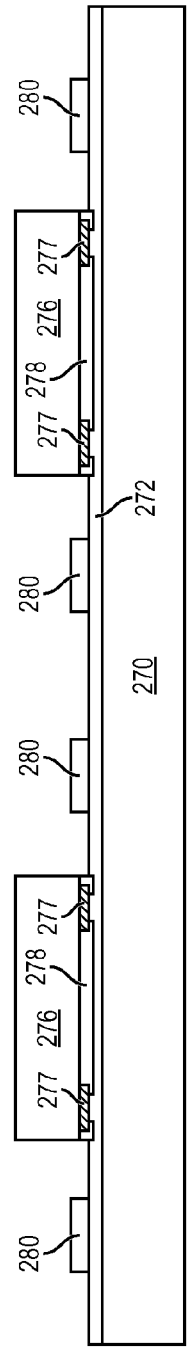
FIG. 13a
FIG. 13b
FIG. 13c

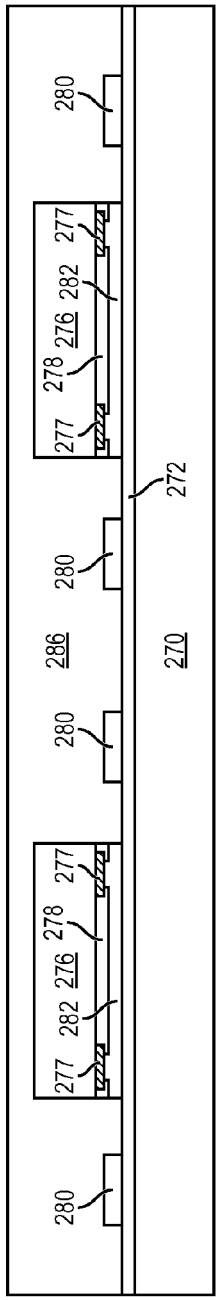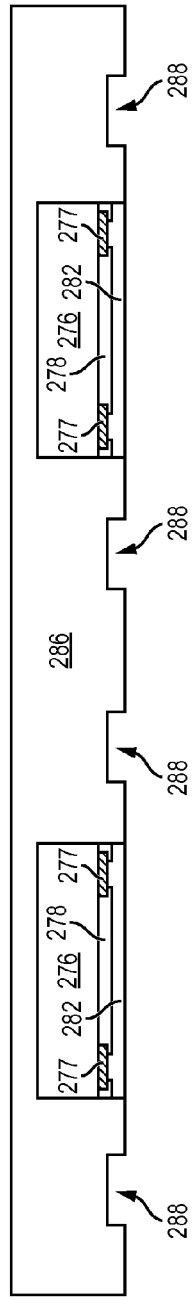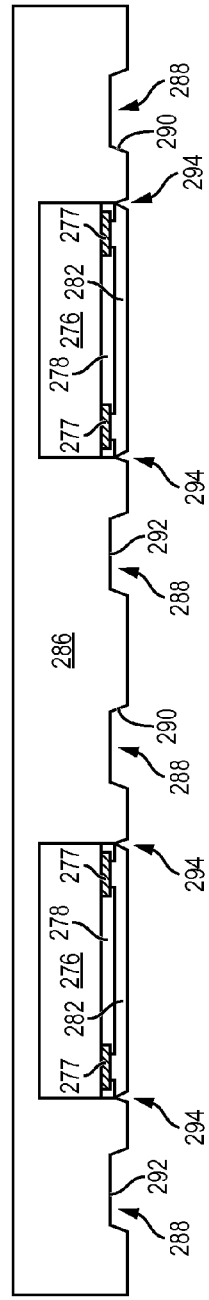

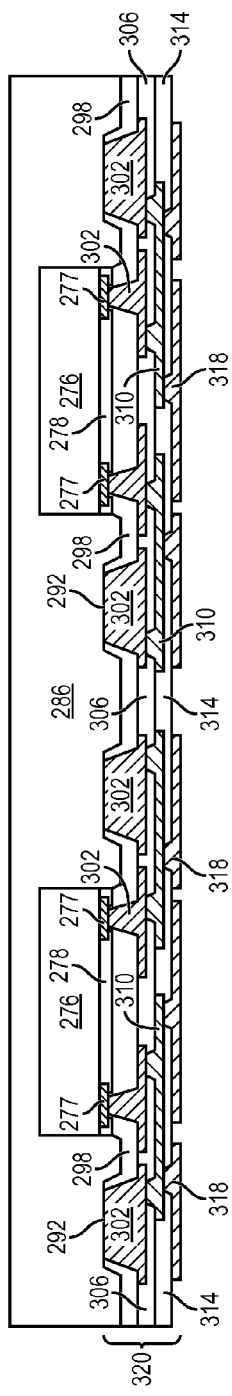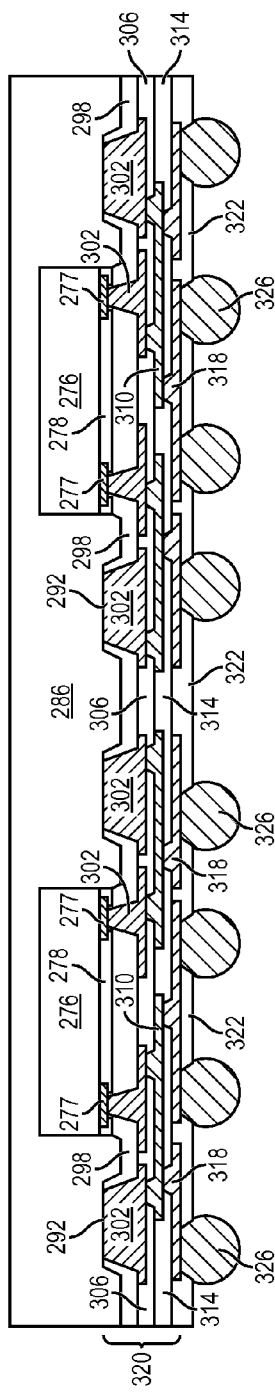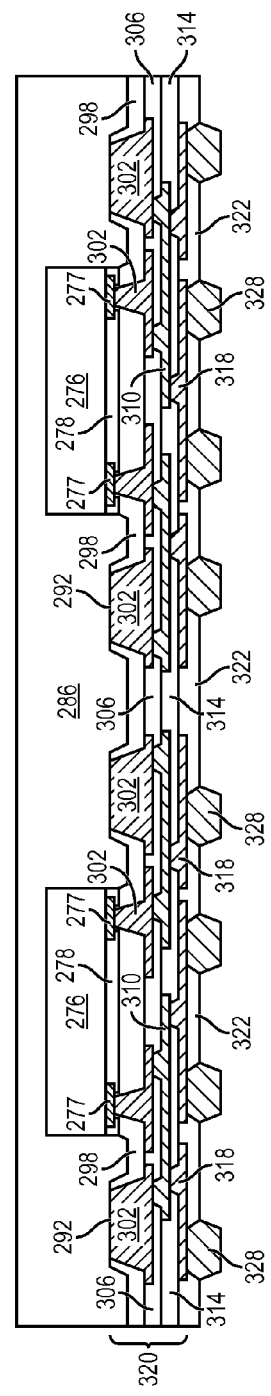

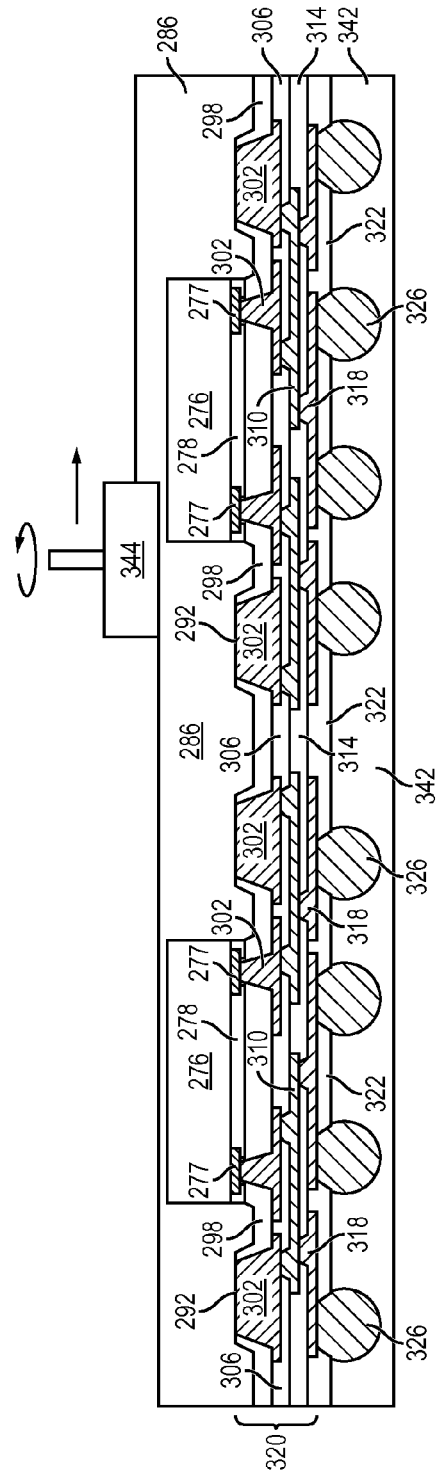
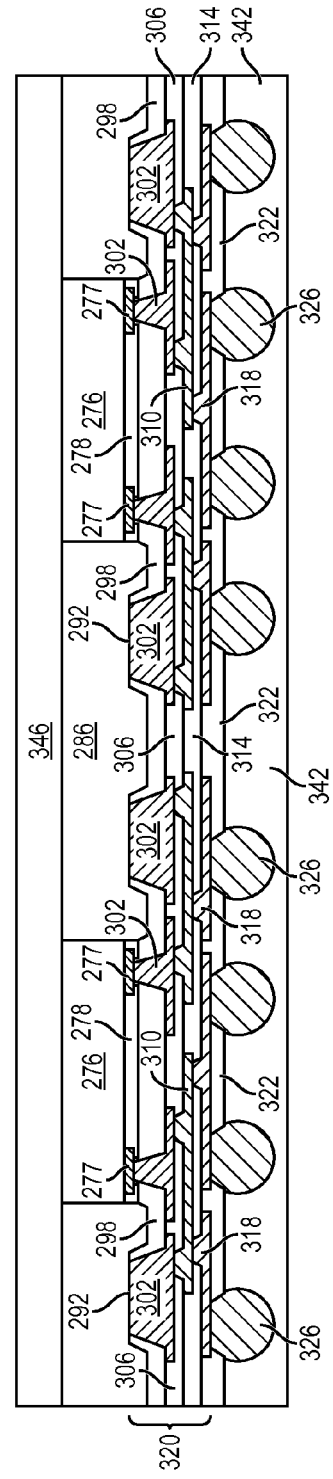
FIG. 13r
FIG. 13s

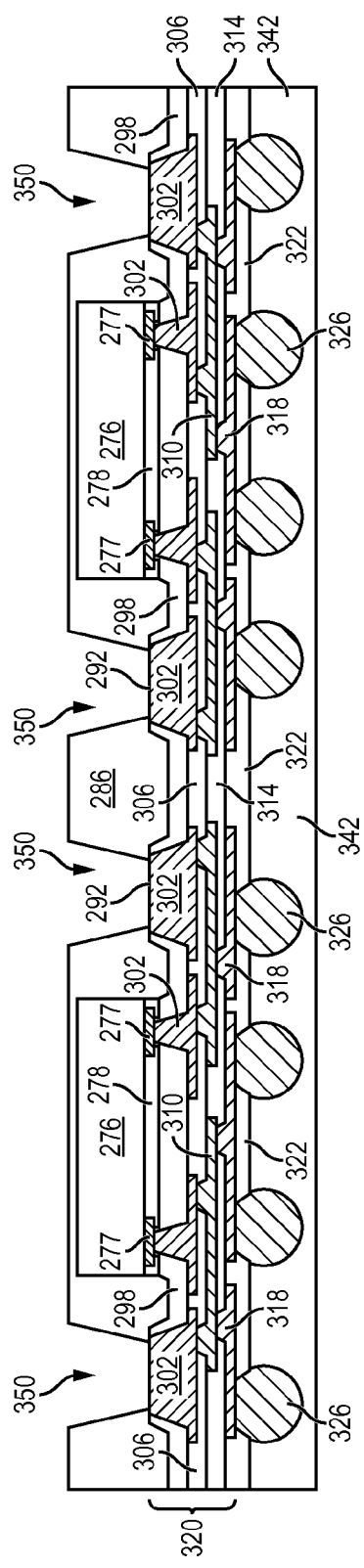
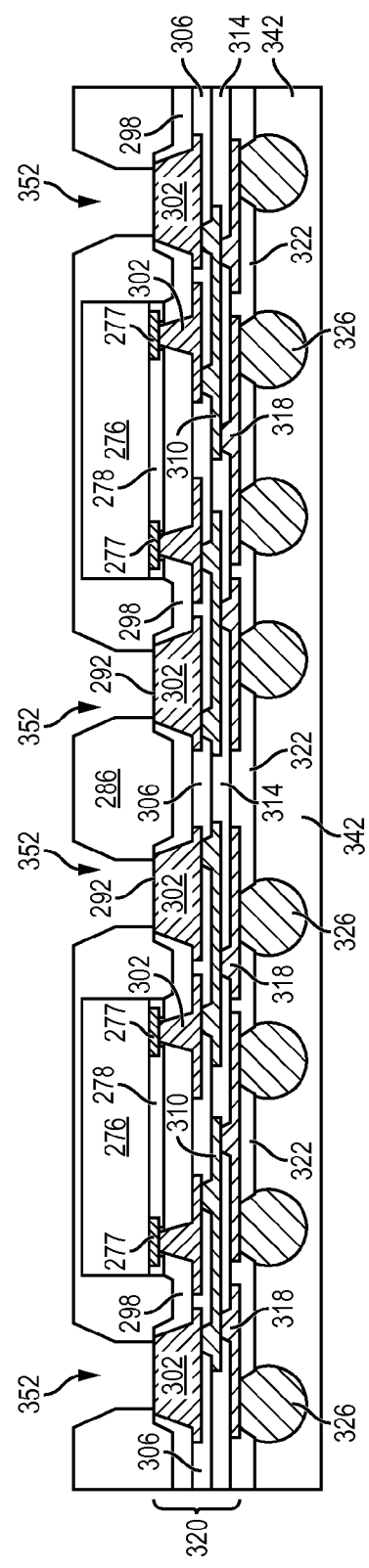
FIG. 13t
FIG. 13u

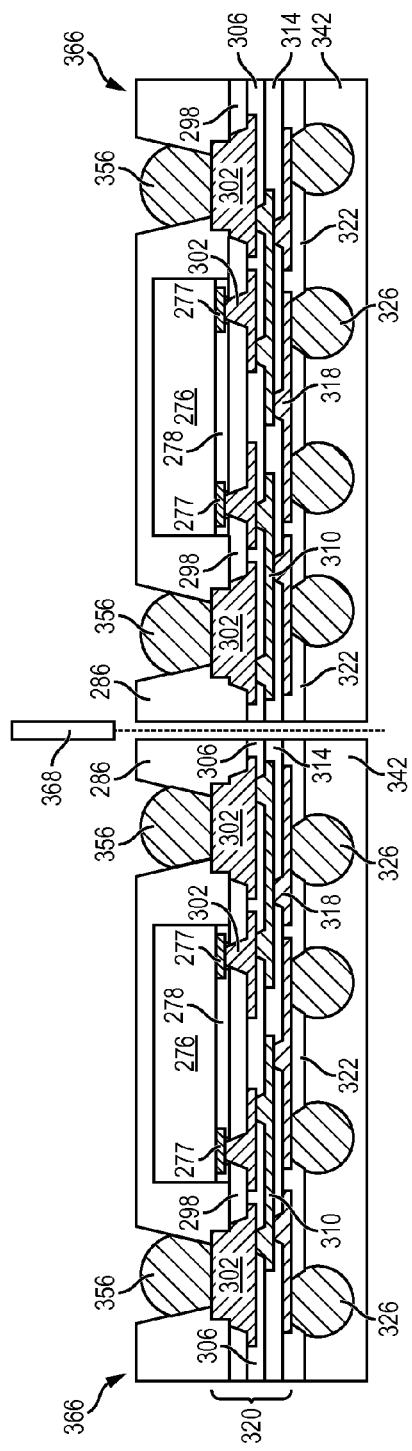
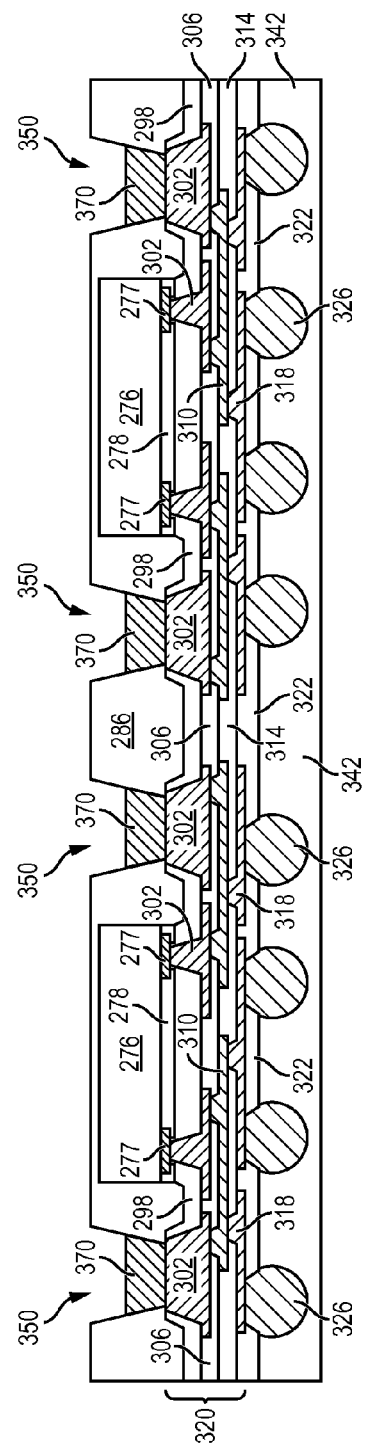
FIG. 13x
FIG. 14a

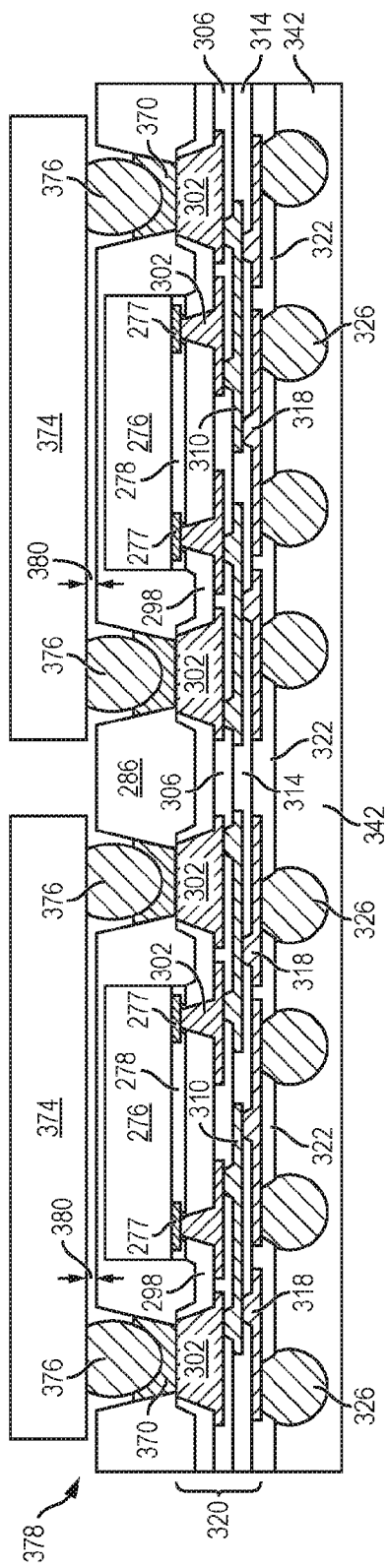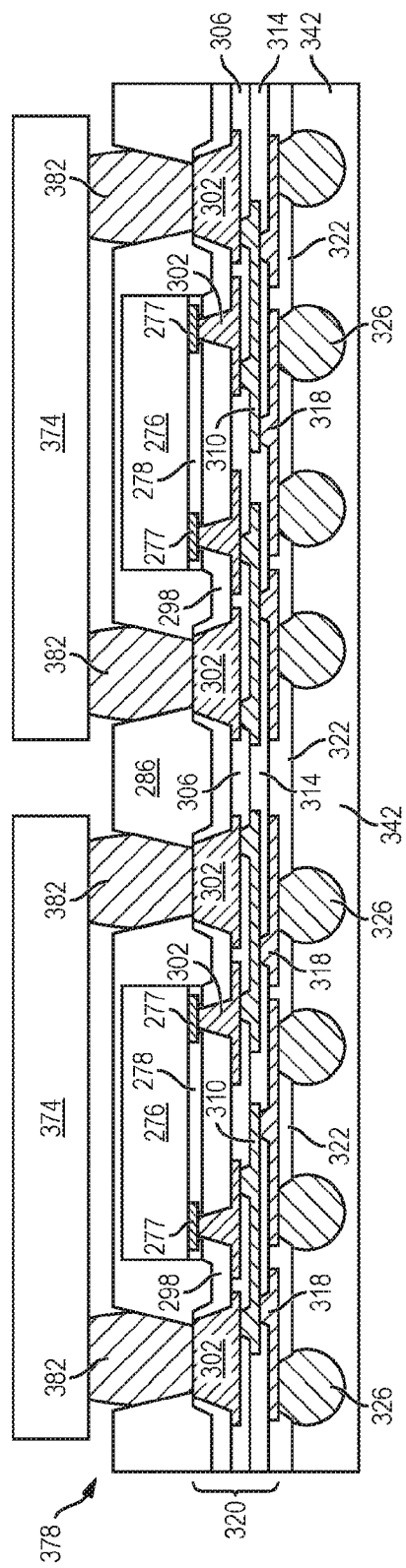

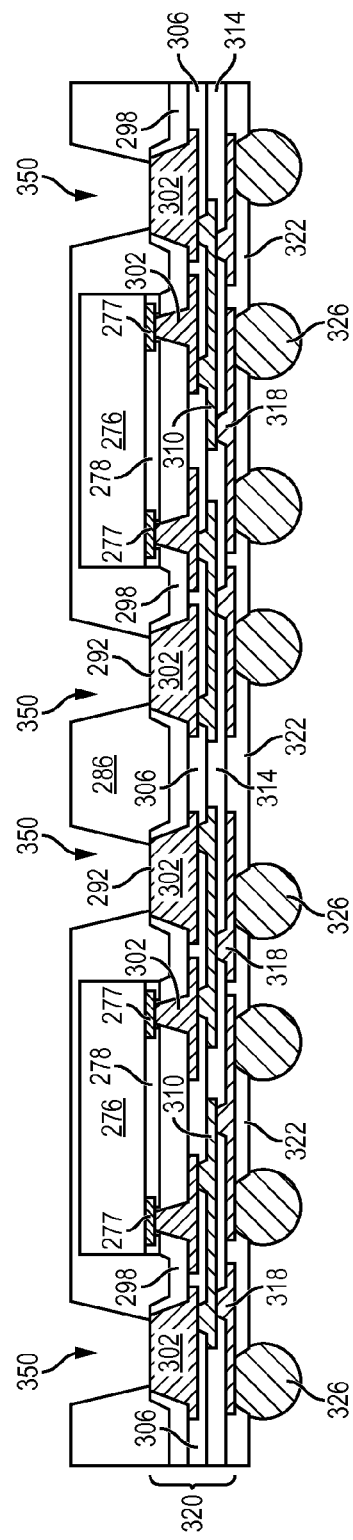
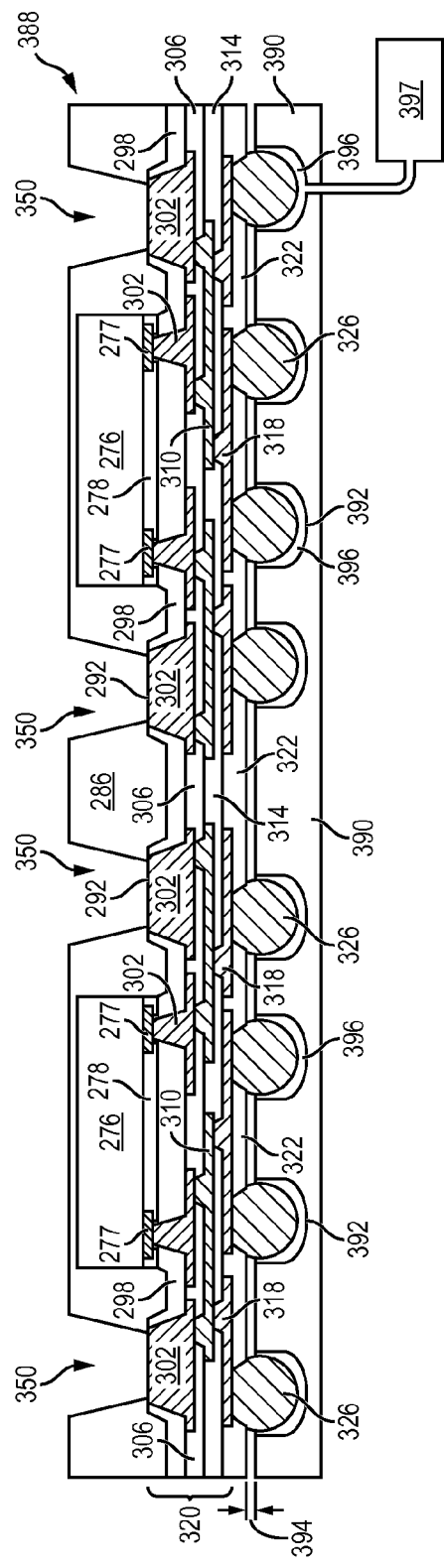
FIG. 15a
FIG. 15b

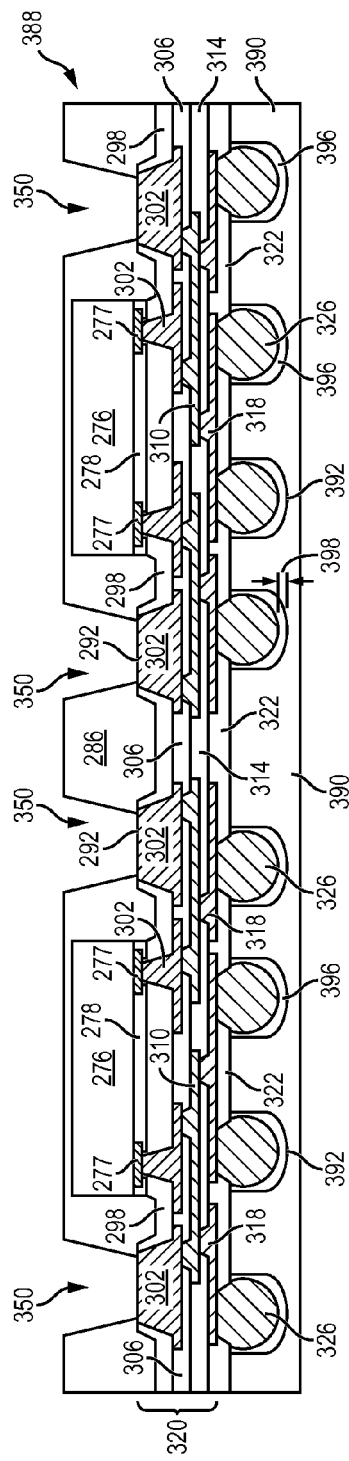
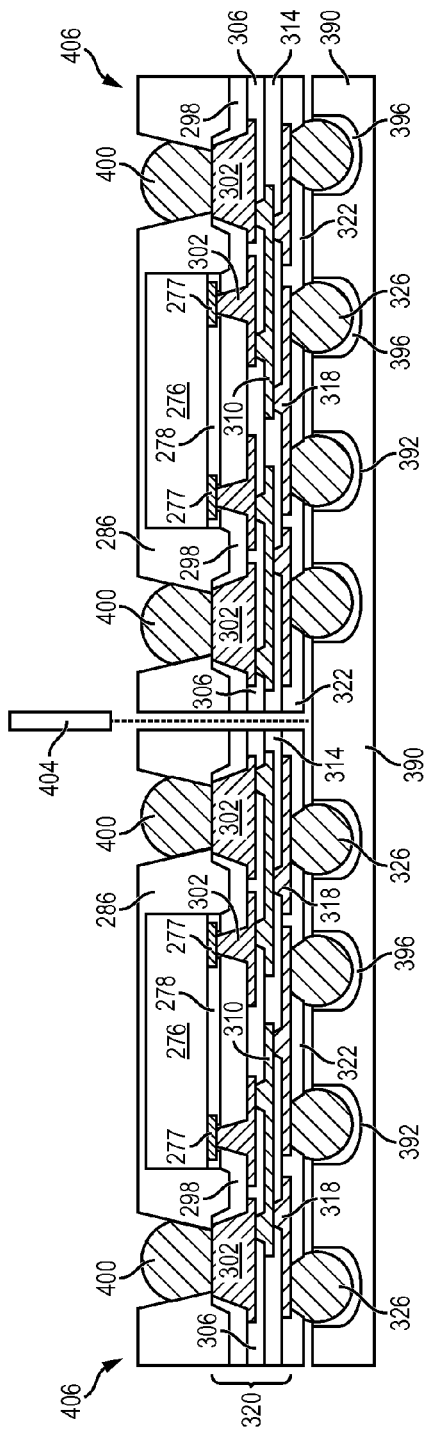
FIG. 15c
FIG. 15d

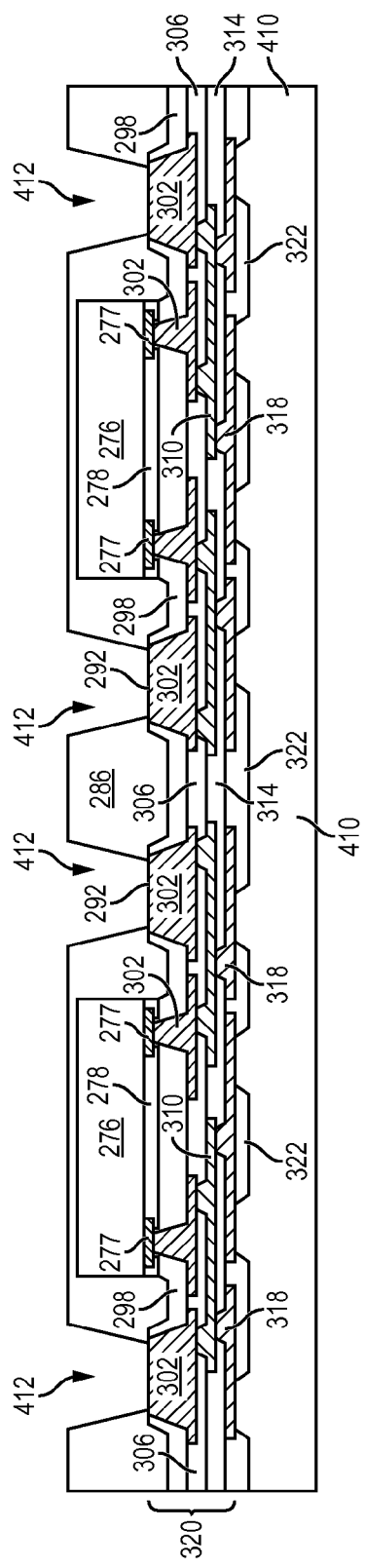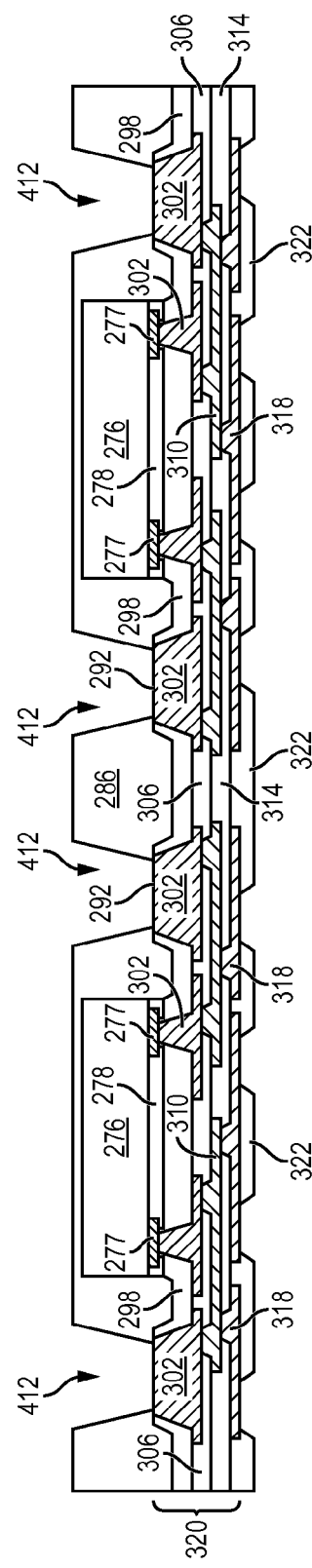
FIG. 16a
FIG. 16b

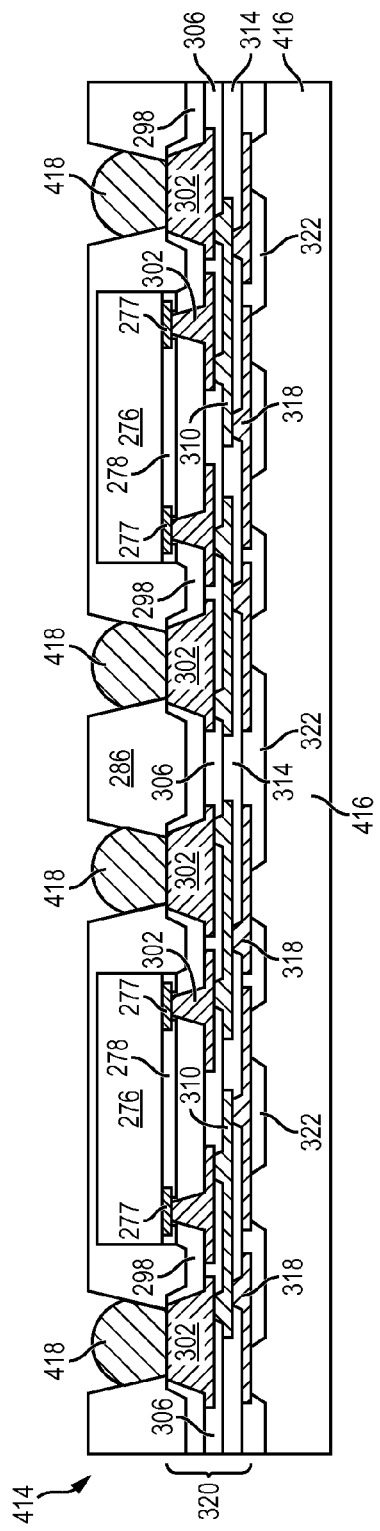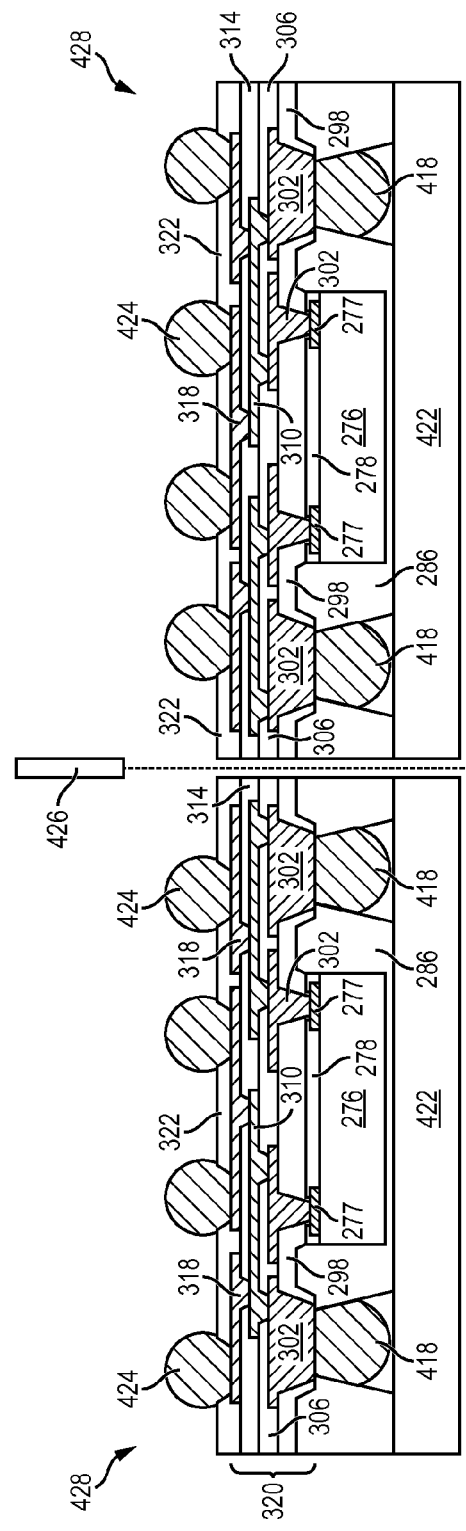
FIG. 16c
FIG. 16d

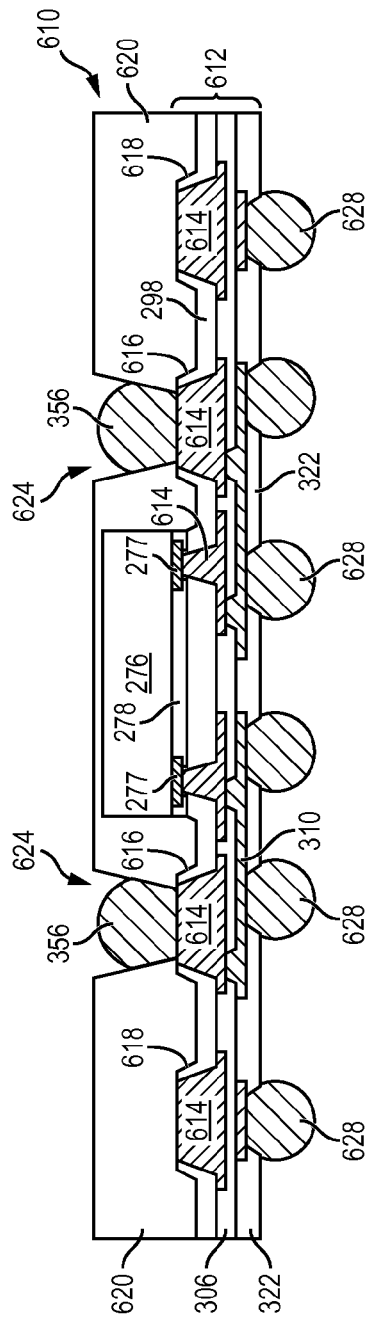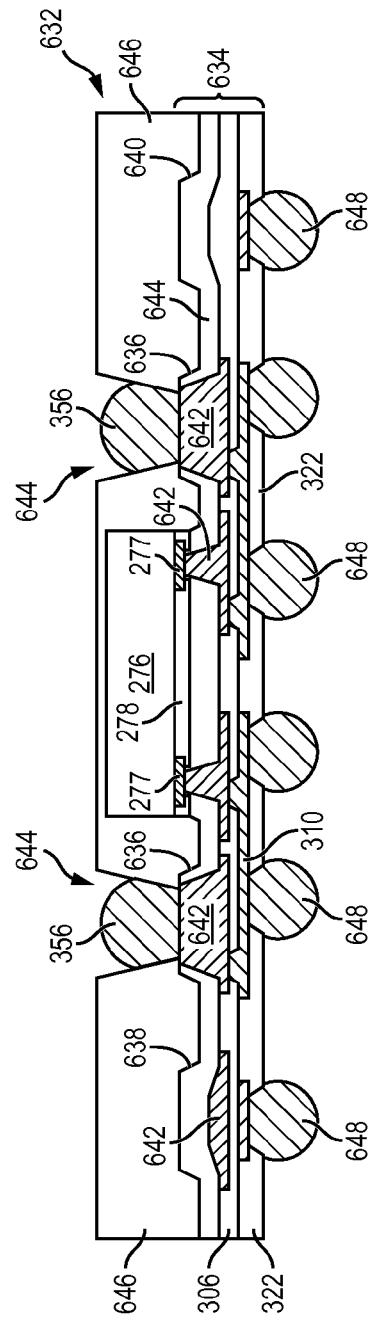
FIG. 24a
FIG. 24b

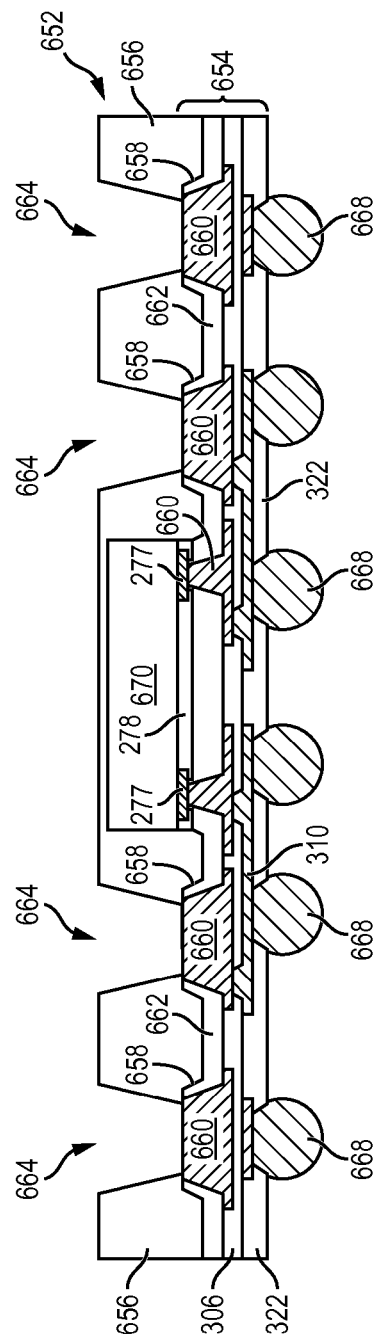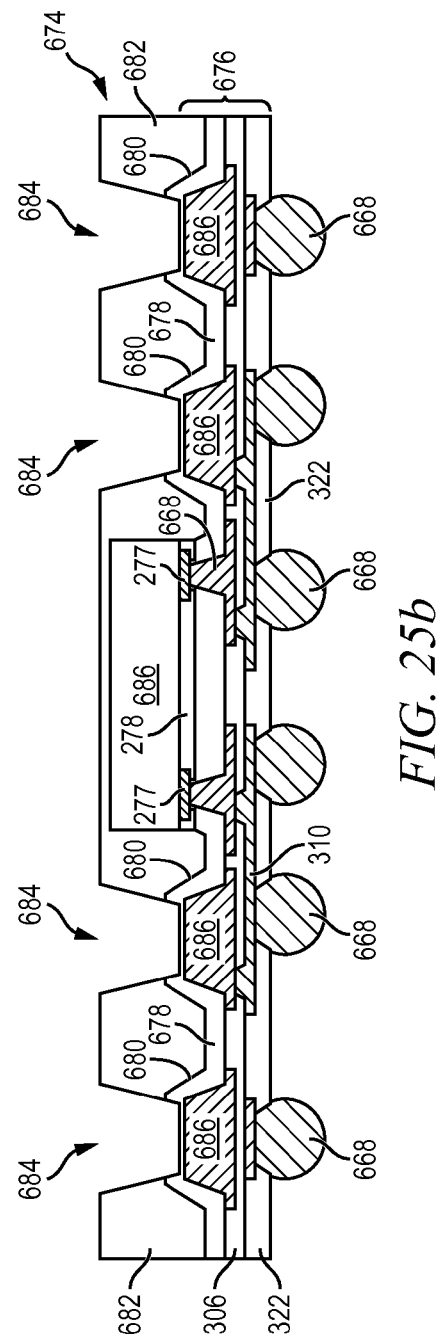

SEMICONDUCTOR DEVICE AND METHOD OF FORMING A VERTICAL INTERCONNECT STRUCTURE FOR 3-D FO-WLCSP

CLAIM TO DOMESTIC PRIORITY

The present application is a division of U.S. patent application Ser. No. 13/191,318, now U.S. Pat. No. 9,082,806, filed Jul. 26, 2011, which is a continuation-in-part of U.S. patent application Ser. No. 12/572,590, now U.S. Pat. No. 8,796,846, filed Oct. 2, 2009, which is a division of U.S. patent application Ser. No. 12/333,977, now U.S. Pat. No. 7,642,128, filed Dec. 12, 2008, and U.S. patent application Ser. No. 13/191,318 further claims the benefit of Provisional Application No. 61/441,561, filed Feb. 10, 2011 and Provisional Application No. 61/444,914, filed Feb. 21, 2011. All of the above-mentioned applications are incorporated herein by reference.

FIELD OF THE INVENTION

The present invention relates in general to semiconductor devices and, more particularly, to a semiconductor device having a vertical interconnect structure for three-dimensional (3-D) fan-out wafer level chip scale packages (FO-WLCSPs).

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Another goal of semiconductor manufacturing is to produce semiconductor devices with adequate heat dissipation. High frequency semiconductor devices generally generate more heat. Without effective heat dissipation, the generated heat can reduce performance, decrease reliability, and reduce the useful lifetime of the semiconductor device.

The electrical interconnection between a FO-WLCSP containing semiconductor devices on multiple levels (3-D device integration) and external devices can be accomplished with conductive through silicon vias (TSV) or through hole vias (THV). In most TSVs and THVs, the sidewalls and bottom-side of the via are conformally plated with conductive materials to enhance adhesion. The TSVs and THVs are then filled with another conductive material, for example, by copper deposition through an electroplating process. The TSV and THV formation typically involves considerable time for the via filling, which reduces the unit-per-hour (UPH) production schedule. The equipment need for electroplating, e.g., plating bath, and sidewall passivation increases manufacturing cost. In addition, voids may be formed within the vias, which causes defects and reduces reliability of the device. TSV and THV can be a slow and costly approach to make vertical electrical interconnections in semiconductor packages. These interconnect schemes also have problems with semiconductor die placement accuracy, warpage control before and after removal of the carrier, and process cost management.

The electrical interconnection between 3-D FO-WLCSPs and external devices, in addition to including TSVs and THVs, further includes redistribution layers (RDLs). RDLs serve as intermediate layers for electrical interconnect within a package including electrical interconnect with package I/O pads which provide electrical connection from semiconductor die within 3-D FO-WLCSP to points external to 3-D FO-WLCSPs. RDLs can be formed over both a front side and a backside of a semiconductor die within a 3-D FO-WLCSP. However, the formation of multiple RDLs including over a front side and backside of a semiconductor die can be a slow and costly approach for making electrical interconnection for 3-D FO-WLCSPs and can result in higher fabrication costs.

SUMMARY OF THE INVENTION

A need exists to provide an interconnect structure for 3-D semiconductor devices. Accordingly, in one embodiment, the present invention is a method of making a semiconductor device including the steps of providing a first semiconductor die, forming an insulating layer around the first semiconductor die, forming a conductive layer over the insulating layer and first semiconductor die, forming a first opening in the insulating layer extending to the conductive layer, and forming a first interconnect structure in the first opening over the conductive layer.

In another embodiment, the present invention is a method of making a semiconductor device including the steps of providing a first semiconductor die, forming an insulating layer around the first semiconductor die, forming a conductive layer over the insulating layer, and forming a first interconnect structure in the insulating layer over the conductive layer.

In another embodiment, the present invention is a method of making a semiconductor device including the steps of providing a first semiconductor die, forming an insulating layer around the first semiconductor die, forming a conductive layer over the insulating layer, and forming a first opening in the insulating layer extending to the conductive layer.

In another embodiment, the present invention is a method of making a semiconductor device comprising the steps of providing a first semiconductor die, forming an insulating layer around the first semiconductor die, forming a first opening in the insulating layer, and forming a first interconnect structure in the first opening in the insulating layer.

BRIEF DESCRIPTION OF THE DRAWINGS

FIGS. 4a-4k illustrate a process of forming a vertical interconnect structure for FO-WLCSP;

FIGS. 5a-5b illustrate the FO-WLCSP with vertical interconnect structure having conductive pillars;

FIG. 8 illustrates an alternate embodiment of the FO-WLCSP with vertical interconnect structure having conductive pillars and bumps;

FIGS. 9a-9c illustrate the FO-WLCSP with vertical interconnect structure having RDL under the conductive pillars;

FIGS. 14a-14d illustrate a process of mounting a bumped semiconductor device over a 3-D FO-WLCSP with vertical interconnect structure;

FIGS. 15a-15d illustrate another process of forming a vertical interconnect structure for a 3-D FO-WLCSP;

FIGS. 16a-16d illustrate another process of forming a vertical interconnect structure for a 3-D FO-WLCSP;

FIGS. 24a-24b illustrate a 3-D FO-WLCSP including a horizontally expanded interconnect structure; and FIGS. 25a-25b illustrate another embodiment of a 3-D FO-WLCSP including a horizontally expanded interconnect structure.

DETAILED DESCRIPTION OF THE DRAWINGS

Figure 1:
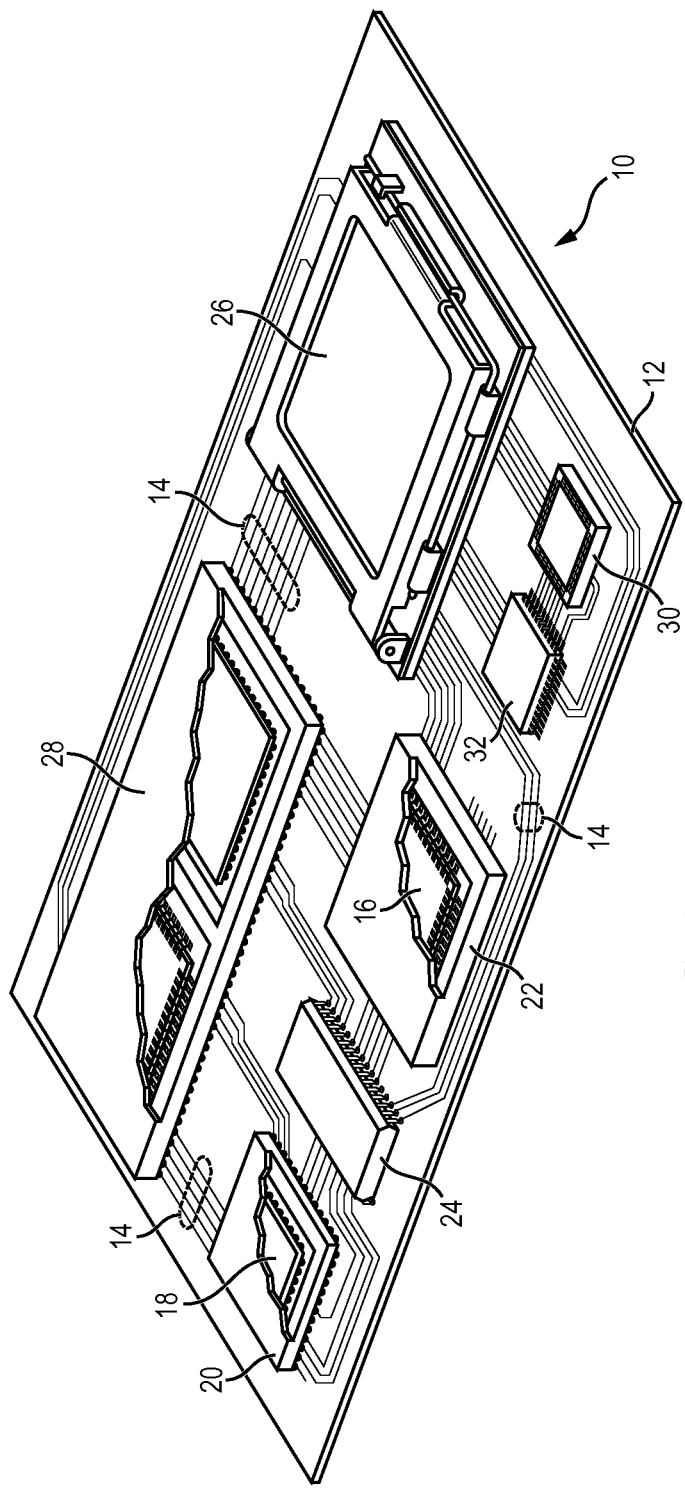
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or bond wire. An encapsulant or other molding material is deposited over the package to provide physical support and electrical isolation. The finished package is then inserted into an electrical system and the functionality of the semiconductor device is made available to the other system components.

FIG. 1 illustrates electronic device 10 having a chip carrier substrate or PCB 12 with a plurality of semiconductor packages mounted on its surface. Electronic device 10 can have one type of semiconductor package, or multiple types of semiconductor packages, depending on the application. The different types of semiconductor packages are shown in FIG. 1 for purposes of illustration.

Electronic device 10 can be a stand-alone system that uses the semiconductor packages to perform one or more electrical functions. Alternatively, electronic device 10 can be a subcomponent of a larger system. For example, electronic device 10 can be part of a cellular phone, personal digital assistant (PDA), digital video camera (DVC), or other electronic communication device. Alternatively, electronic device 10 can be a graphics card, network interface card, or other signal processing card that can be inserted into a computer. The semiconductor package can include microprocessors, memories, application specific integrated circuits (ASICs), logic circuits, analog circuits, radio frequency (RF) circuits, discrete devices, or other semiconductor die or electrical components. Miniaturization and weight reduction are essential for these products to be accepted by the market. The distance between semiconductor devices must be decreased to achieve higher density.

In FIG. 1, PCB 12 provides a general substrate for structural support and electrical interconnect of the semiconductor packages mounted on the PCB. Conductive signal traces 14 are formed on a surface or within layers of PCB 12 using evaporation, electrolytic plating, electroless plating, screen printing, or other suitable metal deposition process. Signal traces 14 provide for electrical communication between each of the semiconductor packages, mounted components, and other external system components. Traces 14 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the semiconductor die is mechanically and electrically mounted directly to the PCB.

For the purpose of illustration, several types of first level packaging, including bond wire package 16 and flip chip 18, are shown on PCB 12. Additionally, several types of second level packaging, including ball grid array (BGA) 20, bump chip carrier (BCC) 22, dual in-line package (DIP) 24, land grid array (LGA) 26, multi-chip module (MCM) 28, quad flat non-leaded package (QFN) 30, and quad flat package 32, are shown mounted on PCB 12. Depending upon the system requirements, any combination of semiconductor packages, configured with any combination of first and second level packaging styles, as well as other electronic components, can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in lower costs for consumers.

Figure 2A:
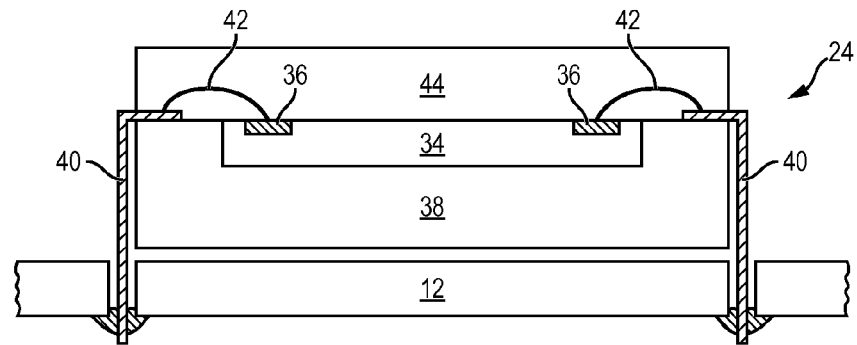
FIGS. 2a-2c illustrate further detail of the representative semiconductor packages mounted to the PCB.
Figure 2B:
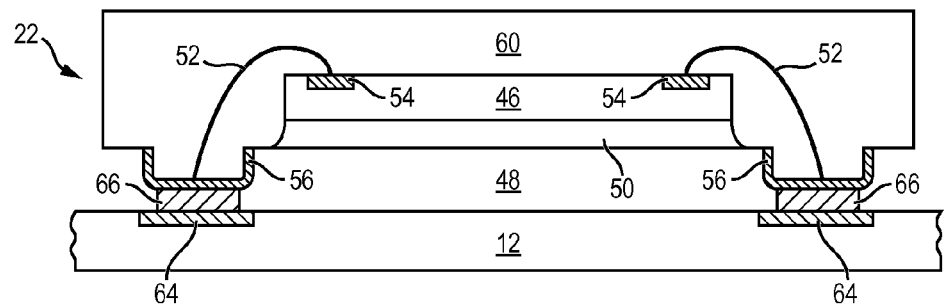
Figure 2C:
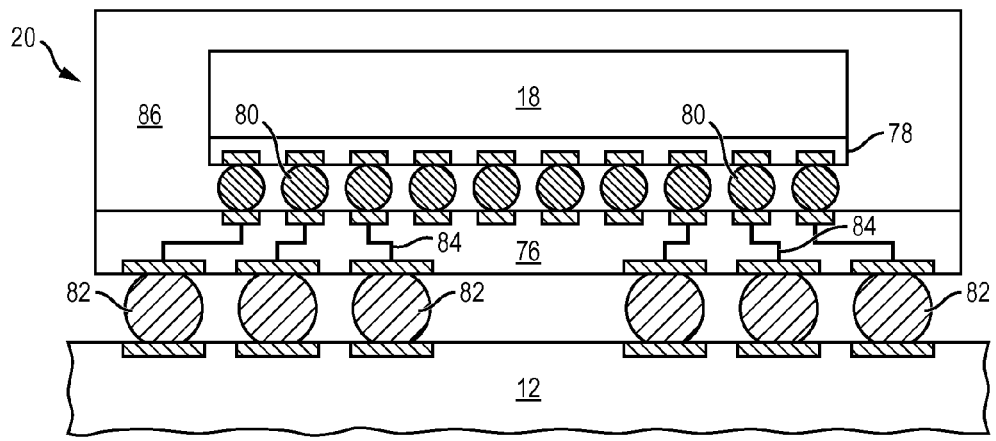

FIGS. 2a-2c show exemplary semiconductor packages. FIG. 2a illustrates further detail of DIP 24 mounted on PCB 12. Semiconductor die 34 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 34. Contact pads 36 are one or more layers of conductive material, such as aluminum (Al), copper (Cu), tin (Sn), nickel (Ni), gold (Au), or silver (Ag), and are electrically connected to the circuit elements formed within semiconductor die 34. During assembly of DIP 24, semiconductor die 34 is mounted to an intermediate carrier 38 using a gold-silicon eutectic layer or adhesive material such as thermal epoxy or epoxy resin. The package body includes an insulative packaging material such as polymer or ceramic. Conductor leads 40 and bond wires 42 provide electrical interconnect between semiconductor die 34 and PCB 12. Encapsulant 44 is deposited over the package for environmental protection by preventing moisture and particles from entering the package and contaminating semiconductor die 34 or bond wires 42.

FIG. 2b illustrates further detail of BCC 22 mounted on PCB 12. Semiconductor die 46 is mounted over carrier 48 using an underfill or epoxy-resin adhesive material 50. Bond wires 52 provide first level packaging interconnect between contact pads 54 and 56. Molding compound or encapsulant 60 is deposited over semiconductor die 46 and bond wires 52 to provide physical support and electrical isolation for the device. Contact pads 64 are formed over a surface of PCB 12 using a suitable metal deposition process such as electrolytic plating or electroless plating to prevent oxidation. Contact pads 64 are electrically connected to one or more conductive signal traces 14 in PCB 12. Bumps 66 are formed between contact pads 56 of BCC 22 and contact pads 64 of PCB 12.

In FIG. 2c, semiconductor die 18 is mounted face down to intermediate carrier 76 with a flipchip style first level packaging. Active region 78 of semiconductor die 18 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 78. Semiconductor die 18 is electrically and mechanically connected to carrier 76 through bumps 80.

BGA 20 is electrically and mechanically connected to PCB 12 with a BGA style second level packaging using bumps 82. Semiconductor die 18 is electrically connected to conductive signal traces 14 in PCB 12 through bumps 80, signal lines 84, and bumps 82. A molding compound or encapsulant 86 is deposited over semiconductor die 18 and carrier 76 to provide physical support and electrical isolation for the device. The flipchip semiconductor device provides a short electrical conduction path from the active devices on semiconductor die 18 to conduction tracks on PCB 12 in order to reduce signal propagation distance, lower capacitance, and improve overall circuit performance. In another embodiment, the semiconductor die 18 can be mechanically and electrically connected directly to PCB 12 using flipchip style first level packaging without intermediate carrier 76.

Figure 3A:
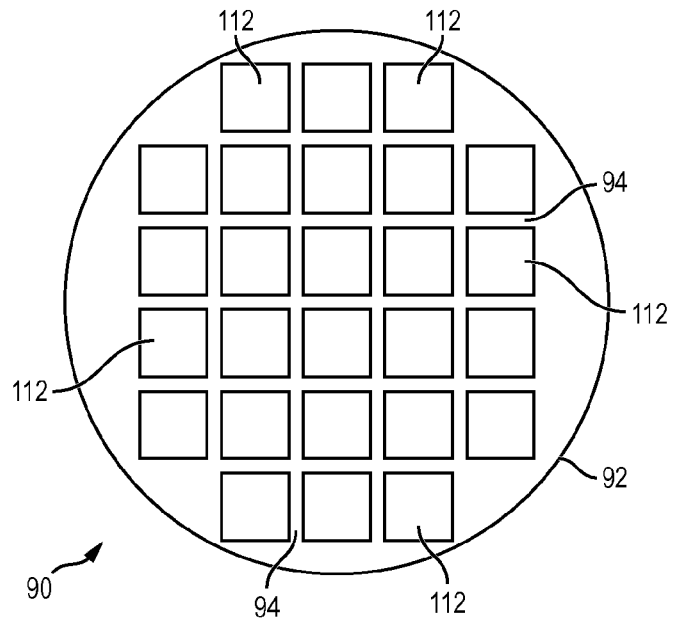
FIGS. 3a-3c illustrate a semiconductor wafer with a plurality of semiconductor die separated by saw streets.

FIG. 3a shows a semiconductor wafer 90 with a base substrate material 92, such as silicon, germanium, gallium arsenide, indium phosphide, or silicon carbide, for structural support. A plurality of semiconductor die or components 112 is formed on wafer 90 separated by a non-active, inter-die wafer area or saw street 94 as described above. Saw street 94 provides cutting areas to singulate semiconductor wafer 90 into individual semiconductor die 112.

Figure 3B:
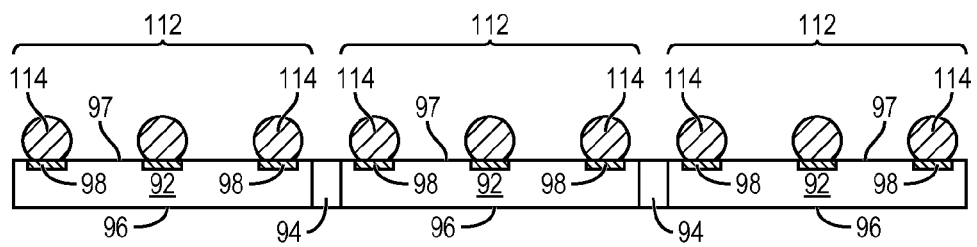

FIG. 3b shows a cross-sectional view of a portion of semiconductor wafer 90. Each semiconductor die 112 has a back surface 96 and active surface 97 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 97 to implement analog circuits or digital circuits, such as digital signal processor (DSP), ASIC, memory, or other signal processing circuit. Semiconductor die 112 may also contain integrated passive devices (IPDs), such as inductors, capacitors, and resistors, for RF signal processing. In one embodiment, semiconductor die 112 is a flipchip type device.

An electrically conductive layer 98 is formed over active surface 97 using PVD, CVD, electrolytic plating, electroless plating process, or other suitable metal deposition process. Conductive layer 98 can be one or more layers of Al, Cu, Sn, Ni, Au, Ag, or other suitable electrically conductive material. Conductive layer 98 operates as contact pads electrically connected to the circuits on active surface 97. Contact pads 98 can be disposed side-by-side a first distance from the edge of semiconductor die 112, as shown in FIG. 3b. Alternatively, contact pads 98 can be offset in multiple rows such that a first row of contact pads is disposed a first distance from the edge of the die, and a second row of contact pads alternating with the first row is disposed a second distance from the edge of the die.

An electrically conductive bump material is deposited over contact pads 98 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to contact pads 98 using a suitable attachment or bonding process. In one embodiment, the bump material is reflowed by heating the material above its melting point to form balls or bumps 114. In some applications, bumps 114 are reflowed a second time to improve electrical contact to contact pads 98. Bumps 114 can also be compression bonded to contact pads 98. Bumps 114 represent one type of interconnect structure that can be formed over contact pads 98. The interconnect structure can also use stud bump, micro bump, or other electrical interconnect.

Figure 3C:
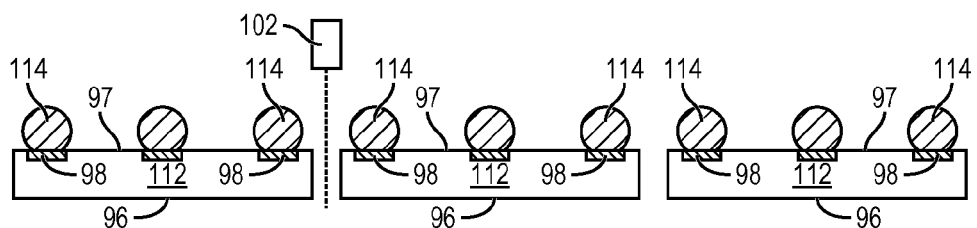

In FIG. 3c, semiconductor wafer 90 is singulated through saw street 94 using a saw blade or laser cutting tool 99 into individual semiconductor die 112.

Figure 4F:
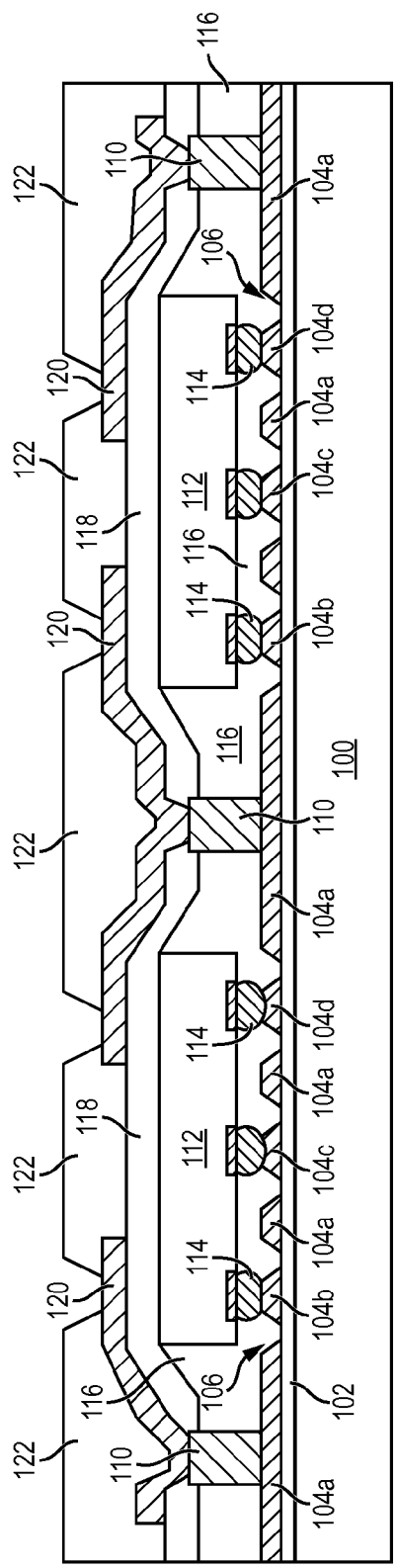

FIGS. 4a-4k illustrate, in relation to FIGS. 1 and 2a-2c, a process of forming a vertical interconnect structure for 3-D FO-WLCSP. In FIG. 4a, a substrate or wafer 100 contains dummy or sacrificial base material such as silicon (Si), polymer, polymer composite, metal, ceramic, glass, glass epoxy, beryllium oxide, or other suitable low-cost, rigid material or bulk semiconductor material for structural support.

The interface layer 102 can be temporary bonding film or etch-stop layer. The temporary bonding film can be either heat or light releasable material. The etch-stop layer can be silicon dioxide (SiO2), silicon nitride (Si3N4), silicon oxynitride (SiON), organic film, or metal film with wet etching selectivity. The interface layer 102 is deposited using lamination, PVD, CVD, printing, spin coating, spray coating, sintering, or thermal oxidation. The interface layer 102 is releasable in a later step by light or heat. Alternatively, interface layer 102 can be removed by an etching process after removing carrier 100. In one embodiment, interface layer 102 is SiO2/Si3N4 thin film and acts as an etch-stop.

An electrically conductive layer 104 is formed over interface layer 102 using a deposition and patterning process to form individual portions or sections 104a-104d. FIG. 4b shows a top or plan view of conductive layer 104a-104d, with conductive layer 104a being electrically isolated or partially isolated from conductive layer 104b-104d by gap 106 which exposes interface layer 102. Conductive layer 104 can be one or more layers of Al, Cu, Sn, Ni, Au, Ag, or other suitable electrically conductive material. The deposition of conductive layer 104 uses PVD, CVD, sputtering, electrolytic plating, electroless plating, metal evaporation, metal sputtering, or other suitable metal deposition process. In one embodiment, conductive layer 104a is a solid film for conducting current for later formed conductive pillars. Conductive layer 104b-104d includes a plated seed layer and under bump metallization (UBM) pads containing multiple layers of selectively plated Ni/Au, titanium (Ti)/Cu, titanium tungsten (TiW)/Cu, Ti/Cu/nickel vanadium (NiV)/Cu, or their combination. UBM pads 104b-104d provide bondable pads for bonding with bumps 114, and may further provide a barrier to diffusion and a seed layer for wettability.

In FIG. 4c, a photoresist layer 108 is deposited over interface layer 102 and conductive layer 104. A portion of photoresist layer 108 is exposed and removed by an etching development process. Conductive pillars or posts 110 are formed in the removed portion of photoresist 108 over conductive layer 104a using selective plating or other suitable process. Conductive pillars 110 are Cu, Al, tungsten (W), Au, solder, or other suitable electrically conductive material. In one embodiment, conductive pillars 110 are formed by plating Cu in the patterned areas of photoresist 108. In one embodiment, conductive pillars 110 have a height ranging from 2-120 micrometers (μm). Photoresist 108 is stripped away leaving behind individual conductive pillars 110. In another embodiment, conductive pillars 110 can be replaced with solder balls or stud bumps.

In FIG. 4d, semiconductor die 112 from FIGS. 3a-3c are mounted to UBM pads 104b-104d with bumps 114 in a flipchip arrangement such that the active surface of semiconductor die 112 is oriented toward carrier 100. Alternatively, bumps or interconnects 114 are formed over UBM pads 104b-104d rather than over contact pads 98 such that semiconductor die 112 is mounted to bumps or interconnects 114 when the semiconductor die is mounted over the UBM pads. In another embodiment, passive components are mounted to UBM pads 104b-104d. Accordingly, the same conductive layer 104 operates for both flipchip bonding placement and conductive pillar plating.

FIG. 4e shows an encapsulant or molding compound 116 deposited over semiconductor die 112, conductive layer 104, interface layer 102, and around conductive pillars 110 using a paste printing, compressive molding, transfer molding, liquid encapsulant molding, vacuum lamination, or other suitable applicator. Encapsulant 116 can be polymer composite material, such as epoxy resin with filler, epoxy acrylate with filler, or polymer with proper filler. Encapsulant 116 is non-conductive and environmentally protects the semiconductor device from external elements and contaminants. Encapsulant 116 has a coefficient of thermal expansion (CTE) that is adjusted to match that of the base semiconductor material, e.g., Si, with a high glass transition temperature (Tg) in the range of 100 to 300 degrees Celsius (° C.) to reduce warpage. The CTE of encapsulant 116 can be adjusted using a filler such as a powder, fiber, or cloth additive. A suitable encapsulant material is generally characterized by good thermal conductivity similar to Si, low-shrinkage, high-resistivity of greater than 1.0 kohm-cm, low-dielectric constant of less than 3.5, and low-loss tangent of less than 0.02.

Encapsulant 116 undergoes grinding or plasma etching to expose the top surface of conductive pillars 110 and semiconductor die 112. Alternatively, encapsulant 116 is deposited with a partially exposed molding technology such that encapsulant 116 does not cover the top surface of conductive pillars 110 and semiconductor die 112. In either instance, conductive pillars 110 represent a through molding interconnect (TMI) structure. A height of the exposed surface of conductive pillars 110 is less than a height of a backside surface of semiconductor die 112. As a result, a height of encapsulant 116 adjacent to the backside surface of semiconductor die 112 is greater than a height of encapsulant 116 formed over carrier 100 and in a periphery of conductive pillars 110 outside a footprint of semiconductor die 112. A portion of a top surface of encapsulant 116 includes a tapered or sloped profile that extends from a first height of encapsulant 116 formed in a periphery of conductive pillars 110 to a backside surface of semiconductor die 112 at a second height. The second height is greater than the first height. In one embodiment, the difference between the first height and the second height is in a range of 10-200 μm. The difference between the first height and the second height can be changed by removing a portion of the backside surface of semiconductor die 112 and a portion of encapsulant 116 in a periphery of the backside of the semiconductor die with backgrinding or other suitable process.

In FIG. 4f, an insulation or passivation layer 118 is formed over conductive pillars 110, encapsulant 116, and semiconductor die 112 using PVD, CVD, screen printing, spin coating, spray coating, sintering or thermal oxidation. Insulation layer 118 contains one or more layers of SiO2, Si3N4, SiON, tantalum pentoxide (Ta2O5), aluminum oxide (Al2O3), polyimide, benzocyclobutene (BCB), polybenzoxazoles (PBO), or other material having similar insulating and structural properties. In one embodiment, insulation layer 118 is a photosensitive dielectric polymer low-cured at less than 200° C. Insulation layer 118 is conformally applied to, follows the contours of, and uniformly covers conductive pillars 110, encapsulant 116, and semiconductor die 112. In one embodiment, a portion of insulation layer 118 is removed by etching or other suitable process to expose the top surface of conductive pillars 110. The insulation layer 118 is used to planarize the wafer topography and is optional.

An electrically conductive layer 120 is formed over conductive pillars 110 and insulation layer 118 using a patterning and metal deposition process such as printing, PVD, CVD, sputtering, electrolytic plating, electroless plating, metal evaporation, metal sputtering, or other suitable metal deposition process. Conductive layer 120 is one or more layers of Al, Cu, Sn, Ni, Au, Ag, Ti, or other suitable electrically conductive material. In one embodiment, conductive layer 120 is a multi-layer RDL structure containing Ti/Cu or Ti/Al alloy. Conductive layer 120 follows the contour of insulation layer 118, the openings in insulation layer 118 over conductive pillars 110, and portions of conductive pillars 110 exposed by the openings in insulation layer 118. Conductive layer 120 operates as an RDL to extend electrical connection with respect to conductive pillar 110.

An insulation or passivation layer 122 is formed over insulation layer 118 and conductive layer 120 using PVD, CVD, screen printing, spin coating, spray coating, sintering or thermal oxidation. Insulation layer 122 contains one or more layers of SiO2, Si3N4, SiON, Ta2O5, Al2O3, polyimide, BCB, PBO, or other material having similar insulating and structural properties. In one embodiment, insulation layer 122 is a photosensitive dielectric polymer low-cured at less than 200° C. Insulation layer 122 is formed over insulation layer 118 and conductive layer 120 to planarize the wafer topography and protect the conductive layer. A portion of insulation layer 122 is removed by etching or other suitable process to expose conductive layer 120 for package level interconnection. Additional insulation layers and conductive layers can be added to the device structure as needed for interconnect functionality.

Figure 4G:
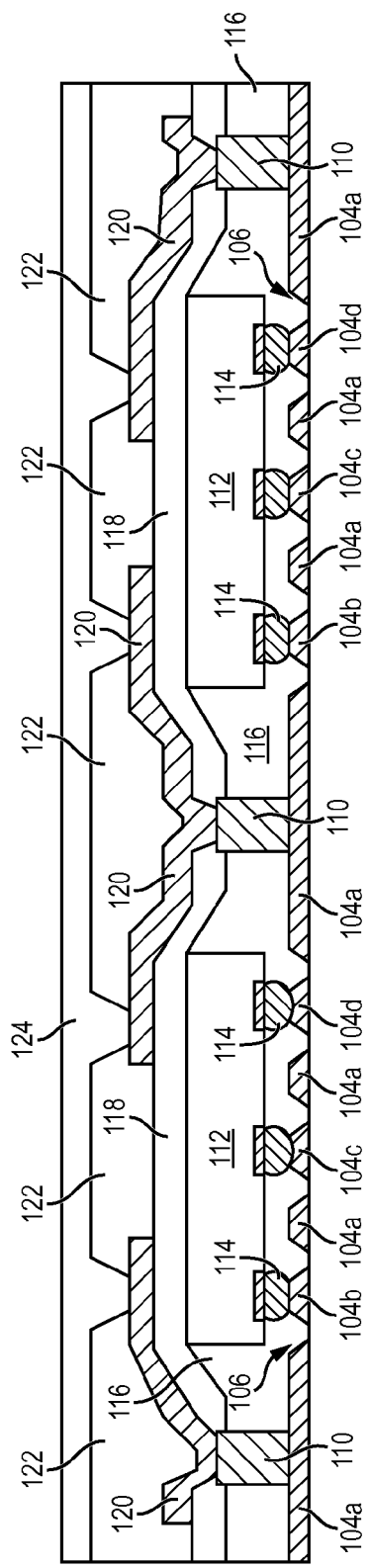

In FIG. 4g, carrier 100 and interface layer 102 are removed by chemical etching, mechanical peel-off, CMP, mechanical grinding, thermal bake, laser scanning, or wet stripping. An optional protective layer 124 is formed over conductive layer 120 and insulation layer 122 either before or after carrier and interface layer removal. Conductive layer 104a-104d remains as shown in FIG. 4b during carrier and interface layer removal. A portion of conductive layer 104a is then removed by selective patterning and wet-etching or other suitable process to form a design pattern including interconnect lines 126 and pads 128 as shown in a cross-sectional view in FIG. 4h and a plan view in FIG. 4i. Conductive layer 104 is patterned such that UBM pads 104b-104d, interconnect lines 126, and pads 128 together with later formed bumps will provide electrical connection within the semiconductor device and provide next level electrical connection to points outside the semiconductor device. In one embodiment, the removal of portions of conductive layer 104a further forms additional circuit components, such as an inductor.

In FIG. 4h, an insulation or passivation layer 130 is formed over an active surface of semiconductor die 112, conductive layer 104, and encapsulant 116 using PVD, CVD, screen printing, spin coating, spray coating, sintering or thermal oxidation. Insulation layer 130 contains one or more layers of SiO2, Si3N4, SiON, Ta2O5, Al2O3, polyimide, BCB, PBO, or other material having similar insulating and structural properties. In one embodiment, insulation layer 130 is a photosensitive dielectric polymer low-cured at less than 200° C. Insulation layer 130 is formed over and protects conductive layer 104. A portion of insulation layer 130 is removed by etching or other suitable process to expose a portion of conductive layer 104.

FIG. 4i shows a plan view of the semiconductor device including conductive layer 104, UBM pads 104b-104d, interconnect lines 126, pads 128, and insulation layer 130 configured such that later formed bumps will provide electrical connection within the semiconductor device and provide next level electrical connection to points outside the semiconductor device.

Figure 4J:
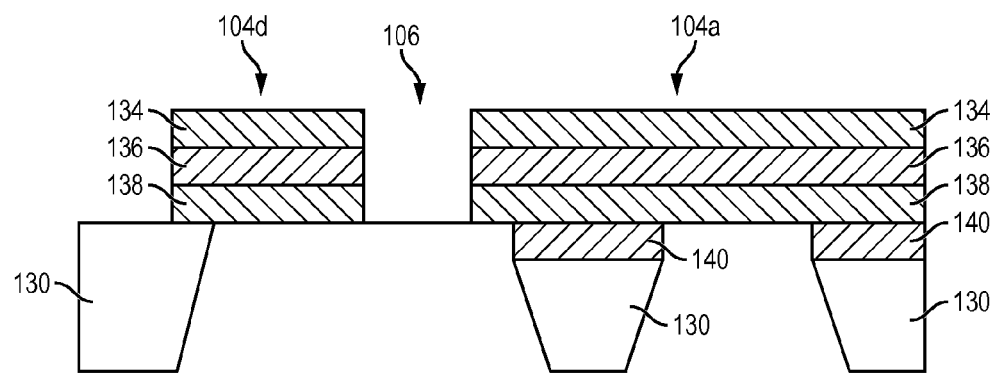

FIG. 4j shows further detail of area 132 from FIG. 4h including conductive layer 104a, conductive layer 104d, and insulation layer 130. Conductive layers 104a-104d each include stacked top wetting layer 134, barrier layer 136, and bottom wetting layer 138, such as Cu/NiV/Cu, Cu/TiW/Cu, or Cu/Ti/Cu. Adhesion layer 140 is formed between the stacked wetting and barrier layers, and insulation layer 130. In one embodiment, adhesion layer 140 is a Ti film layer. Alternatively, adhesion layer 140 is TiW, Al, or chromium (Cr). The insulation layer 130 is formed over conductive layers 104a-104d. A portion of adhesion layer 140 that is exposed by the openings formed in insulation layer 130 is removed by dry etching, wet etching, or other suitable process to expose bottom wetting layer 138 outside a footprint of insulation layer 130.

Figure 4K:
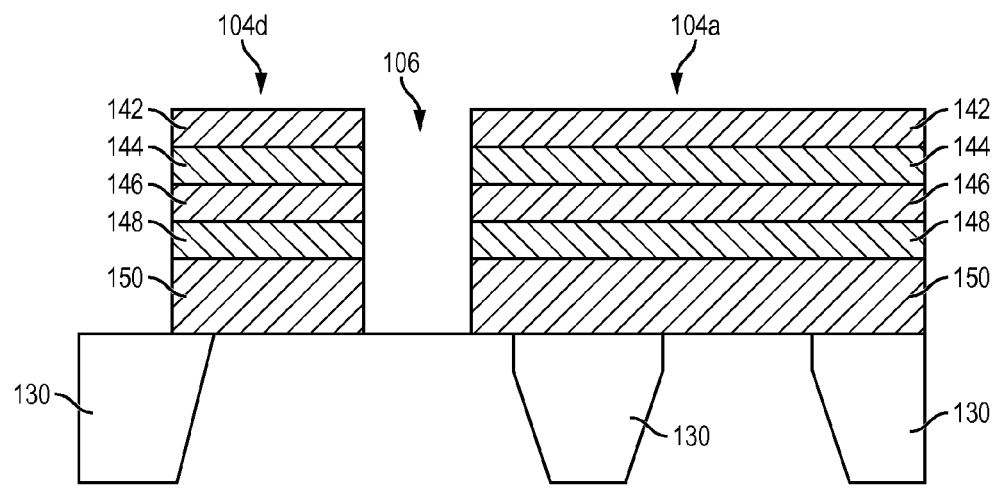

FIG. 4k, similar to FIG. 4j, shows an alternate embodiment of area 132 from FIG. 4h including conductive layer 104a, conductive layer 104d, and insulation layer 130. Conductive layers 104a-104d include a multiple metal stack with top wetting layer 142, barrier layer 144, optional bottom wetting layer 146, and adhesion layer 148. Adhesion layer 148 includes a Ti, TiW film, or other suitable material. Conductive layer 150 is formed over adhesion layer 148 using a patterning and metal deposition process such as printing, PVD, CVD, sputtering, electrolytic plating, electroless plating, metal evaporation, metal sputtering, or other suitable metal deposition process. Conductive layer 150 can be one or more layers of Al, Cu, Sn, Ni, Au, Ag, or other suitable electrically conductive material. In one embodiment, conductive layer 150 is plated Cu and is formed by using conductive layer 104 as seed layer for selective plating. A portion of conductive layer 150 is removed by etching or other suitable process to form an inductor. A portion of adhesion layer 148 can be removed by dry etching, wet etching, or other suitable process to expose bottom wetting layer 146 either before or after the formation of conductive layer 150. In either instance, the portion of adhesion layer 148 is removed before the formation of insulation layer 130 over conductive layer 150.

FIG. 5a shows a 3-D FO-WLCSP from FIGS. 4a-4k with an electrically conductive bump material deposited over conductive layer 104a-104d using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 104a-104d using a suitable attachment or bonding process. In one embodiment, the bump material is reflowed by heating the material above its melting point to form spherical balls or bumps 152 and 154. In some applications, bumps 152 and 154 are reflowed a second time to improve electrical contact to conductive layer 104a-104d. The bumps can also be compression bonded to conductive layer 104a-104d. Bumps 152 act as a bridge between interconnect lines 126 and UBM pads 104b-104d, see e.g., FIGS. 4i and 5b. Bumps 154 are made higher than bumps 152 for next level interconnect without electrically shorting bumps 152. Bumps 152 and 154 represent one type of interconnect structure that can be formed over conductive layer 104a-104d. The interconnect structure can also use bond wires, 3-D interconnects, conductive paste, stud bump, micro bump, or other electrical interconnect. The 3-D FO-WLCSP provides electrical connection for semiconductor die 112 to external devices through a vertical interconnect structure including conductive layer 104, TMI conductive pillars 110, conductive layer 120, and bumps 152 and 154.

Figure 6:
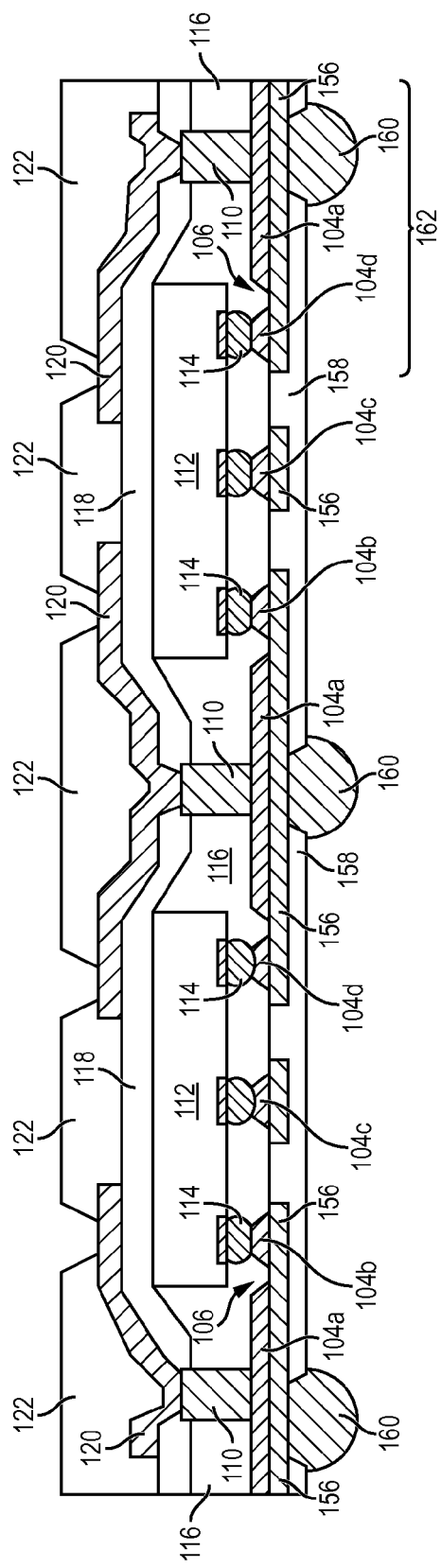
FIG. 6 illustrates an alternate embodiment of the FO-WLCSP with vertical interconnect structure.

FIG. 6 shows an alternate embodiment of a 3-D FO-WLCSP similar to the 3-D FO-WLCSP from FIGS. 4a-4k, with similar elements having the same numbers. In FIG. 6, conductive layer 156 is formed over conductive layer 104 and encapsulant 116 using a patterning and metal deposition process such as printing, PVD, CVD, sputtering, electrolytic plating, electroless plating, metal evaporation, metal sputtering, or other suitable metal deposition process. Conductive layer 156 can be one or more layers of Al, Cu, Sn, Ni, Au, Ag, or other suitable electrically conductive material. Conductive layer 156 is formed over conductive layer 104 and encapsulant 116 after a carrier and interface layer similar to carrier 100 and interface 102 from FIGS. 4*a*-4*f* are removed. Conductive layer 156 provides an electrical path between bumps 114 of semiconductor die 112, conductive pillars 110, and later formed bumps for next level interconnect. Conductive layers 104 and 156 are formed or deposited together in the same process step. Portions of conductive layers 104 and 156 are then removed in two separate steps by patterning and etching or other suitable process. A portion of conductive layer 104 is removed before the formation of conductive pillars 110. A portion of conductive layer 156 is removed after the carrier and interface layer are removed such that the remaining portion of conductive layer 156 is a UBM for later formed bumps. The remaining portion is also an RDL that provides electrical interconnect between later formed bumps, conductive pillars 110, and semiconductor die 112.

An insulation or passivation layer 158 is formed over conductive layer 156 and encapsulant 116 using PVD, CVD, screen printing, spin coating, spray coating, sintering or thermal oxidation. Insulation layer 158 contains one or more layers of SiO2, Si3N4, SiON, Ta2O5, Al2O3, polyimide, BCB, PBO, or other material having similar insulating and structural properties. In one embodiment, insulation layer 158 is a photosensitive dielectric polymer low-cured at less than 200° C. Insulation layer 158 is conformally applied to, follows the contours of, and protects, conductive layer 156 and encapsulant 116. A portion of insulation layer 158 is removed by etching or other suitable process to expose a portion of conductive layer 156 for subsequent electrical interconnect.

An electrically conductive bump material is deposited over conductive layer 156 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 156 using a suitable attachment or bonding process. In one embodiment, the bump material is reflowed by heating the material above its melting point to form spherical balls or bumps 160. In some applications, bumps 160 are reflowed a second time to improve electrical contact to conductive layer 156. The bumps can also be compression bonded to conductive layer 156. Bumps 160 represent one type of interconnect structure that can be formed over conductive layer 156. The interconnect structure can also use bond wires, 3-D interconnects, conductive paste, stud bump, micro bump, or other electrical interconnect. Bumps 160 of the 3-D FO-WLCSP provide electrical connection for semiconductor die 112 to external devices through a vertical interconnect structure including conductive layers 104 and 156, TMI conductive pillars 110, and conductive layer 120.

Figure 7:
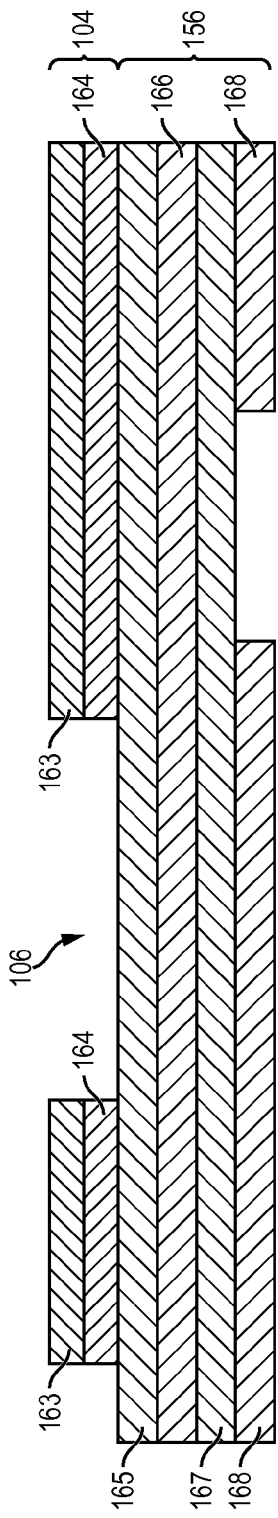
FIG. 7 illustrates the multi-layer UBM for the vertical interconnect structure of the FO-WLCSP.

FIG. 7 shows further detail of area 162 from FIG. 6 including conductive layers 104 and 156. Conductive layers 104*a*-104*d* each include a multiple metal stack with top wetting layer 163 and barrier layer 164. In one embodiment, wetting layer 163 is Cu and barrier layer 164 is NiV or Ni. Similarly, conductive layer 156 also includes a multiple metal stack with an optional middle adhesion layer 165, optional barrier layer 166, bottom wetting layer 167, and bottom adhesive layer 168. In one embodiment, adhesion layer 165 is Ti or TiW, barrier layer 166 is NiV or Ni, wetting layer 167 is Cu, and adhesive layer 168 is Ti. Conductive layers 104 and 156 are formed as separate layers, or alternatively, the conductive layers are formed or deposited together in the same process step. When conductive layers 104 and 156 are formed as separate layers, conductive layer 104 is formed and patterned before the formation of conductive pillars 110, and conductive layer 156 is formed after the removal of a temporary carrier and interface layer similar to carrier 100 and interface layer 102 shown in FIGS. 4*a*-4*f*. When conductive layers 104 and 156 are formed in the same process step, portions of the conductive layers are removed in two separate steps by patterning and etching or other suitable process. A portion of conductive layer 104 is removed from wetting layer 163 and barrier layer 164 before the formation of conductive pillars 110. A portion of conductive layer 156 is removed from adhesive layer 168 such that the remaining portion of conductive layer 156 is a UBM for later formed bumps. The remaining portion of conductive layer 156 is also an RDL that provides electrical interconnect between later formed bumps, conductive pillars 110, and semiconductor die 112. Conductive layer 156 is configured as a UBM and RDL after the carrier and interface layer are removed.

FIG. 8 shows an alternate embodiment of an interconnect structure for a 3-D FO-WLCSP similar to the 3-D FO-WLCSP from FIGS. 4*a*-4*k*. An electrically conductive layer 170, similar to conductive layer 104 shown in FIGS. 4*a*-4*k*, is formed over a carrier and interface layer to form individual portions or sections 170*a*-170*d*. Conductive layer 170*a* is electrically isolated from conductive layers 170*b*-170*d*. In one embodiment, conductive layers 170*b*-170*d* include a plated seed layer and UBM pads containing multiple layers of selectively plated Ni/Au, Ti/Cu, or Ti/Cu/NiV/Cu.

Conductive pillars or posts 176, similar to conductive posts 110 in FIG. 4*c*, are formed over conductive layer 170*a*. Semiconductor die 172, similar to semiconductor die 112 in FIG. 4*d*, are mounted to UBM pads 170*b*-170*d* with bumps 174 in a flipchip arrangement. In another embodiment, passive components can be mounted to UBM pads 170*b*-170*d*.

A first encapsulant or molding compound 178, similar to encapsulant 116 in FIG. 4*e*, is deposited over semiconductor die 172, over conductive layer 170, over a temporary carrier and interface layer similar to carrier 100 and interface layer 102, and around conductive pillars 176. Encapsulant 178 is deposited using a paste printing, compressive molding, transfer molding, liquid encapsulant molding, vacuum lamination, or other suitable applicator. Encapsulant 178 can be polymer composite material, such as epoxy resin with filler, epoxy acrylate with filler, or polymer with proper filler. Encapsulant 178 is non-conductive and environmentally protects the semiconductor device from external elements and contaminants. Encapsulant 178 has a CTE that is adjusted to match that of the base semiconductor material, e.g., Si, with a high Tg in the range of 100° C. to 300° C. to reduce warpage. The CTE of encapsulant 178 can be adjusted using a filler such as a powder, fiber, or cloth additive. A suitable encapsulant material is generally characterized by good thermal conductivity similar to Si, low-shrinkage, high-resistivity of greater than 1.0 kohm-cm, low-dielectric constant of less than 3.5, and low-loss tangent of less than 0.02.

Encapsulant 178 undergoes grinding or plasma etching to expose the top surface of conductive pillars 176 and semiconductor die 172. Alternatively, encapsulant 178 is deposited with a partially exposed molding technology such that encapsulant 178 does not cover the top surface of conductive pillars 176 and semiconductor die 172. In either instance, conductive pillars 176 represent a TMI structure. A height of the exposed surface of conductive pillars 176 is less than a height of a backside surface of semiconductor die 172. As a result, a height of encapsulant 178 adjacent to the backside surface of semiconductor die 172 is greater than a height of encapsulant 178 formed over the carrier and in a periphery of conductive pillars 176 outside a footprint of semiconductor die 172. A portion of a top surface 179 of encapsulant 178 includes a tapered or sloped profile that extends from a first height of encapsulant 178 formed in a periphery of conductive pillars 176 to a backside surface of semiconductor die 172 at a second height. The second height is greater than the first height. In one embodiment, the difference between the first height and the second height is in a range of 10-200 µm. The difference between the first height and the second height can be changed by removing a portion of the backside surface of semiconductor die 172 and a portion of encapsulant 178 in a periphery of the backside of semiconductor die with backgrinding or other suitable process.

An electrically conductive bump material is deposited over conductive pillars 176 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive pillars 176 using a suitable attachment or bonding process. In one embodiment, the bump material is reflowed by heating the material above its melting point to form spherical balls or bumps 180. In some applications, bumps 180 are reflowed a second time to improve electrical contact to conductive pillars 176. The bumps can also be compression bonded to conductive pillars 176. Bumps 180 represent one type of interconnect structure that can be formed over conductive pillars 176. The interconnect structure can also use conductive paste, stud bump, micro bump, or other electrical interconnect. Accordingly, bumps 180 are formed over, and are electrically connected to, conductive pillars 176 to form a TMI structure with increased height or standoff.

A second encapsulant or molding compound 181 is deposited over first encapsulant 178, over semiconductor die 172, and around bumps 180 using a paste printing, compressive molding, transfer molding, liquid encapsulant molding, vacuum lamination, or other suitable applicator. Encapsulant 181 can be polymer composite material, such as epoxy resin with filler, epoxy acrylate with filler, or polymer with proper filler. Encapsulant 181 is non-conductive and environmentally protects the semiconductor device from external elements and contaminants. Encapsulant 181 has a CTE that is adjusted to match that of the base semiconductor material, e.g., Si, with a high Tg in the range of 100° C. to 300° C. to reduce warpage. The CTE of encapsulant 181 can be adjusted using a filler such as a powder, fiber, or cloth additive. A suitable encapsulant material is generally characterized by good thermal conductivity similar to Si, low-shrinkage, high-resistivity of greater than 1.0 kohm-cm, low-dielectric constant of less than 3.5, and low-loss tangent of less than 0.02.

Encapsulant 181 includes a first or bottom surface 182 that is conformally applied to, and follows the contours of, the top surface 179 of encapsulant 178 including the tapered or sloped profile that extends from a first height in a periphery of conductive pillars 176 to a backside surface of semiconductor die 172 at a second height. Encapsulant 181 also includes a second or top surface 183 formed opposite the first or bottom surface 182. Second or top surface 183 is planar and does not parallel the contour of the first or bottom surface 182. In one embodiment, encapsulant 181 is deposited with a partially exposed molding technology such that the second or top surface 183 of encapsulant 181 does not cover a top surface or portion of bumps 180. Alternatively, the second or top surface 183 of encapsulant 181 does cover a top surface or portion of bumps 180, and encapsulant 181 undergoes grinding or plasma etching to remove a portion of encapsulant 181 to expose the top surface or portion of bumps 180. In either instance, bumps 180 are exposed as part of a TMI structure having increased height or standoff with respect to a TMI structure including only conductive pillars 176.

An electrically conductive layer 184 is formed over bumps 180 and encapsulant 181 using a patterning and metal deposition process such as printing, PVD, CVD, sputtering, electrolytic plating, electroless plating, metal evaporation, metal sputtering, or other suitable metal deposition process. Conductive layer 184 is one or more layers of Al, Cu, Sn, Ni, Au, Ag, Ti, or other suitable electrically conductive material. In one embodiment, conductive layer 184 is a multi-layer RDL structure containing Ti/Cu or Ti/Al alloy. Conductive layer 184 is conformally applied to, and follows the contour of, a top surface or portion of bumps 180 and second or top surface 183 of encapsulant 181. Conductive layer 184 operates as an RDL to extend electrical connection with respect to bump 180 and conductive pillar 176.

An insulation or passivation layer 186 is formed over second encapsulant 181 and conductive layer 184 using PVD, CVD, screen printing, spin coating, spray coating, sintering or thermal oxidation. Insulation layer 186 contains one or more layers of SiO2, Si3N4, SiON, Ta2O5, Al2O3, polyimide, BCB, PBO, or other material having similar insulating and structural properties. In one embodiment, insulation layer 186 is a photosensitive dielectric polymer low-cured at less than 200° C. Insulation layer 186 is formed over encapsulant 181 and conductive layer 184 to planarize the wafer topography and protect the conductive layer. A portion of insulation layer 186 is removed by etching or other suitable process to expose conductive layer 184 for package level interconnection. Additional insulation layers and conductive layers can be added to the device structure as needed for interconnect functionality.

The carrier and interface layer, similar to carrier 100 and interface layer 102 in FIG. 4g, are removed by chemical etching, mechanical peel-off, CMP, mechanical grinding, thermal bake, laser scanning, or wet stripping. A portion of conductive layer 170a is then removed by selective patterning and wet-etching or other suitable process to form a design pattern including interconnect lines and pads similar to interconnect lines 126 and pads 128 shown in FIG. 4h and FIG. 4i. Conductive layer 170a can also be patterned to form additional circuit components, such as an inductor.

An insulation or passivation layer 188, similar to insulation layer 130 in FIG. 4h, is formed over an active surface of semiconductor die 172, conductive layer 170, and encapsulant 178. Insulation layer 188 is formed over and protects conductive layer 170. A portion of insulation layer 188 is removed by etching or other suitable process to expose a portion of conductive layer 170.

An electrically conductive bump material is deposited over conductive layer 170a-170d to form spherical balls or bumps 190 and 192, similar to the process of forming bumps 152 and 154 shown in FIG. 5a. Bumps 190 act as a bridge between interconnect lines and UBM pads, similar to interconnect lines 126 and UBM pads 128 in FIGS. 4i and 5b. Bumps 192 are made larger than bumps 190 for next level interconnect without electrically shorting bumps 190. Bumps 190 and 192 represent one type of interconnect structure that can be formed over conductive layer 170a-170d. The interconnect structure can also use bond wires, 3-D interconnects, conductive paste, stud bump, micro bump, or other electrical interconnect. The 3-D FO-WLCSP provides electrical connection for semiconductor die 172 to external devices through a vertical interconnect structure including conductive layer 170, TMI conductive pillars 176, conductive layer 184, and bumps 180, 190, and 192.

Figure 9B:
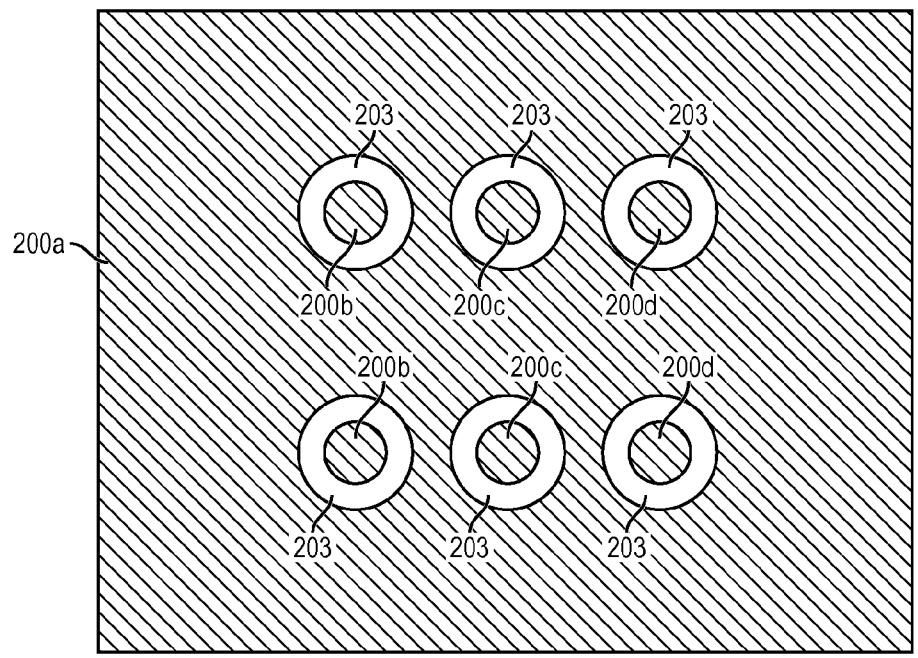
Figure 9C:
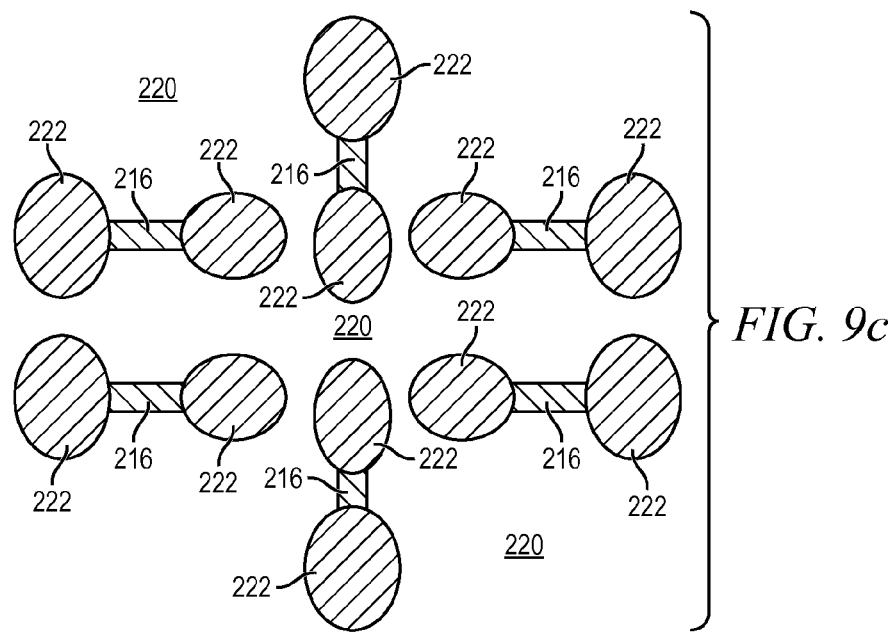

FIGS. 9a-9c show an alternate embodiment of an interconnect structure for a 3-D FO-WLCSP similar to the 3-D FO-WLCSP from FIG. 6. FIG. 9a differs from FIG. 6 with the inclusion of conductive layer 218, which is discussed in more detail below. In FIG. 9a, an electrically conductive layer 200, similar to conductive layer 104 shown in FIG. 6, is formed over a carrier and interface layer to form individual portions or sections 200a-200d. Individual portions or sections 200a-200d are shown in plan view in FIG. 9b. Conductive layer 200a is electrically isolated from conductive layers 200b-200d by gap 203. In one embodiment, conductive layers 200b-200d include a plated seed layer and UBM pads containing multiple layers of selectively plated Ni/Au, Ti/Cu, or Ti/Cu/NiV/Cu.

Conductive pillars or posts 206, similar to conductive posts 110 in FIG. 6, are formed over conductive layer 200a. Semiconductor die 202, similar to semiconductor die 112 in FIG. 6, are mounted to UBM pads 200b-200d with bumps 204 in a flipchip arrangement. In another embodiment, passive components can be mounted to UBM pads 200b-200d. Encapsulant 208, insulation layer 210, conductive layer 212, and insulation layer 214 shown in FIG. 9a are analogous to encapsulant 116, insulation layer 118, conductive layer 120, and insulation layer 122, respectively, as shown in FIGS. 4a-4k and FIG. 6.

After forming or depositing material over the carrier and interface layer, e.g., providing encapsulant 208, insulation layer 210, conductive layer 212, and insulation layer 214, the carrier and interface layer, similar to carrier 100 and interface layer 102 in FIG. 4g, are removed by chemical etching, mechanical peel-off, CMP, mechanical grinding, thermal bake, laser scanning, or wet stripping. Conductive layers 200a-200d remain as shown in FIG. 9b during carrier and interface layer removal. A portion of conductive layer 200a is then removed by selective patterning and wet-etching or other suitable process to form a design pattern including interconnect lines and pads shown in the cross-sectional view of FIG. 9a and the plan view of FIG. 9c. Conductive layer 200a can also be patterned to form additional circuit components, such as an inductor.

A conductive layer 218 is formed over conductive layer 200 and encapsulant 208 using a patterning and metal deposition process such as printing, PVD, CVD, sputtering, electrolytic plating, electroless plating, metal evaporation, metal sputtering, or other suitable metal deposition process. Conductive layer 218 can be one or more layers of Al, Cu, Sn, Ni, Au, Ag, or other suitable electrically conductive material. Conductive layer 218 is formed over conductive layer 200 and encapsulant 208 after a portion of conductive layer 200a is removed to form the interconnect lines 216 and pads shown in FIG. 9c. Conductive layer 218 provides an electrical path between bumps 204 of semiconductor die 202, conductive pillars 206, and later formed bumps for next level interconnect. Thus, conductive layer 218 provides interconnection among semiconductor die 202 and points external to the semiconductor die rather than using bumps, such as bumps 152 shown in FIG. 5a to provide electrical interconnect. Accordingly, conductive layers 200 and 218 shown in FIG. 9a are formed in different process steps. Conductive layer 200 is formed over the carrier and interface layer. Conductive layer 218 is formed over conductive layer 200 after the removal of the carrier and interface layer. Thus, the forming of conductive layer 218 in FIG. 9 differs from the formation of conductive layer 156 from FIG. 6 because conductive layer 156 is formed over the carrier and interface layer with, and in the same process step as, conductive layer 104.

FIG. 9a further shows an insulation or passivation layer 220 formed over conductive layer 218 and encapsulant 208 using PVD, CVD, screen printing, spin coating, spray coating, sintering or thermal oxidation. Insulation layer 220 contains one or more layers of SiO2, Si3N4, SiON, Ta2O5, Al2O3, polyimide, BCB, PBO, or other material having similar insulating and structural properties. In one embodiment, insulation layer 220 is a photosensitive dielectric polymer low-cured at less than 200° C. Insulation layer 220 is conformally applied to, follows the contours of, and protects, conductive layer 218 and encapsulant 208. A portion of insulation layer 220 is removed by etching or other suitable process to expose a portion of conductive layer 218 for subsequent electrical interconnect.

An electrically conductive bump material is deposited over conductive layer 218 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 218 using a suitable attachment or bonding process. In one embodiment, the bump material is reflowed by heating the material above its melting point to form spherical balls or bumps 222. In some applications, bumps 222 are reflowed a second time to improve electrical contact to conductive layer 218. The bumps can also be compression bonded to conductive layer 218. Bumps 222 represent one type of interconnect structure that can be formed over conductive layer 218. The interconnect structure can also use bond wires, 3-D interconnects, conductive paste, stud bump, micro bump, or other electrical interconnect. Bumps 222 of the 3-D FO-WLCSP provide electrical connection for semiconductor die 202 to external devices through a vertical interconnect structure including conductive layers 200 and 218, TMI conductive pillars 206, and conductive layer 212.

Figure 10A:
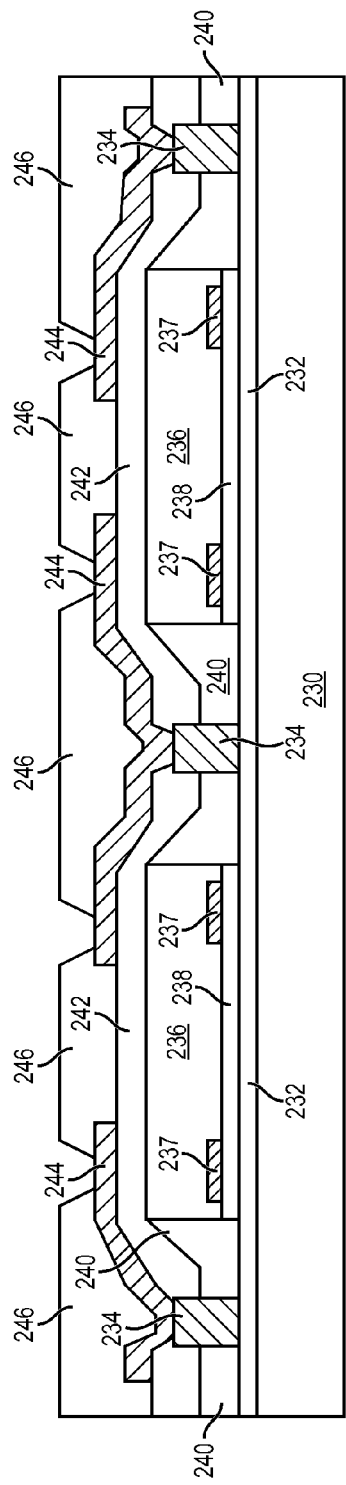
FIGS. 10a-10b illustrate another process of forming a vertical interconnect structure for 3-D FO-WLCSP.
Figure 10B:
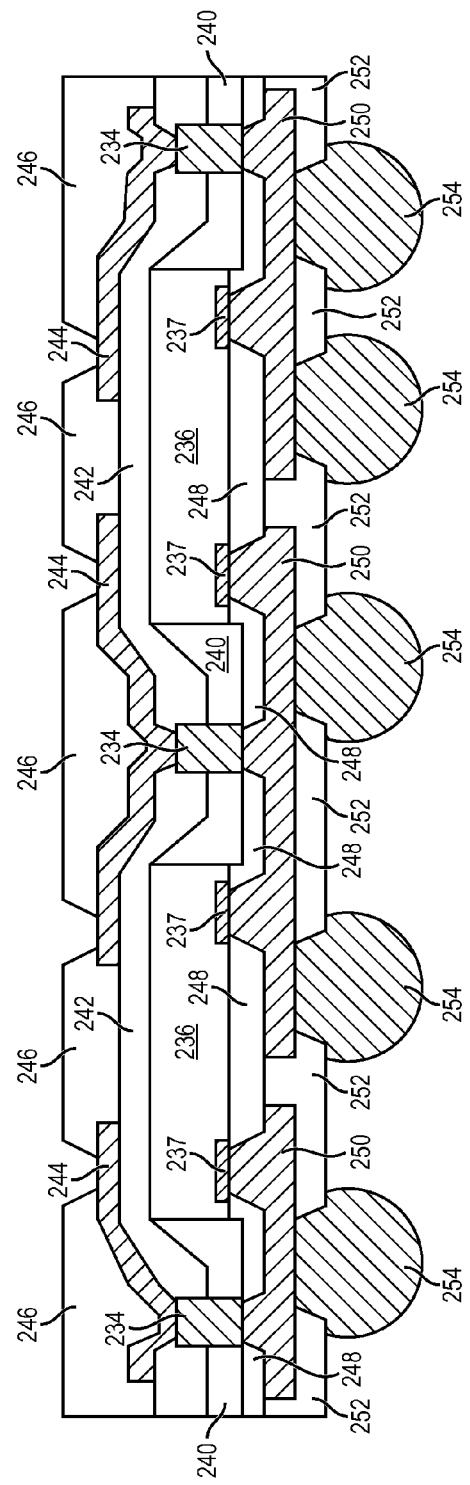

FIGS. 10a-10b illustrate another process of forming an interconnect structure for 3-D FO-WLCSP. In FIG. 10a, a substrate or wafer 230 contains dummy or sacrificial base material such as Si, polymer, polymer composite, metal, ceramic, glass, glass epoxy, beryllium oxide, or other suitable low-cost, rigid material or bulk semiconductor material for structural support.

An interface layer 232 is deposited over carrier 230. The interface layer 232 can be temporary bonding film or etch-stop layer. The temporary bonding film can be either heat or light releasable material. The etch-stop layer can be SiO2, Si3N4, SiON, organic film, or metal film. The interface layer 232 is deposited using lamination, PVD, CVD, printing, spin coating, spray coating, sintering or thermal oxidation. In one embodiment, interface layer 232 is SiO2/Si3N4 thin film and acts as an etch-stop.

A photoresist layer is deposited over interface layer 232. A portion of the photoresist is exposed and removed by an etching process. Conductive pillars or posts 234 are formed in the removed portion of the photoresist using a photolithographic process. Conductive pillars or posts 234 are formed in the removed portion of the photoresist over interface layer 232 using selective plating or other suitable process. Conductive pillars 234 can be Cu, Al, W, Au, solder, or other suitable electrically conductive material. In one embodiment, conductive pillars 234 are formed by plating Cu in the patterned areas of the photoresist. Conductive pillars 234 have a height ranging from 2-120 μm. The photoresist is stripped away leaving behind individual conductive pillars 234. In another embodiment, TMI conductive pillars 234 can be replaced with solder balls or stud bumps.

A plurality of semiconductor die 236 with contact pads 237 are mounted to interface layer 232 with pre-applied and strippable adhesive 238. Semiconductor die 236 each include a substrate with an active region containing analog or digital circuits implemented as active devices, passive devices, conductive layers, and dielectric layers formed within the semiconductor die and electrically interconnected according to the electrical design of the semiconductor die. For example, the circuit may include one or more transistors, diodes, inductors, capacitors, resistors, and other circuit elements formed within the active region of semiconductor die 236 to implement analog circuits or digital circuits, such as DSP, ASIC, memory, or other signal processing circuit.

Contact pads 237 are formed over an active surface of semiconductor die 236 using PVD, CVD, electrolytic plating, electroless plating process, or other suitable metal deposition process. Contact pads 237 can be one or more layers of Al, Cu, Sn, Ni, Au, Ag, or other suitable electrically conductive material. Contact pads 237 electrically connected to the circuits on the active surface. Contact pads 237 can be disposed side-by-side a first distance from the edge of semiconductor die 236. Alternatively, contact pads 237 can be offset in multiple rows such that a first row of contact pads is disposed a first distance from the edge of the die, and a second row of contact pads alternating with the first row is disposed a second distance from the edge of the die.

An encapsulant or molding compound 240, similar to encapsulant 116 in FIG. 4e, is deposited over semiconductor die 236, over carrier 230 and interface layer 232, and around conductive pillars 234. Encapsulant 240 is deposited using a paste printing, compressive molding, transfer molding, liquid encapsulant molding, vacuum lamination, or other suitable applicator. Encapsulant 240 can be polymer composite material, such as epoxy resin with filler, epoxy acrylate with filler, or polymer with proper filler. Encapsulant 240 is non-conductive and environmentally protects the semiconductor device from external elements and contaminants. Encapsulant 240 has a CTE that is adjusted to match that of the base semiconductor material, e.g., Si, with a high Tg in the range of 100° C. to 300° C. to reduce warpage. The CTE of encapsulant 240 can be adjusted using a filler such as a powder, fiber, or cloth additive. A suitable encapsulant material is generally characterized by good thermal conductivity similar to Si, low-shrinkage, high-resistivity of greater than 1.0 kohm-cm, low-dielectric constant of less than 3.5, and low-loss tangent of less than 0.02.

Encapsulant 240 undergoes grinding or plasma etching to expose a top surface of conductive pillars 234 and a backside surface of semiconductor die 236. Alternatively, encapsulant 240 is deposited with a partially exposed molding technology such that encapsulant 240 does not cover the top surface of conductive pillars 234 and semiconductor die 236. In either instance, conductive pillars 234 represent a TMI structure. A height of the exposed surface of conductive pillars 234 is less than a height of a backside surface of semiconductor die 236. As a result, a height of encapsulant 240 adjacent to the backside surface of semiconductor die 236 is greater than a height of encapsulant 240 formed over carrier 230 and in a periphery of conductive pillars 234 outside a footprint of semiconductor die 236. A portion of a top surface of encapsulant 240 includes a tapered or sloped profile that extends from a first height of encapsulant 240 formed in a periphery of conductive pillars 234 to a backside surface of semiconductor die 236 at a second height. The second height is greater than the first height. In one embodiment, the difference between the first height and the second height is in a range of 10-200 μm. The difference between the first height and the second height can be changed by removing a portion of the backside surface of semiconductor die 236 and a portion of encapsulant 240 in a periphery of the backside of semiconductor die 236 with backgrinding or other suitable process.

An insulation or passivation layer 242 is formed over conductive pillars 234, encapsulant 240, and semiconductor die 236 using PVD, CVD, screen printing, spin coating, spray coating, sintering or thermal oxidation. Insulation layer 242 contains one or more layers of SiO2, Si3N4, SiON, Ta2O5, Al2O3, polyimide, BCB, PBO, or other material having similar insulating and structural properties. In one embodiment, insulation layer 242 is a photosensitive dielectric polymer low-cured at less than 200° C. Insulation layer 242 is conformally applied to, follows the contours of, and uniformly covers conductive pillars 234, encapsulant 240, and semiconductor die 236. In one embodiment, a portion of insulation layer 242 is removed by etching or other suitable process to expose a top surface of conductive pillars 234. The insulation layer 242 is used to planarize the wafer topography and is optional.

An electrically conductive layer 244 is formed over conductive pillars 234 and insulation layer 242 using a patterning and metal deposition process such as printing, PVD, CVD, sputtering, electrolytic plating, electroless plating, metal evaporation, metal sputtering, or other suitable metal deposition process. Conductive layer 244 is one or more layers of Al, Cu, Sn, Ni, Au, Ag, Ti, or other suitable electrically conductive material. In one embodiment, conductive layer 244 is a multi-layer RDL structure containing Ti/Cu or Ti/Al alloy. Conductive layer 244 follows the contour of insulation layer 242, the openings in insulation layer 242 over conductive pillars 234, and portions of conductive pillars 234 exposed by the openings in insulation layer 242. Conductive layer 244 operates as an RDL to extend electrical connection with respect to conductive pillar 234.

An insulation or passivation layer 246 is formed over insulation layer 242 and conductive layer 244 using PVD, CVD, screen printing, spin coating, spray coating, sintering or thermal oxidation. Insulation layer 246 contains one or more layers of SiO2, Si3N4, SiON, Ta2O5, Al2O3, polyimide, BCB, PBO, or other material having similar insulating and structural properties. In one embodiment, insulation layer 246 is a photosensitive dielectric polymer low-cured at less than 200° C. Insulation layer 246 is formed over insulation layer 242 and conductive layer 244 to planarize the wafer topography and protect the conductive layer. A portion of insulation layer 246 is removed by etching or other suitable process to expose conductive layer 244 for package level interconnection. Additional insulation layers and conductive layers can be added to the device structure as needed for interconnect functionality.

In FIG. 10b, carrier 230, interface layer 232, and adhesive 238 are removed by chemical etching, mechanical peel-off, CMP, mechanical grinding, thermal bake, laser scanning, or wet stripping. An optional protective layer can be formed over conductive layer 244 and insulation layer 246 opposite carrier 230 either before or after the removal of the carrier and interface layer 232.

An insulation or passivation layer 248 is formed over an active surface of semiconductor die 236, conductive pillars 234, and encapsulant 240 using PVD, CVD, screen printing, spin coating, spray coating, sintering or thermal oxidation. Insulation layer 248 contains one or more layers of SiO2, Si3N4, SiON, Ta2O5, Al2O3, polyimide, BCB, PBO, or other material having similar insulating and structural properties. In one embodiment, insulation layer 248 is a photosensitive dielectric polymer low-cured at less than 200° C. Insulation layer 248 is formed over and protects conductive pillars 234 and semiconductor die 236. A portion of insulation layer 248 is removed by etching or other suitable process to expose a bottom portion of conductive pillar 234 and contact pads 237.

An electrically conductive layer 250 is formed over conductive pillars 234, contact pads 237, and insulation layer 248 using a patterning and metal deposition process such as printing, PVD, CVD, sputtering, electrolytic plating, electroless plating, metal evaporation, metal sputtering, or other suitable metal deposition process. Conductive layer 250 is one or more layers of Al, Cu, Sn, Ni, Au, Ag, Ti, or other suitable electrically conductive material. In one embodiment, conductive layer 250 is a multi-layer RDL structure containing Ti/Cu or Ti/Al alloy. Conductive layer 250 follows the contour of insulation layer 248, the openings in insulation layer 248 over conductive pillars 234, and portions of conductive pillars 234 exposed by the openings in insulation layer 248. Conductive layer 250 operates as an RDL to extend electrical connection with respect to conductive pillar 234 and semiconductor die 236.

An insulation or passivation layer 252 is formed over conductive layer 250 and insulation layer 248 using PVD, CVD, screen printing, spin coating, spray coating, sintering or thermal oxidation. Insulation layer 252 contains one or more layers of SiO2, Si3N4, SiON, Ta2O5, Al2O3, polyimide, BCB, PBO, or other material having similar insulating and structural properties. In one embodiment, insulation layer 252 is a photosensitive dielectric polymer low-cured at less than 200° C. Insulation layer 252 is formed over and protects conductive layer 250. A portion of insulation layer 252 is removed by etching or other suitable process to expose a portion of conductive layer 250.

An electrically conductive bump material is deposited over conductive layer 250 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 250 using a suitable attachment or bonding process. In one embodiment, the bump material is reflowed by heating the material above its melting point to form spherical balls or bumps 254. In some applications, bumps 254 are reflowed a second time to improve electrical contact to conductive layer 250. The bumps can also be compression bonded to conductive layer 250. Bumps 254 represent one type of interconnect structure that can be formed over conductive layer 250. The interconnect structure can also use bond wires, 3-D interconnects, conductive paste, stud bump, micro bump, or other electrical interconnect. Bumps 254 of the 3-D FO-WLCSP provide electrical connection for semiconductor die 236 to external devices through a vertical interconnect structure including conductive layer 244, conductive layer 250, and TMI conductive pillars 234.

Figure 11:
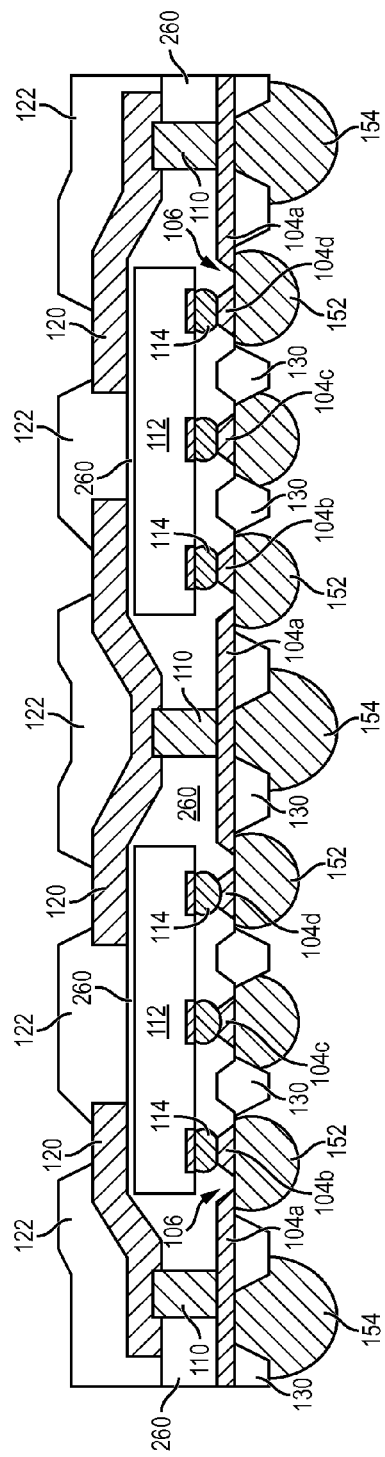
FIG. 11 illustrates the FO-WLCSP with vertical interconnect structure having encapsulant over the semiconductor die.

FIG. 11 shows an alternate embodiment of a 3-D FO-WLCSP similar to the 3-D FO-WLCSP from FIGS. 4a-4k, with similar elements having the same numbers. FIG. 11 differs from FIGS. 4a-4k in that encapsulant 260 remains disposed over semiconductor die 112 rather than exposing a backside surface of the semiconductor die with respect to the encapsulant as shown, e.g., in FIG. 4e.

In FIG. 11 an encapsulant or molding compound 260, similar to encapsulant 116 in FIG. 4e, is deposited over semiconductor die 112, over a carrier and interface layer, and around conductive pillars 110. Encapsulant 260 is deposited using a paste printing, compressive molding, transfer molding, liquid encapsulant molding, vacuum lamination, or other suitable applicator. Encapsulant 260 can be polymer composite material, such as epoxy resin with filler, epoxy acrylate with filler, or polymer with proper filler. Encapsulant 260 is non-conductive and environmentally protects the semiconductor device from external elements and contaminants. Encapsulant 260 has a CTE that is adjusted to match that of the base semiconductor material, e.g., Si, with a high Tg in the range of 100° C. to 300° C. to reduce warpage. The CTE of encapsulant 260 can be adjusted using a filler such as a powder, fiber, or cloth additive. A suitable encapsulant material is generally characterized by good thermal conductivity similar to Si, low-shrinkage, high-resistivity of greater than 1.0 kohm-cm, low-dielectric constant of less than 3.5, and low-loss tangent of less than 0.02.

Encapsulant 260 undergoes grinding or plasma etching to expose the top surface of conductive pillars 110. The grinding and etching does not expose a backside surface of semiconductor die 112 such that a layer of encapsulant 260 remains over an entire backside surface of, and passivates, semiconductor die 112. Alternatively, encapsulant 260 is deposited with a partially exposed molding technology such that encapsulant 260 does not cover the top surface of conductive pillars 110, but does cover a backside surface of semiconductor die 112. In either instance, conductive pillars 110 represent a TMI structure with a portion of conductive pillar 110 being exposed from encapsulant 260. A height of the exposed surface of conductive pillars 110 is less than a height of a backside surface of semiconductor die 112. As a result, a height of encapsulant 260 over the backside surface of semiconductor die 112 is greater than a height of encapsulant 260 formed in a periphery of conductive pillars 110 outside a footprint of semiconductor die 112. A portion of a top surface of encapsulant 260 includes a tapered or sloped profile that extends from a first height of encapsulant 260 formed in a periphery of conductive pillars 110 to over a backside surface of semiconductor die 112 at a second height. The second height is greater than the first height. In one embodiment, the difference between the first height and the second height is in a range of 10-200 µm. The difference between the first height and the second height can be changed by removing a portion of encapsulant 260 over the backside surface of semiconductor die 112.

Figure 12:
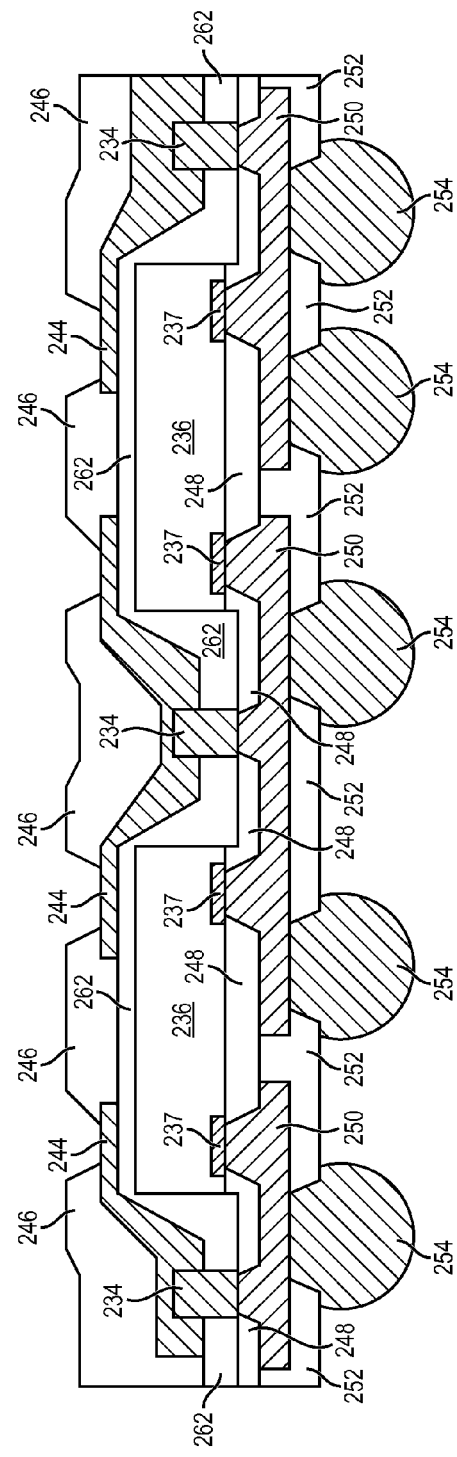
FIG. 12 illustrates the FO-WLCSP with another vertical interconnect structure having encapsulant over the semiconductor die.

FIG. 12 shows an alternate embodiment of a 3-D FO-WLCSP similar to the 3-D FO-WLCSP from FIGS. 10a-10b, with similar elements having the same numbers. FIG. 12 differs from FIGS. 10a-10b in that encapsulant 262 remains disposed over semiconductor die 236 rather than exposing a backside surface of the semiconductor die with respect to encapsulant 240 shown in FIGS. 10a-10b.

In FIG. 12, an encapsulant or molding compound 262, similar to encapsulant 240 shown in FIGS. 10a-10b, is deposited over semiconductor die 236, over a carrier and interface layer, and around conductive pillars 234. Encapsulant 262 is deposited using a paste printing, compressive molding, transfer molding, liquid encapsulant molding, vacuum lamination, or other suitable applicator. Encapsulant 262 can be polymer composite material, such as epoxy resin with filler, epoxy acrylate with filler, or polymer with proper filler. Encapsulant 262 is non-conductive and environmentally protects the semiconductor device from external elements and contaminants. Encapsulant 262 has a CTE that is adjusted to match that of the base semiconductor material, e.g., Si, with a high Tg in the range of 100° C. to 300° C. to reduce warpage. The CTE of encapsulant 262 can be adjusted using a filler such as a powder, fiber, or cloth additive. A suitable encapsulant material is generally characterized by good thermal conductivity similar to Si, low-shrinkage, high-resistivity of greater than 1.0 kohm-cm, low-dielectric constant of less than 3.5, and low-loss tangent of less than 0.02.

Encapsulant 262 undergoes grinding or plasma etching to expose the top surface of conductive pillars 234. The grinding and etching does not expose a surface of semiconductor die 236 such that a layer of encapsulant 262 remains over an entire backside surface of, and passivates, semiconductor die 236. Alternatively, encapsulant 262 is deposited with a partially exposed molding technology such that encapsulant 262 does not cover the top surface of conductive pillars 234, but does cover a backside surface of semiconductor die 236. In either instance, conductive pillars 234 represent a TMI structure with a portion of conductive pillar 234 being exposed from encapsulant 262. A height of the exposed surface of conductive pillars 234 is less than a height of a backside surface of semiconductor die 236. As a result, a height of encapsulant 262 over the backside surface of semiconductor die 236 is greater than a height of encapsulant 262 formed in a periphery of conductive pillars 234 outside a footprint of semiconductor die 236. A portion of a top surface of encapsulant 262 includes a tapered or sloped profile that extends from a first height of encapsulant 262 formed in a periphery of conductive pillars 234 to over a backside surface of semiconductor die 236 at a second height. The second height is greater than the first height. In one embodiment, the difference between the first height and the second height is in a range of 10-200 μm. The difference between the first height and the second height can be changed by removing a portion of encapsulant 262 over the backside surface of semiconductor die 236 and a portion of encapsulant 262 in a periphery of the backside of semiconductor.

FIGS. 13a-13x illustrate, in relation to FIGS. 1 and 2a-2c, another process of forming a vertical interconnect structure for a 3-D FO-WLCSP. In FIG. 13a, a substrate or temporary carrier 270 contains dummy or sacrificial base material such as Si, polymer, polymer composite, metal, ceramic, glass, glass epoxy, beryllium oxide, or other suitable low-cost, rigid material or bulk semiconductor material for structural support.

An interface layer or double-sided carrier tape 272 is formed over carrier 270 as a temporary adhesive bonding film or etch-stop layer. As carrier tape, interface layer 272 can be either heat or light releasable material. In an alternate embodiment, interface layer 272 is an etch stop layer of SiO2, Si3N4, SiON, organic film, or metal film with wet etching selectivity. Interface layer 272 is deposited using lamination, PVD, CVD, printing, spin coating, spray coating, sintering thermal oxidation, or other suitable process.

In FIG. 13b, a semiconductor die 276, similar to semiconductor die 112 from FIGS. 3a-3c is mounted over carrier 270 with an active surface of the semiconductor die oriented toward substrate 270 and interface layer 272. Semiconductor die 276 includes contact pads 277 formed over the active surface of semiconductor die 276. Contact pads 277 are made with a conductive material such as Al, Cu, Sn, Ni, Au, or Ag, and are electrically connected to circuit elements formed within semiconductor die 276. Contact pads 277 are formed by PVD, CVD, electrolytic plating, electroless plating, or other suitable process. An insulation or passivation layer 278 is formed over the active surface of semiconductor die 276. Insulation layer 278 is conformally applied over semiconductor die 276 using PVD, CVD, screen printing, spin coating, spray coating, sintering or thermal oxidation. Insulation layer 278 contains one or more layers of SiO2, Si3N4, SiON, Ta2O5, Al2O3, or other material having similar insulating and structural properties. Insulation layer 278 covers and protects one or more transistors, diodes, or other circuit elements formed within the active surface of semiconductor die 276 including IPDs, such as inductors, capacitors, and resistors. A portion of insulation layer 278 is removed from over a portion of contact pads 277. The openings in insulating layer 278 over contact pads 277 facilitate future electrical interconnect with semiconductor die 276.

Leading with the active surface of semiconductor die 276, the semiconductor die is mounted over carrier 270 and interface layer 272. Insulation layer 278 contacts interface layer 272 including a portion of insulation layer 278 in a periphery of, and around, the openings in insulation layer 278 to prevent subsequently formed encapsulant from contacting contact pads 277.

In FIG. 13c, printed dots or nodules 280 are formed on interface layer 272 and in a periphery of semiconductor die 276 with screen printing, jetting, or other suitable process. Printed dots 280 are a solvent removable material such as a photoresist layer, dry film, or paste that is removed by an etching process after exposure to a 150° C. heat treatment for one hour. Alternatively, printed dots 280 are a water removable material after exposure to a 150° C. heat treatment for one hour. Printed dots 280 are formed before semiconductor 276 is mounted over carrier 270 and interface layer 272. Alternatively, printed dots 280 are formed after semiconductor 276 is mounted over carrier 270 and interface layer 272. Printed dots 280 include a round or circular shape, a ring shape, a dam configuration, a straight line shape, or any other suitable shape according to the configuration and design of the application. Printed dots 280 provide a cavity or void in a later formed encapsulant as discussed in further detail below.

Figure 13D:
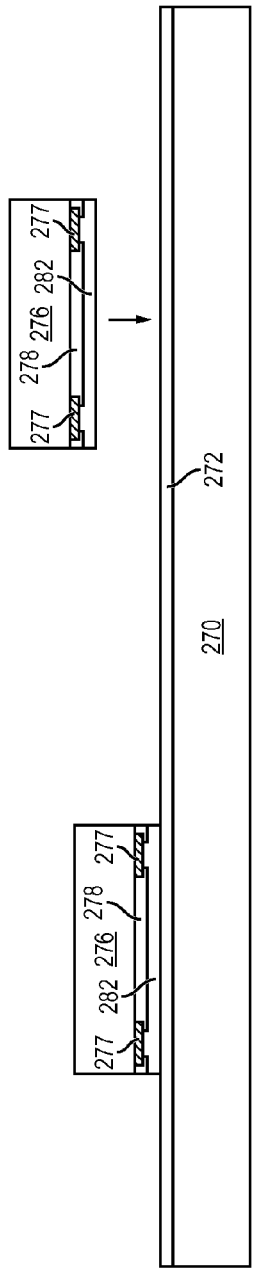
FIGS. 13a-13x illustrate another process of forming a vertical interconnect structure for 3-D FO-WLCSP.
Figure 13E:
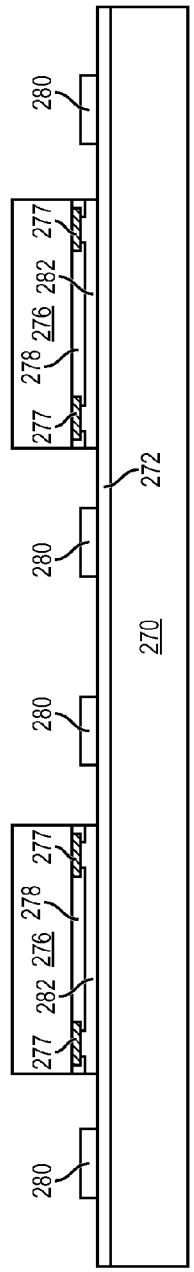

FIGS. 13d-13e, similar to FIGS. 13b-13c, show an alternate embodiment including a temporary planarization and protection layer 282 formed over insulation layer 278. While FIGS. 13d-13w show a process flow for a semiconductor device including the use of temporary planarization layer 282, the temporary planarization layer is optional, and steps similar to those shown in FIGS. 13d-13w are used to form a 3-D FO-WLCSP device without the use of temporary planarization layer 282. Accordingly, any of the embodiments presented in the figures can be made with or without temporary planarization layer 282. Temporary planarization layer 282 is conformally applied over, and follows the contours of, insulation layer 278 with spin coating, lamination, screen printing, slit coating, spray coating, or other suitable process. Temporary planarization layer 282 is a solvent removable material such as a photoresist layer or dry film that is removed by an etching process after exposure to a 150° C. heat treatment for one hour. Alternatively, temporary planarization layer 282 is a water removable material after exposure to a 150° C. heat treatment for one hour. A first surface of temporary planarization layer 282 follows a contour of a top surface of insulation layer 278, follows a contour of a sidewall of the openings in insulation layer 278, and is formed over contact pads 277 of semiconductor die 276. A second surface of temporary planarization layer 282 opposite the first surface is substantially planar and facilitates the subsequent mounting of semiconductor die 276 to interface layer 272 over carrier 270. Temporary planarization layer 282 provides increased offset between the active surface of semiconductor die 276 and a top surface of interface layer 272.

In FIG. 13e, printed dots or nodules 280 are formed on interface layer 272 and in a periphery of semiconductor die 276 as previously described in FIG. 13c. FIG. 13e further shows semiconductor die 276 is mounted over carrier 270 and interface layer 272 with the active surface of the semiconductor die oriented towards the carrier and the interface layer. Temporary planarization layer 282 contacts interface layer 272 providing increased offset between the active surface of semiconductor die 276 and a top surface of interface layer 272, preventing subsequently formed encapsulant from being formed over contact pads 277.

Figure 13F:
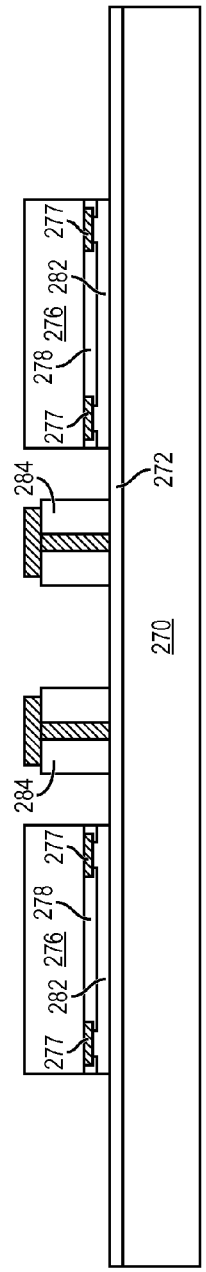

In FIG. 13f, an optional backside alignment unit 284 is formed over the surface of carrier 270 and interface layer 272. Backside alignment unit 284 contains an alignment key for subsequent laser drilling and marking, or for next level surface mount technology (SMT) alignment. Backside alignment unit 284 provides alignment when a portion of the backside alignment unit opposite interface layer 272 is exposed. A plurality of backside alignment units 284 are located over portions of carrier 270 that facilitate alignment of a plurality of semiconductor die 276 at a reconstituted wafer level. Backside alignment units 284 are, for example, located at four symmetrical positions alternately spaced near an edge of carrier 270 for global or wafer level alignment. The alignment of carrier 270 and semiconductor die 276 facilitates subsequent process steps performed at the reconstituted wafer level including laser drilling, marking, and lithography exposure processes.

In FIG. 13g, an encapsulant or molding compound 286 is deposited over and around semiconductor die 276, printed dots 280, alignment unit 284, and over interface layer 272 using a paste printing, compressive molding, transfer molding, liquid encapsulant molding, vacuum lamination, or other suitable applicator. Encapsulant 286 can be polymer composite material, such as epoxy resin with filler, epoxy acrylate with filler, or polymer with proper filler. Encapsulant 286 is non-conductive, provides physical support, and environmentally protects the semiconductor device from external elements and contaminants. In one embodiment, encapsulant 286 has a CTE that is adjusted to match that of the base semiconductor material, e.g., Si, with a high Tg in the range of 100° C. to 300° C. to reduce warpage. The CTE of encapsulant 286 can be adjusted using a filler such as a powder, fiber, or cloth additive. A suitable encapsulant material is generally characterized by good thermal conductivity similar to Si, low-shrinkage, high-resistivity of greater than 1.0 kohm-cm, low-dielectric constant of less than 3.5, and low-loss tangent of less than 0.02.

Before mounting and encapsulating semiconductor die 276 over carrier 270, semiconductor die 276 undergo a back grinding process to thin semiconductor die 276 to a desired thickness. Alternatively, semiconductor die 276 undergo back grinding at the reconstituted wafer level after being mounted to carrier 270 and encapsulated with encapsulant 286.

In FIG. 13h, carrier 270 and interface layer 272 are removed by chemical etching, mechanical peeling, CMP, mechanical grinding, thermal bake, ultra-violet (UV) light, laser scanning, or wet stripping to expose a bottom surface of encapsulant 286, and a bottom surface of temporary planarization layer 282 or insulation layer 278. FIG. 13h further shows printed dots 280 are removed to form openings or voids 288 in encapsulant 286 located in a periphery of semiconductor die 276, insulation layer 278, and temporary planarization layer 282. Alternatively, in the absence of forming printed dots 280, after the removal of carrier 270, a portion of encapsulant 286 is removed to form openings 288. The portion of encapsulant 286 removed to form openings 288 is removed by laser drilling or other suitable method. Openings 288 are shallow vias or cavities formed in a bottom surface of encapsulant 286 in a periphery of semiconductor die 276, insulation layer 278, and temporary planarization layer 282. Openings 288 extend from the bottom surface of encapsulant 286 partially but not completely through encapsulant 286. Openings 288 are configured to receive subsequently formed insulation and conductive layers that form a portion of an interconnect layer that provides electrical connection with respect to semiconductor die 276.

FIG. 13i shows openings 288 with sidewalls 290 and bottom portions 292. Sidewalls 290 are tapered rather than vertical as shown in FIG. 13h. Bottom portions 292 are planar and have an area that is less than an area of a footprint of a portion of opening 288 that is coplanar with the bottom surface of encapsulant 286. Tapered sidewalls 290 are formed by laser drilling or other suitable method at the time when openings 288 are formed. Alternatively, tapered sidewalls 290 are formed after the initial formation of openings 288, e.g. after the formation of openings 288 with the removal of printed dots 280. As a further alternative, openings 288 are formed with tapered sidewalls upon removal of printed dots 280. FIG. 13i further shows the formation of openings 294 around a periphery of semiconductor die 276. Openings 294 are formed by the removal of encapsulant 286 by laser drilling or other suitable process and provide a smooth contour at the interface between semiconductor die 276 and encapsulant 286.

Figure 13J:
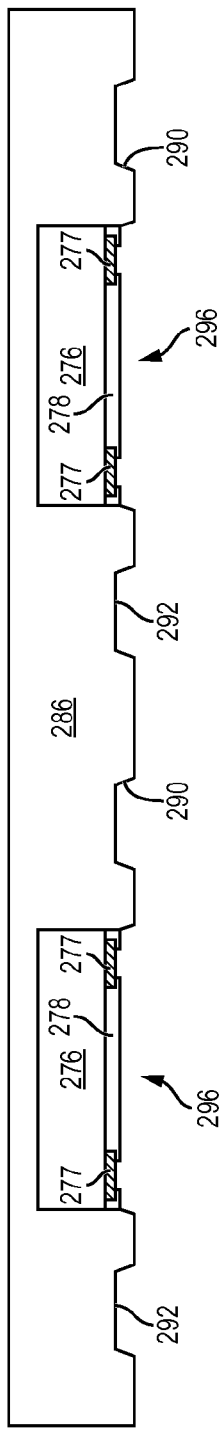

In FIG. 13j, temporary planarization layer 282 is removed. Temporary planarization layer 282 is removed with a wet cleaning process including solvent, an aqueous clean with carbon dioxide ($CO_2$) dosing, or other suitable process. The removal of temporary planarization layer 282 exposes insulation layer 278 and portions of contact pads 277 not covered by insulation layer 278. The removal of temporary planarization layer 282, which provided increased offset between the active surface of semiconductor die 276 and the top surface of interface layer 272, further provides opening or cavity 296. Opening 296 is formed over the active surface of semiconductor die 276 and extends from a level of a bottom or backside surface of encapsulant 286 to insulation layer 278 and contact pads 277 of semiconductor die 276. A surface of opening 296 follows a contour of a sidewall of encapsulant 286, extends along insulation layer 278, along a sidewall of the openings in insulation layer 278 over contact pads 277, and along a surface of contact pads 277.

In an alternate embodiment, temporary planarization layer 282 is not entirely removed but remains over the active surface of semiconductor die 276 and insulation layer 278 as an additional insulation or dielectric layer. In the embodiment where temporary planarization layer 282 is not entirely removed, the temporary planarization layer contains one or more layers of SiO2, Si3N4, SiON, Ta2O5, Al2O3, hafnium oxide (HfO2), photosensitive polyimide, non-photosensitive polyimide, BCB, PBO, dielectric film material, or other material having similar insulating and structural properties with a curing temperature of less than or equal to 380° C. A portion of temporary planarization layer 282 is removed from over contact pads 277 by laser drilling, UV exposure, or other suitable process to form an opening or via which exposes a portion of contact pads 277. The portion of temporary planarization layer 282 removed from over contact pads 277 is removed after the curing of the temporary planarization layer, or alternatively, is removed before semiconductor die 276 is singulated and mounted over carrier 270. Furthermore, a portion of insulation layer 278 can also be removed in a same process step as the removal of the portion of temporary planarization layer 282 in order to expose the portion of contact pads 277.

Figure 13K:
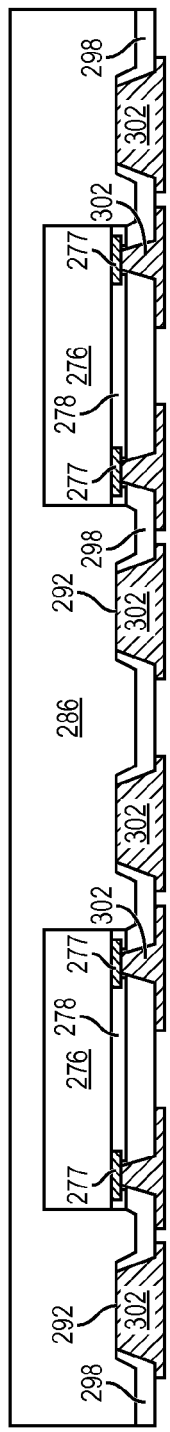

In FIG. 13k, a first portion of a FO-WLCSP interconnect or RDL is formed by the deposition and patterning of insulation or passivation layer 298 and the deposition and patterning of conductive layer 302. Insulation layer 298 is conformally applied to, and has a first surface that follows the contours of, encapsulant 286, openings 288 including sidewalls 290 and bottom surfaces 292, and opening 296. Insulation layer 298 has a second planar surface opposite the first surface. Insulation layer 298 contains one or more layers of photosensitive low curing temperature dielectric resist, photosensitive composite resist, liquid crystal polymer (LCP), laminate compound film, insulation paste with filler, solder mask resist film, liquid molding compound, granular molding compound, polyimide, BCB, PBO, SiO2, Si3N4, SiON, Ta2O5, Al2O3, or other material having similar insulating and structural properties. Insulation layer 298 is deposited using printing, spin coating, spray coating, lamination, or other suitable process. Insulation layer 298 is subsequently patterned and cured using UV exposure followed by developing, or other suitable process. A portion of insulation layer 298 is removed by laser ablation, etching, or other suitable process to expose bottom surfaces 292 of openings 288 and contact pads 277 of semiconductor die 276 according to the configuration and design of semiconductor die 276.

An electrically conductive layer 302 is patterned and deposited over encapsulant 286, semiconductor die 276, and insulation layer 298. Conductive layer 302 can be one or more layers of Al, Cu, Sn, Ni, Au, Ag, or other suitable electrically conductive material. The deposition of conductive layer 302 uses PVD, CVD, electrolytic plating, electroless plating, or other suitable process. In one embodiment, conductive layer 302 includes a seed layer of Ti/Cu, TiW/Cu, or a coupling agent/Cu. The seed layer is deposited by sputtering, electroless plating, or by depositing laminated Cu foil combined with electroless plating. In one embodiment, conductive layer 302 has a thickness of at least 8 um within the openings in insulation layer 298. The openings in insulation layer 298 extend completely through the insulation layer over openings 288 and contact pads 277. Conductive layer 302 operates as a RDL to extend electrical connection from semiconductor die 276 to points external to semiconductor die 276. A portion of conductive layer 302 formed within openings 288 forms lands on the bottom surfaces 292 of openings 288 that serve as a stop layer for subsequent drilling or removal of a portion of encapsulant 286 from the top side of encapsulant 286. In one embodiment, the portion of conductive layer 302 formed within openings 288 has a width that is greater than a width of the portion of conductive layer 302 formed over contact pads 277.

Figure 13L:
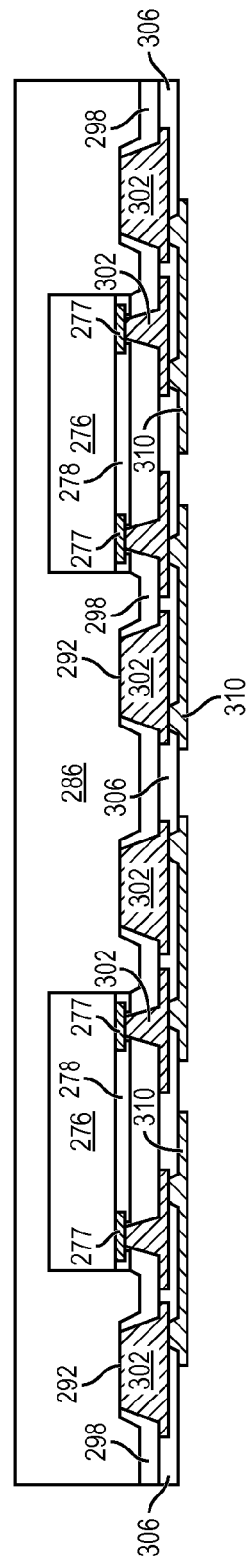

In FIG. 13l, insulation or passivation layer 306 is conformally applied to, and follows the contours of, insulation layer 298 and conductive layer 302. Insulation layer 306 contains one or more layers of photosensitive low curing temperature dielectric resist, photosensitive composite resist, LCP, laminate compound film, insulation paste with filler, solder mask resist film, liquid molding compound, granular molding compound, polyimide, BCB, PBO, SiO2, Si3N4, SiON, Ta2O5, Al2O3, or other material having similar insulating and structural properties. Insulation layer 306 is deposited using printing, spin coating, spray coating, lamination, or other suitable process. Insulation layer 306 is subsequently patterned and cured using UV exposure followed by developing, or other suitable process. A portion of insulation layer 306 is removed by laser ablation, etching, or other suitable process to expose portions of conductive layer 302.

An electrically conductive layer 310 is patterned and deposited over conductive layer 302, insulation layer 306, semiconductor die 276, and encapsulant 286. Conductive layer 310 can be one or more layers of Al, Cu, Sn, Ni, Au, Ag, or other suitable electrically conductive material. The deposition of conductive layer 310 uses PVD, CVD, electrolytic plating, electroless plating, or other suitable process. In one embodiment, conductive layer 310 includes a seed layer of Ti/Cu, TiW/Cu, or a coupling agent/Cu. The seed layer is deposited by sputtering, electroless plating, or by depositing laminated Cu foil combined with electroless plating. In one embodiment, conductive layer 310 has a thickness of at least 8 um within openings in insulation layer 306. The openings in insulation layer 306 extend completely through the insulation layer over conductive layer 302. Conductive layer 310 operates as an RDL to extend electrical connection from semiconductor die 276, through conductive layer 302, to points external to semiconductor die 276.

In FIG. 13m, insulation or passivation layer 314 is conformally applied to, and follows the contours of, insulation layer 306 and conductive layer 310. Insulation layer 314 contains one or more layers of photosensitive low curing temperature dielectric resist, photosensitive composite resist, LCP, laminate compound film, insulation paste with filler, solder mask resist film, liquid molding compound, granular molding compound, polyimide, BCB, PBO, SiO2, Si3N4, SiON, Ta2O5, Al2O3, or other material having similar insulating and structural properties. Insulation layer 314 is deposited using printing, spin coating, spray coating, lamination, or other suitable process. Insulation layer 314 is subsequently patterned and cured using UV exposure followed by developing, or other suitable process. A portion of insulation layer 314 is removed by laser ablation, etching, or other suitable process to expose portions of conductive layer 310.

An electrically conductive layer 318 is patterned and deposited over conductive layer 310, insulation layer 314, semiconductor die 276, and encapsulant 286. Conductive layer 318 can be one or more layers of Al, Cu, Sn, Ni, Au, Ag, or other suitable electrically conductive material. The deposition of conductive layer 318 uses PVD, CVD, electrolytic plating, electroless plating, or other suitable process.

In one embodiment, conductive layer 318 includes a seed layer of Ti/Cu, TiW/Cu, or a coupling agent/Cu. The seed layer is deposited by sputtering, electroless plating, or by depositing laminated Cu foil combined with electroless plating. In one embodiment, conductive layer 318 has a thickness of at least 8 um within the openings in insulation layer 314 that extend completely through the insulation layer over conductive layer 310. Conductive layer 318 operates as an RDL to extend electrical connection from semiconductor die 276, through conductive layers 302 and 310, to points external to semiconductor die 276 according to the configuration and design of semiconductor die 276. Taken together, insulation layers 298, 306, and 314 as well as conductive layers 302, 310, and 318, form interconnect structure 320. The number of insulation and conductive layers included within interconnect 320 depends on, and varies with, the complexity of circuit routing design. Accordingly, interconnect 320 can include any number of insulation and conductive layers to facilitate electrical interconnect with respect to semiconductor die 276. Furthermore, elements that would otherwise be included in a backside interconnect structure or RDL can be integrated as part of interconnect 320 to simplify manufacturing and reduce fabrication costs with respect to a package including both front side and backside interconnects or RDLs.

In FIG. 13n, insulation or passivation layer 322 is conformally applied to, and follows the contours of, insulation layer 314 and conductive layer 318. Insulation layer 322 contains one or more layers of photosensitive low temperature curing dielectric resist, photosensitive composite resist, LCP, laminate compound film, insulation paste with filler, solder mask resist film, liquid molding compound, granular molding compound, polyimide, BCB, PBO, SiO2, Si3N4, SiON, Ta2O5, Al2O3, or other material having similar insulating and structural properties. Insulation layer 322 is deposited using printing, spin coating, spray coating, lamination, or other suitable process. Insulation layer 322 is subsequently patterned and cured with UV exposure followed by developing or other suitable process. A portion of insulation layer 322 is removed by laser ablation, etching, or other suitable process to expose portions of conductive layer 318.

An electrically conductive bump material is deposited over conductive layer 318 and insulation layer 322 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 318 using a suitable attachment or bonding process. In one embodiment, the bump material is reflowed by heating the material above its melting point to form spherical balls or bumps 326. In some applications, bumps 326 are reflowed a second time to improve electrical contact to conductive layer 318. In one embodiment, bumps 326 are formed over a UBM having a wetting layer, barrier layer, and adhesive layer. The bumps can also be compression bonded to conductive layer 318. Bumps 326 represent one type of interconnect structure that can be formed over conductive layer 318. The interconnect structure can also use bond wires, conductive paste, stud bump, micro bump, or other electrical interconnect.

Figure 13P:
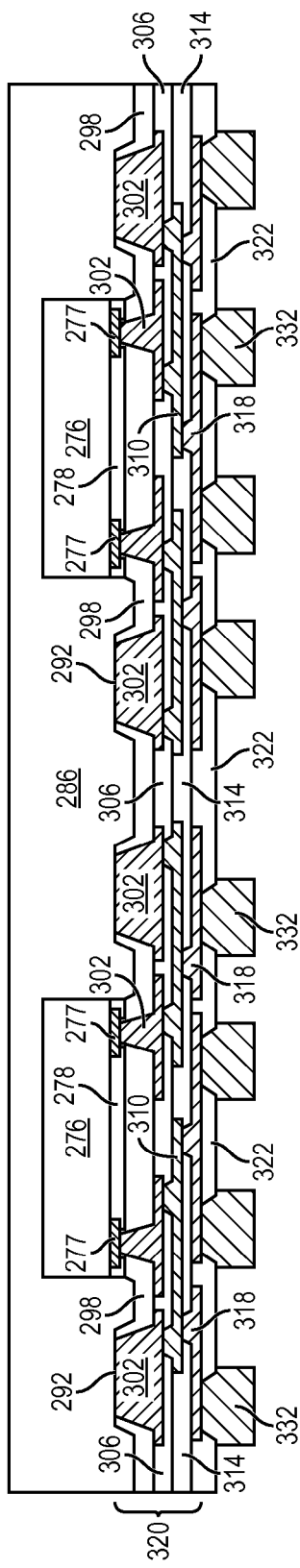
Figure 13Q:
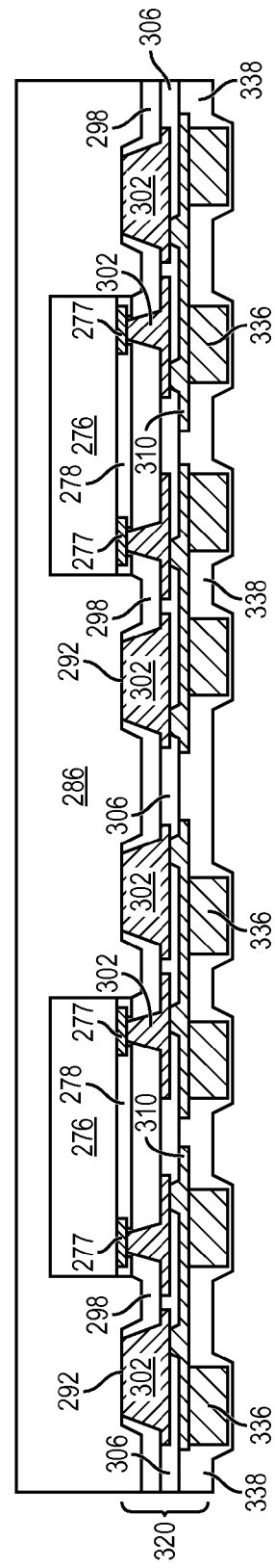

FIGS. 13o-13q, similar to FIG. 13n, show alternate interconnect structures that can be electrically connected to interconnect 320 for extending electrical connection from semiconductor die 276 to points external to semiconductor die 276. In FIG. 13o, instead of bumps 326, bumps 328 are formed over conductive layer 318. Bumps 328 are Ni/Au, Ni/Pt/Au, or Ni/Pd/Au and are formed as I/O pads for extending electrical connection from semiconductor die 276 to points external to semiconductor die 276.

In FIG. 13p, bumps 332 are formed over conductive layer 318. Bumps 332 include plated copper columns and are formed as I/O pads for extending electrical connection from semiconductor die 276 to points external to semiconductor die 276.

In FIG. 13q, bumps 336 are formed over conductive layer 310. Bumps 336 include plated copper and are formed as I/O pads for extending electrical connection from semiconductor die 276 to points external to semiconductor die 276. FIG. 13q differs from FIGS. 13n-13p in that a final insulation layer 338, similar to insulation layer 322, covers both conductive layer 310 and bumps 336. Thus, final insulation layer 338 is formed after the formation of bumps 336. In other words, bumps 336 are formed over conductive layer 310 before the formation of insulation layer 338.

In FIG. 13r, back grinding tape 342 is applied over semiconductor die 276, encapsulant 286, interconnect 320, and bumps 326, 328, 332, or 336. Back grinding tape 342 contacts the final or bottom most layer of interconnect 320, such as insulation layer 322, and further contacts final I/O pads such as bumps 326. Back grinding tape 342 follows the contours of a surface of bumps 326 and extends around and between bumps 326. Back grinding tape 342 includes tapes with thermal resistance up to 270° C. Back grinding tape 342 also includes tapes with a thermal releasing function. Examples of back grinding tapes 342 include UV tape HT 440 and non-UV tape MY-595. Back grinding tape 342 provides structural support for subsequent back grinding and removal of a portion of encapsulant 286 from a backside or top surface of encapsulant 286 opposite interconnect 320.

In FIG. 13r, top surface of encapsulant 286 opposite interconnect 320 undergoes a grinding operation with grinder 344 to planarize the surface and reduce a thickness of the encapsulant. The grinding operation reduces a thickness of the reconstituted wafer to a thickness in the range of 50 to 600 um. A chemical etch can also be used to remove and planarize encapsulant 286. After the grinding operation is completed a layer of encapsulant 286 covers a backside surface of semiconductor wafer 276. Alternatively, a backside surface of semiconductor die 276 is exposed from encapsulant 286 after the grinding operation, and a thickness of semiconductor die 276 is also reduced by the grinding operation. In another embodiment, back grinding tape 342 is merely supporting tape with either a UV or thermal releasing function such that the tape, when removed, is removed without a back grinding process.

FIG. 13s shows an embodiment in which a backside surface of semiconductor die 276 is exposed from encapsulant 286 after the grinding operation. An encapsulant or molding compound 346 is deposited over and contacts a backside surface of semiconductor die 276 and encapsulant 286 using a paste printing, compressive molding, transfer molding, liquid encapsulant molding, vacuum lamination, or other suitable applicator. Encapsulant 346 can be polymer composite material, such as epoxy resin with filler, epoxy acrylate with filler, or polymer with proper filler. Encapsulant 346 is non-conductive, provides physical support, and environmentally protects the semiconductor device from external elements and contaminants when a need exists to protect the backside of semiconductor die 276.

FIG. 13t, continuing from FIG. 13r, shows a portion of encapsulant 286 is removed from a periphery of semiconductor die 276 and from over conductive layer 302 to form openings 350. Openings 350 include a vertical or sloped sidewall and extend from a back surface of encapsulant 286 completely through the encapsulant to bottom surface 292 of opening 288. Openings 350 are formed by drilling, laser ablation, high energy water jetting, etching, or other suitable process to expose portions of conductive layer 302. In one embodiment, openings 350 serve as round through encapsulant blind vias (TEBVs) that extend to, and contact, conductive layer 302. Alternatively, openings 350 include cross-sectional profiles of any shape. Openings 350 are formed and subsequently cleaned while back grinding or supporting tape 342 is attached over interconnect 320 and bumps 326. By forming openings 350 as TEBVs through encapsulant 286 in a periphery of semiconductor die 276, a portion of conductive layer 302 is exposed from a backside of encapsulant 286. Openings 350 are configured to provide subsequent 3-D electrical interconnect for semiconductor die 276 without the use of TSVs or THVs.

FIG. 13u, similar to FIG. 13t shows a portion of encapsulant 286 is removed from a periphery of semiconductor die 276 and over conductive layer 302 to form openings 352. Openings 352 include sidewalls with a first portion that is sloped, and second portion that is vertical. Openings 352 extend from a back surface of encapsulant 286 completely through the encapsulant to bottom surface 292 of opening 288. Openings 352 are formed by drilling, laser ablation, high energy water jetting, etching, or other suitable process to expose portions of conductive layer 302. Openings 352 serve as TEBVs that extend to and contact conductive layer 302. Openings 352 are formed and subsequently cleaned while back grinding or supporting tape 342 is attached over interconnect 320 and bumps 326. By forming openings 352 as TEBVs through encapsulant 286 in a periphery of semiconductor die 276, a portion of conductive layer 302 is exposed from a backside of encapsulant 286. Openings 352 are configured to provide subsequent 3-D electrical interconnect for semiconductor die 276 without the use of TSVs or THVs.

Figure 13V:
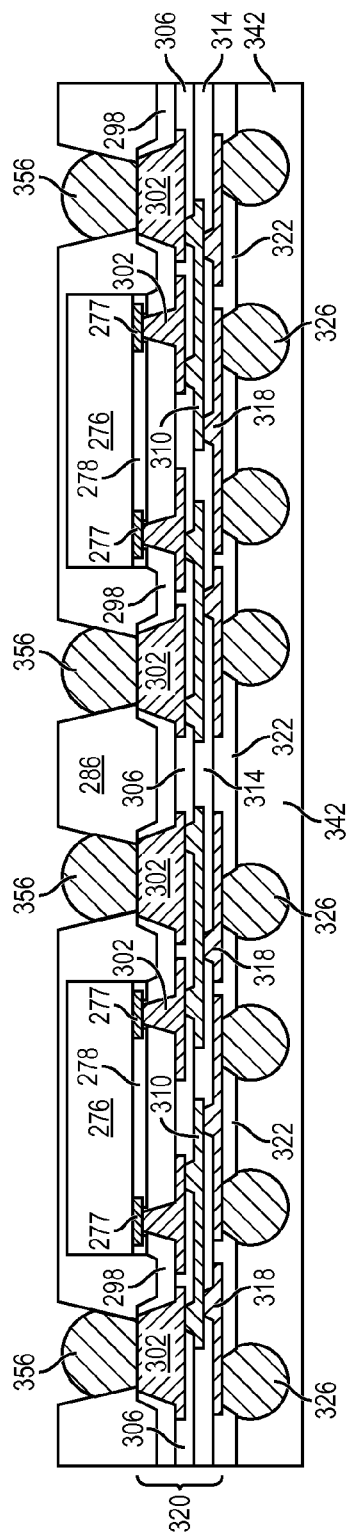
Figure 13W:
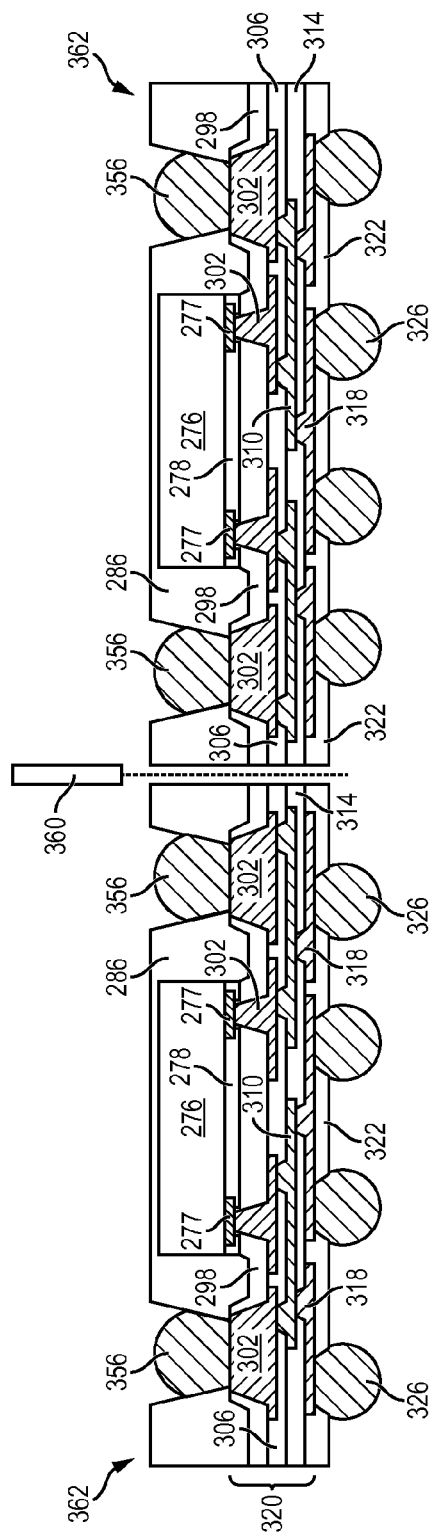

In FIG. 13v, an electrically conductive bump material is deposited in opening 350 and over conductive layer 302 using an evaporation, electrolytic plating, electroless plating, ball drop, screen printing, jetting, or other suitable process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 302 using a suitable attachment or bonding process. In one embodiment, the bump material is reflowed by heating the material above its melting point to form spherical balls or bumps 356. In some applications, bumps 356 are reflowed a second time to improve electrical contact to conductive layer 302. In one embodiment, bumps 356 are formed over a UBM having a wetting layer, barrier layer, and adhesive layer. The bumps can also be compression bonded to conductive layer 302. Bumps 356 represent one type of interconnect structure that can be formed over conductive layer 302. The interconnect structure can also use bond wires, Cu, Ag, or other conductive paste, stud bump, micro bump, solder balls with a Cu core, Cu balls or columns with dipped solder paste or solder coating, or other electrical interconnect. Bumps 356 form a 3D interconnection for next level interconnection. In one embodiment, bumps 356 are formed by SMT with paste printing deposited into openings 350 at the reconstituted wafer level. Accordingly, a 3D interconnection is formed through bumps 356, conductive layer 302, interconnect 320, bumps 326, and semiconductor die 276, thereby forming through vertical electrical interconnection for 3-D FO-WLCSP without a backside interconnect or RDL over a footprint of semiconductor die 276.

In FIG. 13w, back grinding tape 342 is removed after completing the grinding of encapsulant 286, after the formation and cleaning of openings 350, and after the formation of bumps 356. Alternatively, back grinding tape 342 is removed after completing the grinding of encapsulant 286 and after the formation and cleaning of openings 350 but before the formation of bumps 356. Furthermore, the reconstituted wafer is singulated with saw blade or laser cutting device 360 into individual 3-D FO-WLCSPs 362. Singulation can occur before or after removal of back grinding tape 342.

FIG. 13x shows a 3-D FO-WLCSP 366, similar to 3-D FO-WLCSP 362 from FIG. 13w. 3-D FO-WLCSP 366 differs from FO-WLCSP 362 in that 3-D FO-WLCSP 366 was formed without the use of temporary planarization layer 282 as shown in FIGS. 13b and 13c. Accordingly, the offset of semiconductor die 276 with respect to the bottom surface of encapsulant 286, and the subsequent presence of opening 296 resulting from the removal of temporary planarization layer 282, is not present in 3-D FO-WLCSP 366. However, like in FIG. 13w, the reconstituted wafer is singulated with saw blade or laser cutting device 368 into individual 3-D FO-WLCSPs 366. Singulation can occur before or after removal of the back grinding tape.

3-D FO-WLCSPs 362 and 366 provide 3-D electrical interconnection with an interconnect I/O array through vertical interconnects formed outside a footprint of a semiconductor die without the use of a backside RDL extending within a footprint of the semiconductor die. Optional backside alignment units with alignment keys are embedded in the encapsulant to facilitate next level SMT alignment and POP configurations. Laser drilling or other suitable method is used to form an opening in a front side of the encapsulant in a periphery of the active surface of the semiconductor die. An interconnect structure is formed over the active surface of the semiconductor die and extends into the openings in the front side of the encapsulant. The interconnect structure includes insulation and conductive layers that form a FO-WLCSP RDL. Elements that would otherwise be included in a backside interconnect structure or RDL can be integrated as part of a single interconnect structure formed over the active surface of the semiconductor die. Alternatively, backside RDL elements can be included in other later mounted components of another semiconductor device as part of a POP configuration. Bumps or other I/O interconnects are formed over the interconnect structure. Backgrinding tape is applied over the bumps, and a portion of the encapsulant and a portion of the backside of the semiconductor die are removed in a backgrinding process. Laser drilling or other suitable process removes a portion of encapsulant in a periphery of the semiconductor die to facilitate the subsequent formation of vertical interconnects such as round TEBVs that extend from a back surface of the encapsulant to the interconnect structure. The back grinding tape is removed. A bump or other suitable conductive material is formed in the TEBV to form 3D vertical interconnects for next level interconnection and POP configurations. The reconstituted wafer is singulated.

Figure 14D:
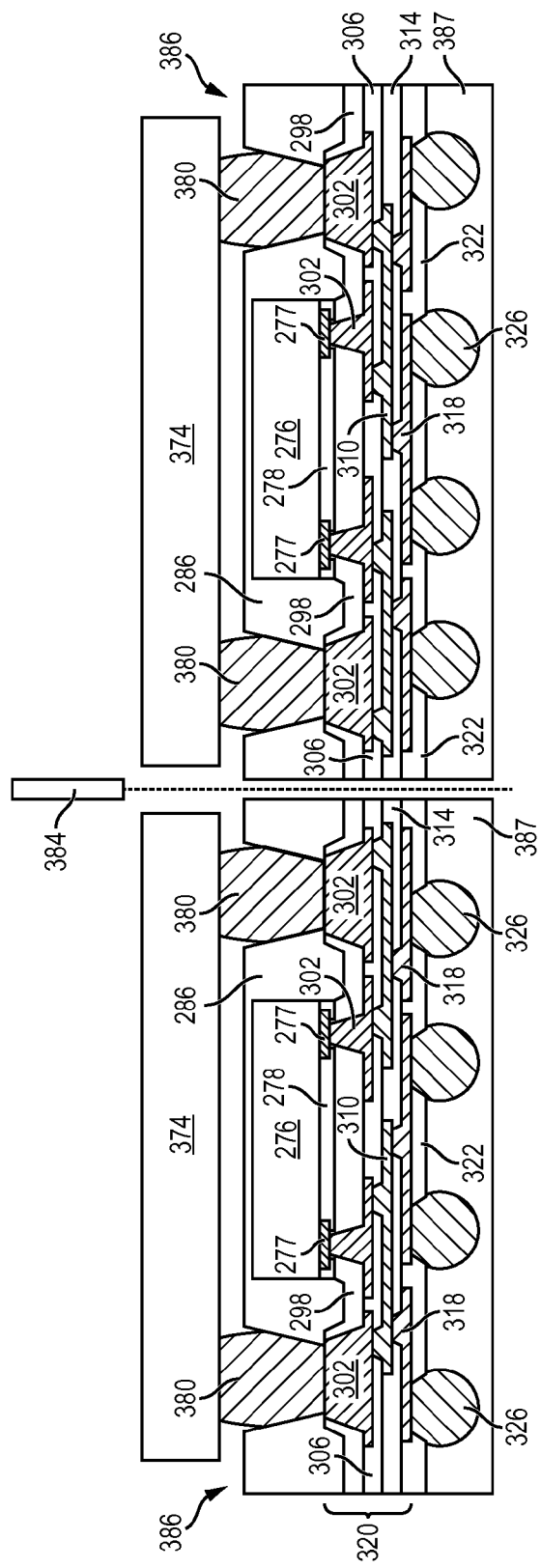

FIGS. 14a-14d, continuing from FIG. 13t, show another embodiment of forming an electrical connection with conductive layer 302 through openings 350. In FIG. 14a conductive bump material 370 is deposited in openings 350 at the reconstituted wafer level by printing, jetting, or other suitable process. Conductive bump material 370 is Al, Sn, Ni, Au, Ag, Pb, Bi, Cu, indium (In), solder, and combinations thereof, with an optional flux solution. For example, conductive bump material 370 can be eutectic Sn/Pb, high-lead solder, or lead-free solder. Conductive bump material 370 contacts conductive layer 302 and fills a portion of openings 350 that is less than an entirety of the openings to facilitate subsequent electrical interconnect.

In FIG. 14b, a bumped semiconductor device or package 374 with bumps 376 is mounted over 3-D FO-WLCSP 378 at the reconstituted wafer level. Semiconductor device 374 includes interconnect elements that would otherwise be included in a backside interconnect structure or RDL formed over the backside of semiconductor 276 that are not included as part of interconnect 320. Bumps 376 are Al, Sn, Ni, Au, Ag, Pb, Bi, Cu, In, solder, and combinations thereof, with an optional flux solution. For example, bumps 376 can be eutectic Sn/Pb, high-lead solder, or lead-free solder. Semiconductor device 374 is mounted using pick and place or other suitable operation. Semiconductor device 374 is mounted with bumps 376 oriented toward 3-D FO-WLCSP 378 such that bumps 376 extend into openings 350 and contact conductive bump material 370 within openings 350. The contact between bumps 376 and conductive bump material 370 results in an offset 380 between encapsulant 286 and a surface of semiconductor device 374. A footprint of semiconductor device 374 has an area that is larger than an area of a footprint of semiconductor die 276. Thus, the footprint of semiconductor die 276 is located within the footprint of semiconductor device 374 after the semiconductor device has been mounted to 3-D FO-WLCSP 378.

In FIG. 14c, the reconstituted wafer including semiconductor device 374 and 3-D FO-WLCSP 378 are heated to reflow bump material 370 and bumps 376. In one embodiment, bump material 370 and bumps 376 are reflowed by heating the materials above their melting points to form spherical balls or bumps 382. In some applications, bumps 382 are reflowed a second time to improve electrical contact to conductive layer 302. The bumps can also be compression bonded to conductive layer 302. Bumps 382 represent one type of interconnect structure that can be formed over conductive layer 302. The interconnect structure can also use bond wires, conductive paste, stud bump, micro bump, or other electrical interconnect.

In FIG. 14d, the reconstituted wafer including semiconductor device 374 is singulated with saw blade or laser cutting device 384 into individual 3-D FO-PoPs 386. FO-PoPs 386 are singulated before back grinding tape 342 is removed. Alternatively, back grinding tape 342 is removed after completing the grinding of encapsulant 286 and after the formation and cleaning of openings 350 but before singulation. When back grinding tape 342 is removed before singulation of FO-PoPs 386, an optional dicing tape 387 is applied over bumps 326 and contacts insulation layer 322 or the final or bottom most layer of interconnect 320, follows the contours of a surface of bumps 326, and extends around and between bumps 326.

FIGS. 15a-15d, continuing from FIG. 13t, show an alternative method for forming an electrical connection with conductive layer 302 through openings 350. After a portion of encapsulant 286 is removed from over conductive layer 302 to form openings 350, back grinding tape 342 is removed.

In FIG. 15b, the reconstituted wafer 388 including semiconductor die 276 is aligned and placed on a reusable carrier 390. Carrier 390 is made of a carrier base material, such as metal, that has thermal conductivity and stiffness properties suitable for minimizing warpage of the carrier in subsequent solder reflow cycles. Carrier 390 includes a plurality of half-ball shaped cavities 392. Cavities 392 are configured to receive bumps 326. Cavities 392 have a height that is less than a height of bumps 326. In one embodiment, cavities 392 have a height that is at least 5 um less than a height of bumps 326. Alternatively, cavities 392 have a height that is in a range of 5-100 um greater than a height of bumps 326. The difference in heights between bumps 326 and cavities 392 produces a gap or offset 394 between insulation layer 322 and a top surface of carrier 390. Cavities 392 also have a width that is greater than a width of bumps 326. In one embodiment, cavities 392 have a width that is at least 10 um greater than a width of bumps 326. The difference in widths between bumps 326 and cavities 392 produces a gap or offset between bumps 326 and a contour or surface of cavity 392.

The offset or area between cavities 392 and bumps 326 includes a non-wettable material 396. Non-wettable material 396 is deposited on, and coats, a supporting surface of carrier 390 including a surface of cavities 392. Non-wettable material 396 includes high temperature coatings such as high temperature Teflo, Ti, TiN, or other thin film materials that are inert with respect to bumps 326. Non-wettable material 396 is configured to contact bumps 326 at high temperatures without reacting or sticking to bumps 326 or insulation layer 322. For example, non-wettable material 396 is configured to not react or stick to bumps 326 or insulation layer 322 at temperatures greater than or equal to 280° C.

In one embodiment, carrier 390 includes a vacuum with a vacuum loop or vacuum hole 397 that is configured to maintain reconstituted wafer 388 in contact with carrier 390 and non-wettable material 396.

FIG. 15c, similar to FIG. 15b, shows reconstituted wafer 388 aligned and placed on reusable carrier 390. FIG. 15c differs from FIG. 15b in that offset 394 between insulation layer 322 and a top surface of carrier 390 from FIG. 15b is replaced with offset 398. Offset 398 extends between a surface of bumps 326 and a bottom surface of cavity 392, and in one embodiment includes a distance in a range of 5-100 um.

In FIG. 15d, with reconstituted wafer 388 mounted to reusable carrier 390, bumps 400 are deposited or formed within openings 350. An electrically conductive bump material is deposited within openings 350 and over conductive layer 302 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 302 using a suitable attachment or bonding process. In one embodiment, the bump material is reflowed by heating the material above its melting point to form spherical balls or bumps 400. In some applications, bumps 400 are reflowed a second time to improve electrical contact with conductive layer 302. The bumps can also be compression bonded to conductive layer 302. Bumps 400 represent one type of interconnect structure that can be formed over conductive layer 302. The interconnect structure can also use bond wires, conductive paste, stud bump, micro bump, or other electrical interconnect.

After the formation of bumps 400, reconstituted wafer 388 is singulated with saw blade or laser cutting device 404 into individual 3-D FO-WLCSPs 406.

FIGS. 16a-16d show an alternative method for forming an electrical connection with conductive layer 302 through openings 412. FIG. 16a shows back grinding tape 410, similar to back grinding tape 342 of FIG. 13r, applied over insulation layer 322 before the formation of conductive bumps similar to bumps or I/O connects 326, 328, 332, and 336 from FIGS. 13n-13q. Back grinding tape 410 includes tapes with thermal resistance up to 270° C. and tapes with a thermal releasing function. Examples of back grinding tapes 410 include UV tape HT 440 and non-UV tape MY-595. Back grinding tape 410 provides structural support for optional back grinding of encapsulant 286 at a backside or top surface of encapsulant 286 as previously described in FIG. 13r.

After applying back grinding tape 410, a portion of encapsulant 286 is removed from over conductive layer 302 to form openings 412. Openings 412 include a vertical or sloped sidewall and extend from a back surface of encapsulant 286 completely through the encapsulant to bottom surface 292 of opening 288. Openings 412 are formed by drilling, laser ablation, high energy water jetting, etching, or other suitable process to expose portions of conductive layer 302. In one embodiment, openings 412 serve as round TEBVs that extend to, and contact, conductive layer 302. Alternatively, openings 412 include cross-sectional profiles of any shape. Openings 412 are formed and subsequently cleaned while back grinding or supporting tape 410 is attached. By forming openings 412 as TEBVs through encapsulant 286 in a periphery of semiconductor die 276, a portion of conductive layer 302 is exposed from a backside of encapsulant 286.

In FIG. 16b, back grinding tape 410 is removed after the optional grinding of encapsulant 286, and after the formation and cleaning of openings 412.

In FIG. 16c, temporary supporting layer 416 is formed over reconstituted wafer 414. Temporary supporting layer 416 contacts insulation layer 322 and includes high temperature tape and thermal releasable tape. Temporary supporting layer 416 supports reconstituted wafer 414 during the formation and placement of bumps 418 and is removed after the formation of bumps 418.

Bumps 418 are formed by depositing an electrically conductive bump material over conductive layer 302 and within openings 412 using an evaporation, electrolytic plating, electroless plating, ball drop, screen printing compression bonding, or other suitable process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 302 using a suitable attachment or bonding process. In one embodiment, the bump material is reflowed by heating the material above its melting point to form spherical balls or bumps 418. In some applications, bumps 418 are reflowed a second time to improve electrical contact to conductive layer 302. Bumps 418 represent one type of interconnect structure that can be formed over conductive layer 302. The interconnect structure can also use bond wires, conductive paste, stud bump, micro bump, or other electrical interconnect. Bumps 418 are formed with a height that is less than a height of opening 412 such that bumps 418 are recessed below a backside or top surface of encapsulant 286. In one embodiment bumps 418 have a height at least 1 um less than a height of openings 412.

In another embodiment, temporary supporting layer 416 is optional and is not applied after the removal of back grinding tape 410. Without temporary supporting layer 416 to provide structural support to reconstituted wafer 414 bumps 418 are formed as described above. When bumps 418 are formed by a ball drop process a chuck of the ball drop machine is used to provide temporary support during the placement of bumps 418. The chuck of the ball drop machine is coated with compliant protecting material such as Teflo to facilitate the ball drop process.

In FIG. 16d, temporary supporting layer 422 is formed over reconstituted wafer 414 and contacts a backside surface of encapsulant 286. Temporary supporting layer 422 includes high temperature tape, thermal releasable tape, and supports reconstituted wafer 414 during the formation and placement of bumps 424.

Bumps 424 are formed over reconstituted wafer 414, opposite bumps 418, and opposite temporary supporting layer 422. Bumps 424 are formed by depositing an electrically conductive bump material over conductive layer 318 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 318 using a suitable attachment or bonding process. In one embodiment, the bump material is reflowed by heating the material above its melting point to form spherical balls or bumps 424. In some applications, bumps 424 are reflowed a second time to improve electrical contact to conductive layer 318. The bumps can also be compression bonded to conductive layer 318. Bumps 424 represent one type of interconnect structure that can be formed over conductive layer 318. The interconnect structure can also use bond wires, conductive paste, stud bump, micro bump, or other electrical interconnect.

In another embodiment, temporary supporting layer 422 is optional and is not applied to reconstituted wafer 414 for the formation of bumps 424. Bumps 424 are formed as described above, but without temporary supporting layer 422 to provide structural support to reconstituted wafer 414. When bumps 424 are formed by a ball drop process, a chuck of the ball drop machine is used to provide temporary support during the placement of bumps 424. When used for support, the chuck of the ball drop machine is coated with compliant protecting material such as Teflo.

After the formation of bumps 424, temporary supporting layer 422, if used, is removed. Reconstituted wafer 414 is singulated with saw blade or laser cutting device 426 into individual 3-D FO-WLCSPs 428.

Figure 17:
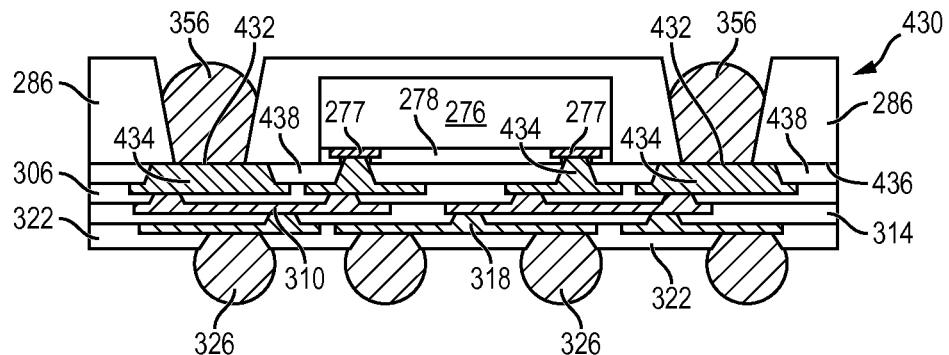
FIG. 17 illustrates another embodiment of the FO-WLCSP with a vertical interconnect structure.

FIG. 17 shows 3-D FO-WLCSP 430, similar to 3-D FO-WLCSP 366 from FIG. 13x. 3-D FO-WLCSP 430 differs from FO-WLCSP 366 in that 3-D FO-WLCSP 430 is formed without the formation of openings 288 in encapsulant 286. Accordingly, a top surface 432 of conductive layer 434 is planar with top surface 436 of insulation or passivation layer 438 in a periphery of surface 432 rather than including an encapsulant 286 with a stepped configuration in a periphery of the conductive layer as shown in FIG. 13x.

Figure 18A:
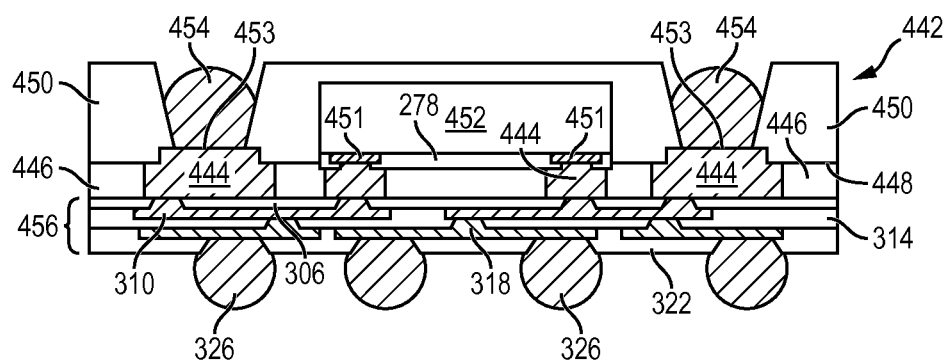
FIGS. 18a-18b illustrate an alternate embodiment of the FO-WLCSP with a vertical interconnect structure having conductive columns.

FIG. 18a, similar to FIG. 13x, shows 3-D FO-WLCSP 442, similar to 3-D FO-WLCSP 366 from FIG. 13x. 3-D FO-WLCSP 442 differs from FO-WLCSP 366 in that 3-D FO-WLCSP 442 is formed with conductive columns 444 and insulation or passivation layer 446. Conductive columns 444 are formed over front side 448 of encapsulant 450, over contact pads 451 of semiconductor die 452, and within openings 453. Conductive columns 444 are formed using a patterning and metal deposition process such as sputtering, electrolytic plating, and electroless plating. In one embodiment, conductive columns 444 are Cu. Alternatively, conductive columns 444 are one or more layers of Al, Cu, Sn, Ni, Au, Ag, or other suitable electrically conductive material. In one embodiment, conductive columns 444 include a Cu plating seed layer that is deposited with PVD over front side 448 of encapsulant 450, over contact pads 451 of semiconductor die 452, and within openings 453. Conductive columns 444 are electrically connected to contact pads 451, bumps 454, and interconnect structure 456.

Insulation layer 446 is formed over encapsulant 450, over semiconductor die 452, and around conductive columns 444, with vacuum lamination, paste printing, compression molding, spin coating, or other suitable process. Insulation layer 446 is LCP, laminate compound film, insulation paste with filler, solder mask resist film, liquid or granular molding compound, photosensitive composite resist, and photosensitive low curing temperature dielectric resist. In one embodiment, insulation layer 446 includes an optional dielectric layer that is applied and patterned on front side 448 of encapsulant 450 after forming opening 453 in encapsulant 450. After the formation of insulation layer 446, the insulation layer undergoes curing or UV exposure, development, and curing. After curing, a portion of insulation layer 446 is removed by grinding, laser drilling, or other suitable process to expose a portion of conductive columns 444 covered by insulation layer 446.

Figure 18B:
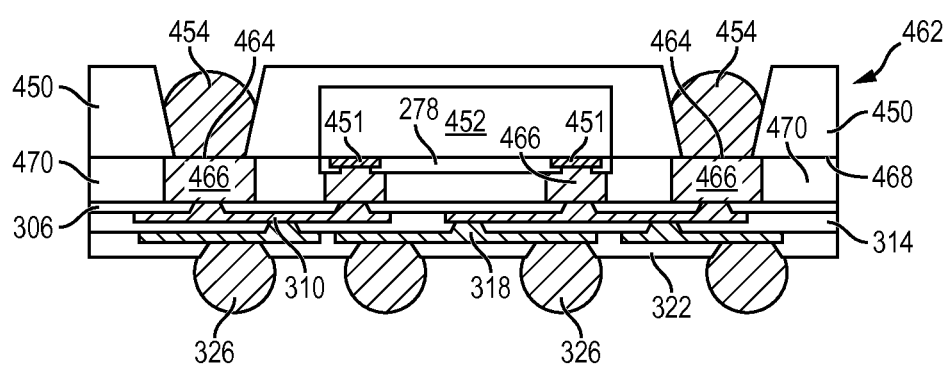

FIG. 18b shows a 3-D FO-WLCSP 462, similar to the 3-D FO-WLCSP 442 from FIG. 18a. 3-D FO-WLCSP 462 differs from FO-WLCSP 442 in that 3-D FO-WLCSP 462 is formed without the formation of openings 453 in encapsulant 450. Accordingly, a top surface 464 of conductive layer 466 is planar with front side 468 of encapsulant 450 in a periphery of surface 464 rather than including an encapsulant with a stepped configuration in a periphery of the conductive layer as shown in FIG. 18a.

Figure 19A:
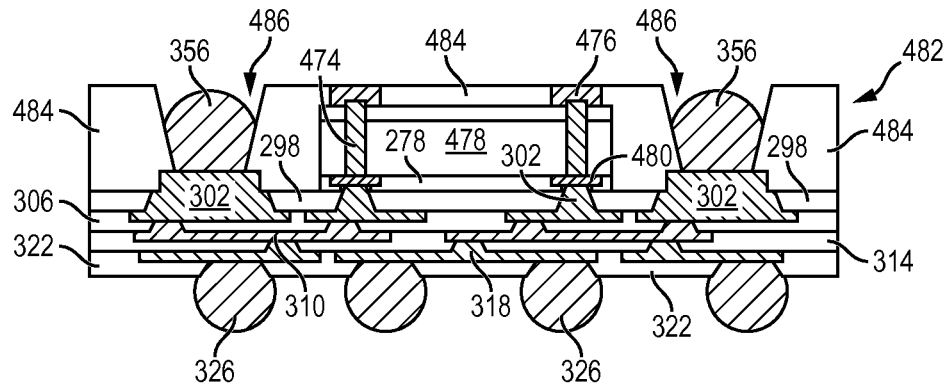
FIGS. 19a-19b illustrate another embodiment of a 3-D FO-WLCSP having conductive vias.

FIG. 19a, similar to FIG. 13x, includes the additional features of vias or TSVs 474 and contact pads 476. Vias 474 are formed through semiconductor die 478 by deep reactive ion etching (DRIE), laser drilling, or other suitable process. Vias 474 are filled with Al, Cu, Sn, Ni, Au, Ag, Ti, W, poly-silicon, or other suitable electrically conductive material using PVD, CVD, electrolytic plating, electroless plating, or other suitable metal deposition process. Alternatively, a plurality of stud bumps or solder balls can be formed within the vias. Vias 474 extend from contact pads 480 at an active surface of semiconductor die 478 to the backside of semiconductor die 478 to provide through vertical electrical interconnect for 3-D FO-WLCSP 482.

Contact pads or post TSV RDLs 476 are formed over vias 474 and over a backside of semiconductor die 478. Contact pads 476 are made with a conductive material, such as Al, Cu, Sn, Ni, Au, or Ag, and are electrically connected to vias 474 and contact pads 480. Contact pads 476 are formed by PVD, CVD, electrolytic plating, electroless plating, or other suitable process. Contact pads 476 are exposed when a backside or top surface of encapsulant 484 over contact pads 476 undergoes a grinding operation to planarize the surface and reduce a thickness of the encapsulant. In one embodiment, contact pads 476 are exposed by the back grinding process before the formation of openings 486. Alternatively, contact pads 476 can be exposed with shallow laser drilling or other suitable process either before or after the formation of openings 486.

Figure 19B:
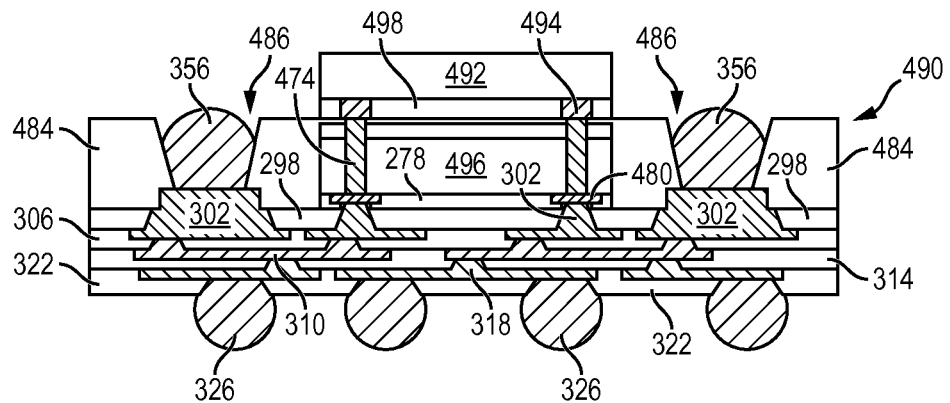

FIG. 19b shows 3-D FO-WLCSP 490 similar to 3-D FO-WLCSP 482 from FIG. 19a. 3-D FO-WLCSP 490 differs from FO-WLCSP 482 with the inclusion of semiconductor die 492 mounted with microbumps 494 over a backside of semiconductor die 496. Semiconductor die 492 is mounted at a panel level, at the reconstituted wafer level, or alternatively after an SMT process.

Figure 20A:
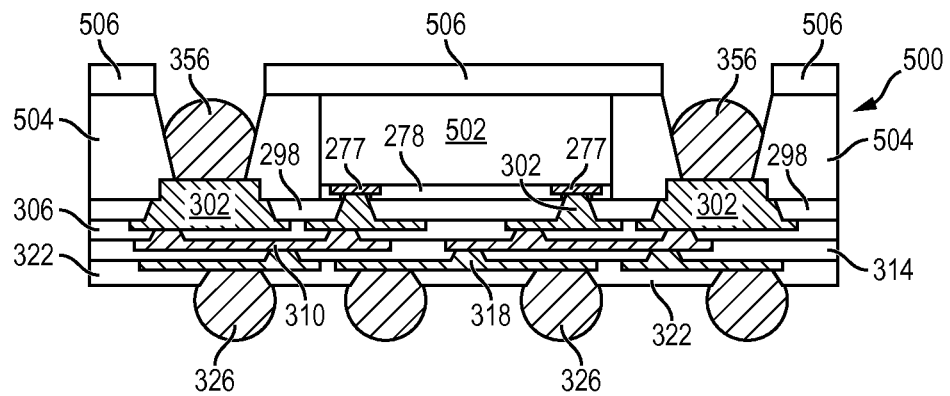
FIGS. 20a-20b illustrate a 3-D FO-WLCSP having encapsulant over the semiconductor die.

FIG. 20a shows a 3-D FO-WLCSP 500 similar to 3-D FO-WLCSP 366 from FIG. 13x. In FIG. 20a, a backside surface of semiconductor die 502 is exposed from encapsulant 504. An encapsulant or molding compound 506 is deposited over and contacts an entire backside or top surface of semiconductor die 502 and encapsulant 504. Encapsulant 506 is deposited using vacuum lamination, paste printing, compression molding, transfer molding, liquid encapsulant molding, spin coating, spray coating or other suitable process followed by curing. Encapsulant 506 is LCP with or without Cu foil, laminate compound film, insulation paste with filler, solder mask resist film, liquid or granular molding compound, photosensitive composite resist, photosensitive low curing temperature dielectric resist, or other suitable material. Encapsulant 506 is non-conductive, provides physical support, and environmentally protects the semiconductor device from external elements and contaminants. In one embodiment, encapsulant 506 has a CTE equal to or greater than 15 ppm and is black in color. A thickness of encapsulant 506 and other material properties of encapsulant 506 are selected to obtain desired warpage and reliability performance for 3-D FO-WLCSP 500.

Figure 20B:
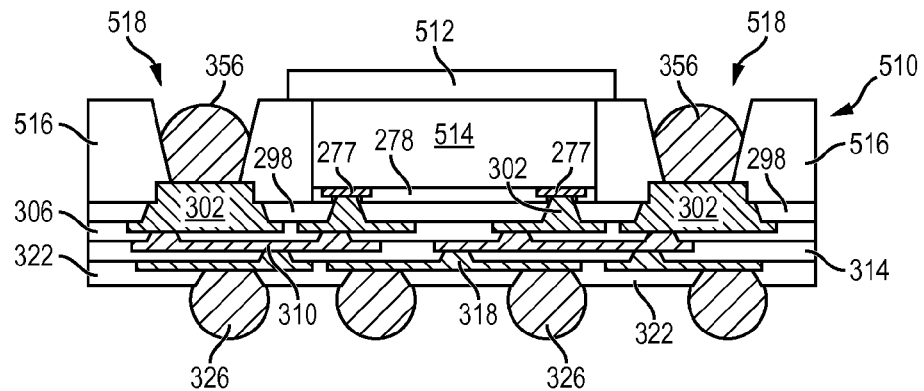

FIG. 20b shows 3-D FO-WLCSP 510 similar to 3-D FO-WLCSP 500 from to FIG. 20a. Rather than depositing encapsulant or molding compound 506 over an entire backside or top surface of semiconductor die 502 and encapsulant 504, encapsulant 512 is deposited over a backside surface of semiconductor die 514 and a portion of encapsulant 516. However, encapsulant 512 is not formed in a periphery of openings 518. Encapsulant 512 provides physical support and environmentally protects semiconductor die 514 from external elements and contaminants. In one embodiment, encapsulant 512 has a CTE equal to or greater than 15 ppm and is black in color. A thickness of encapsulant 512 and other material properties of the encapsulant are selected to obtain desired warpage and reliability performance for 3-D FO-WLCSP 510.

Figure 21A:
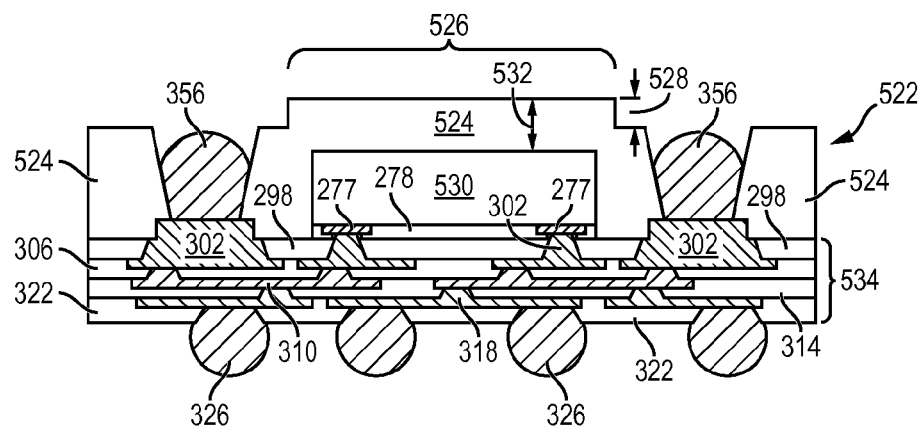
FIGS. 21a-21c illustrate 3-D FO-WLCSPs having stepped encapsulant.

FIG. 21a shows 3-D FO-WLCSP 522 similar to 3-D FO-WLCSP 366 from FIG. 13x. FO-WLCSP 522 differs from FO-WLCSP 366 in that encapsulant 524 is formed with a stepped portion 526 of encapsulant 524 that has a vertical offset 528 from a back surface of encapsulant 524 outside a footprint of semiconductor die 530. Thus stepped portion 526 forms a stepped mold cap that protrudes over a backside of semiconductor die 530. Stepped portion 526 is formed during formation of encapsulant 524. Alternatively, stepped portion 526 is formed in a selective back grinding process. Stepped portion 526 has a thickness 532 over a backside of semiconductor die 530, and in one embodiment thickness 532 is less than a thickness of semiconductor die 530. In another embodiment, thickness 532 is greater than or equal to a thickness of semiconductor die 530. Thickness 532, vertical offset 528, and a length and width of a stepped portion 526 are adjusted in order to optimize package aspect ratios and the performance of 3-D FO-WLCSP 522 in terms of thermal performance, and warpage. The length and width of stepped portion 526 are adjusted according to the design of 3-D FO-WLCSP 522 to form an area that is larger than a footprint of semiconductor die 530. Alternatively, the length and width of stepped portion 526 are adjusted to form an area that is smaller than or equal to a footprint of semiconductor die 530. In one embodiment, an outer edge of stepped portion 526 is vertically aligned with an outer edge of semiconductor die 530.

Figure 21B:
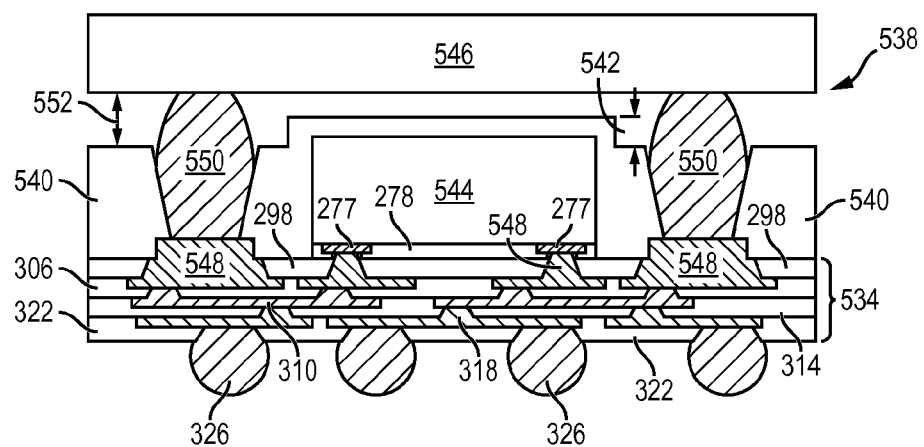

FIG. 21b shows 3-D FO-WLCSP 538 similar to the 3-D FO-WLCSP 522 from FIG. 21a. Encapsulant 540 has a vertical offset 542 with respect to a back surface of encapsulant 540 outside a footprint of semiconductor die 544. Thus, vertical offset 542 forms a stepped mold cap that protrudes over a backside of semiconductor die 544. Vertical offset 542 is formed during formation of encapsulant 540. Alternatively, vertical offset 542 is formed in a selective back grinding process. A semiconductor device or package 546 is mounted over semiconductor die 544 and is electrically connected to conductive layer 548 with bumps 550. A bottom surface of semiconductor device 546 has a vertical offset 552 with respect to a back surface of encapsulant 540 outside a footprint of semiconductor 544. A distance of vertical offset 552 is greater than a distance of vertical offset 542 such that the bottom surface of semiconductor device 546 does not contact a back surface of encapsulant 540, including a back surface of the stepped mold cap.

Figure 21C:
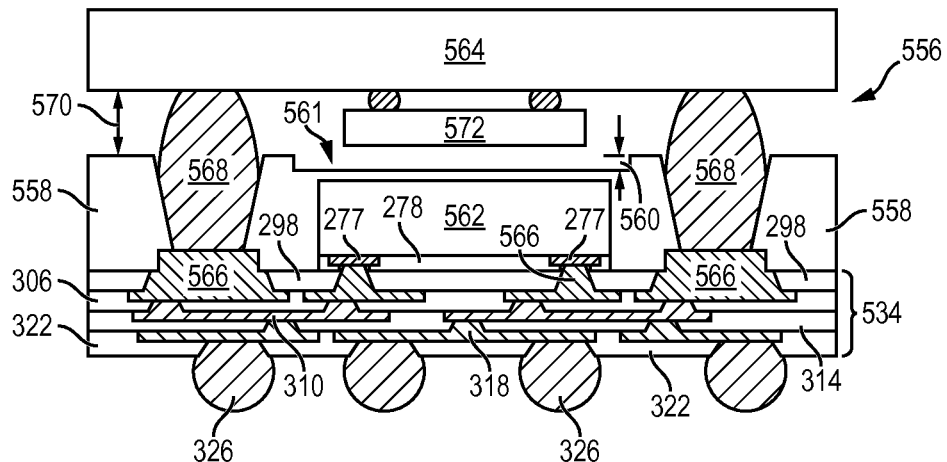

FIG. 21c shows 3-D FO-WLCSP 556 similar to 3-D FO-WLCSP 538 from FIG. 21b. Encapsulant 558 has a vertical offset 560 with respect to a top or backside surface of encapsulant 558 that forms a cavity 561 in the encapsulant over a backside of semiconductor die 562. Vertical offset 560 forms cavity 561 that is recessed with respect to, and is lower than, the top or backside surface of encapsulant 558 outside a footprint of the cavity. Cavity 561 is formed during formation of encapsulant 558. Alternatively, cavity 561 is formed in a selective back grinding process, by shallow laser grooving, wet etching, or other suitable method. Cavity 561 is configured to provide space for a later mounted semiconductor device such as a flip chip semiconductor device, bond wire BGA, bond wire LGA, discrete component, or other semiconductor device.

A semiconductor device or package 564 is mounted over semiconductor die 562 and is electrically connected to conductive layer 566 with bumps 568. A bottom surface of semiconductor device 564 has a vertical offset 570 with respect to a top or backside surface of encapsulant 558. A semiconductor device or package 572 is mounted to semiconductor device 564 and is between bumps 568. A combined distance of vertical offset 560 and 570 is greater than a vertical distance occupied by semiconductor device 572. Accordingly, semiconductor device 572 fits within cavity 561 and is positioned over and does not contact encapsulant 558.

Figure 22A:
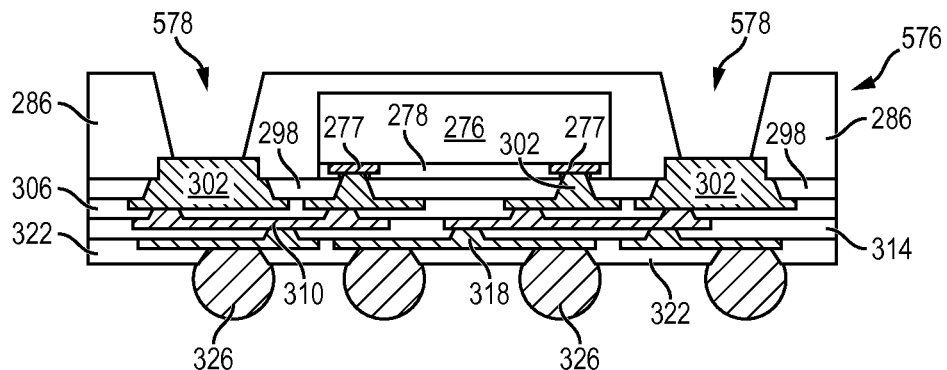
FIGS. 22a-22c illustrate another embodiment of a 3-D FO-WLCSP including a heat sink or shielding layer.

FIG. 22a shows 3-D FO-WLCSP 576 similar to 3-D FO-WLCSP 366 from FIG. 13x. However, FO-WLCSP 576 does not include the formation of electrical interconnects or bumps similar to bumps 536 in FO-WLCSP 366 for top side electrical interconnection. Electrical interconnects within openings 578 are not formed prior to completion of 3-D FO-WLCSP 576. Instead, an electrical interconnect is formed in openings 578 during an SMT process for next level interconnection, or as part of a PoP assembly process, after completion of 3-D FO-WLCSP 576.

Figure 22B:
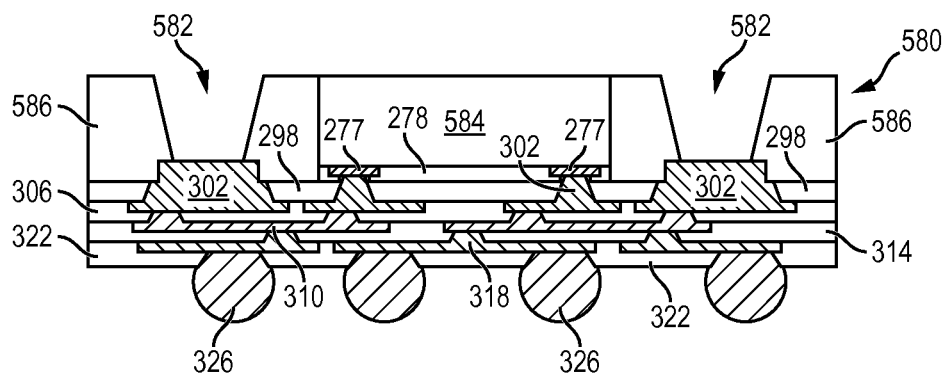

FIG. 22b, similar to FIG. 22a, shows another embodiment in which electrical interconnects or bumps similar to bumps 356 in FO-WLCSP 366 are not formed until after completion of 3-D FO-WLCSP 580. Electrical interconnects are formed in openings 582 during an SMT process for next level interconnection, or as part of a PoP assembly process. In contrast with FIG. 22a, FIG. 22b shows a backside of semiconductor die 584 is exposed from encapsulant 586 as part of singulated 3-D FO-WLCSP 580.

Figure 22C:
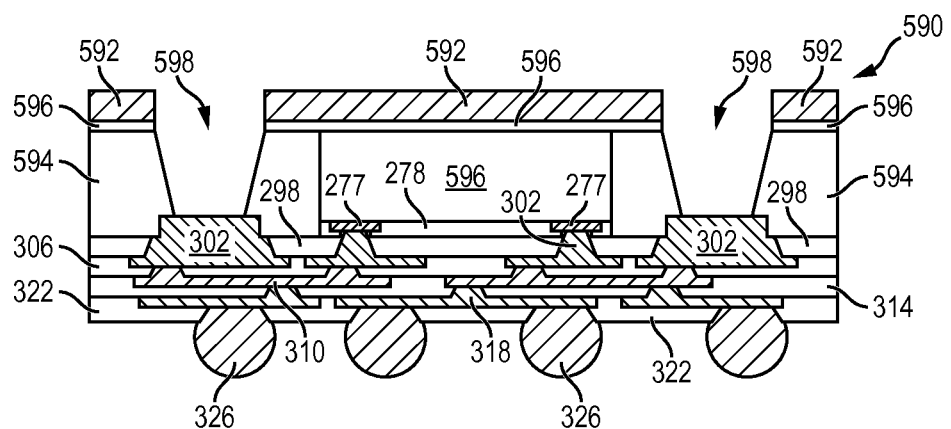

FIG. 22c, similar to FIG. 22b, shows FO-WLCSP 590 with conductive layer 592 formed over, or on, a top or backside surface of encapsulant 594 and over a backside of semiconductor die 596. Conductive layer or film 592 is Cu, Al, ferrite or carbonyl iron, stainless steel, nickel silver, low-carbon steel, silicon-iron steel, foil, conductive resin, and other material with high thermal conductivity or capable of blocking or absorbing electromagnetic interference (EMI), radio frequency interference (RFI), harmonic distortion, and other inter-device interference. Conductive layer 592 is patterned and conformally deposited using a lamination, printing, electrolytic plating, electroless plating, sputtering, PVD, CVD, or other suitable metal deposition process. Conductive layer 592 can be formed with an optional insulation or protection layer 596.

Optional insulation layer 596 is formed over a backside of semiconductor die 596. Insulation layer 596 contains one or more layers of photosensitive low curing temperature dielectric resist, photosensitive composite resist, LCP, laminate compound film, insulation paste with filler, solder mask resist film, liquid molding compound, granular molding compound, polyimide, BCB, PBO, SiO2, Si3N4, SiON, Ta2O5, Al2O3, or other material having similar insulating and structural properties. Insulation layer 596 is deposited using printing, spin coating, spray coating, lamination, or other suitable process.

Conductive layer 592 and optional insulation layer 596 can be formed on the backside of encapsulant 594 and semiconductor die 596 before or after the formation of openings 598. In one embodiment, conductive layer 592 acts as a heat sink to improve thermal performance of 3-D FO-WLCSP 590. In another embodiment, conductive layer 592 acts as a shielding layer for blocking or absorbing EMI, RFI, harmonic distortion, and other interference.

Figure 23:
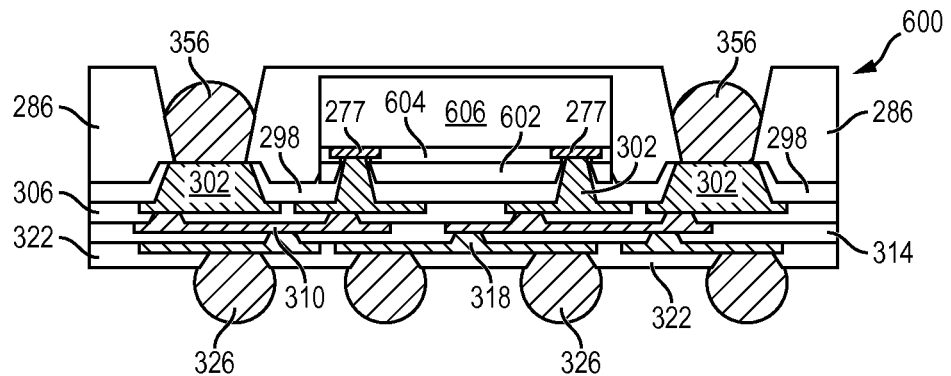
FIG. 23 illustrates 3-D FO-WLCSPs having a crack stop layer.

FIG. 23 shows a 3-D FO-WLCSP 600, similar to 3-D FO-WLCSP 362 from FIG. 13w. 3-D FO-WLCSP 600 differs from FO-WLCSP 362 by the inclusion of crack stop layer 602. Crack stop layer 602 is conformally applied over, and follows the contours of, insulation layer 604 over semiconductor die 606 with spin coating, vacuum lamination, screen printing, or other suitable process. Crack stop layer 602 contains one or more layers of SiO2, Si3N4, SiON, Ta2O5, Al2O3, HfO2, photosensitive polyimide, non-photosensitive polyimide, BCB, PBO, dielectric film material, or other material having similar insulating and structural properties with a curing temperature of less than or equal to 380° C. Crack stop layer 602 has a high tensile strength and high elongation that aids in the prevention of cracks within 3-D FO-WLCSP 600. In one embodiment, crack stop layer 602 has a tensile strength greater than or equal to 100 megapascals (MPa) and an elongation in the range of 30-150%. A portion of crack stop layer 602 is removed from over contact pads 277 by laser drilling, reactive ion etching (RIE), UV exposure, or other suitable process to form an opening or via which exposes a portion of contact pads 277. The portion of crack stop layer 602 removed from over contact pads 277 is removed after the curing of the crack stop layer, or alternatively, is removed before semiconductor die 606 is singulated and subsequently mounted within a portion of 3-D FO-WLCSP 600. In one embodiment, a portion of insulation layer 604 is also removed in a same process step as the removal of the portion of crack stop layer 602 in order to expose the portion of contact pads 277.

FIG. 24a shows a 3-D FO-WLCSP 610, similar to 3-D FO-WLCSP 362 from FIG. 13w. 3-D FO-WLCSP 610 differs from FO-WLCSP 362 by inclusion of an interconnect structure 612 that is expanded horizontally with respect to interconnect 320. Interconnect structure 612 includes conductive layer 614, similar to conductive layer 302, that extends into openings or voids 616 and 618 in encapsulant 620. Openings 616 and 618 are analogous to openings 288 in FIG. 13h, and are formed in a front side of encapsulant 620. Openings 624 are analogous to openings 350 from FIG. 13t, and are formed in a backside of encapsulant 620 and over openings 616. Openings 624 are not formed over openings 618. Accordingly, not every opening 616 and 618 formed in the front side of encapsulant 620 will have a corresponding opening 624 formed in the backside of encapsulant 620. Openings 618 that do not have a corresponding opening 624 formed in the backside of encapsulant 620 are positioned within 3-D FO-WLCSP 610 such that bump or front side I/O interconnects 628 are formed over, and vertically aligned with, openings 618. The number and configuration of conductive and insulation or passivation layers included within interconnect structure 612 varies with the complexity of circuit routing design according to the design and function of 3-D FO-WLCSP 610, and provides additional interconnect capabilities.

FIG. 24b, similar to FIG. 24a, shows FO-WLCSP 632 with a horizontally expanded interconnect structure 634 that extends into openings 636, 638, and 640. Conductive layer 642 is conformally applied to, and follows the contours of, insulation or passivation layer 644. Conductive layer 642 extends into openings 636, but does not extend into openings 638 and 640. Opening 638 does not have a corresponding opening 644 formed in the backside of encapsulant 646, and is positioned within 3-D FO-WLCSP 632 such that a bump or front side I/O interconnect 648 is formed over, and is vertically aligned with, opening 638. A portion of conductive layer 642, while not extending into opening 638, does extend between opening 638 and interconnect 648. Similarly, opening 640 does not have a corresponding opening 644 formed in the backside of encapsulant 646, but is positioned within 3-D FO-WLCSP 632 such that a bump or front side I/O interconnect 648 is formed over, and is horizontally aligned with, opening 640. A portion of conductive layer 642 does not extend between opening 640 and interconnect 648. The number and configuration of conductive and insulation or passivation layers within interconnect 634 varies with the complexity of circuit routing design according to the design and function of 3-D FO-WLCSP 632.

FIG. 25a, similar to FIG. 24a, shows 3-D FO-WLCSP 652 with a horizontally expanded interconnect structure 654. 3-D FO-WLCSP 652 includes encapsulant layer 656 with openings or voids 658 formed in multiple rows on a front side of the encapsulant layer. Interconnect structure 654 is formed over the front side of encapsulant 654 and a portion of the interconnect structure extends into openings 658. Conductive layer 660 is formed as a portion of interconnect structure 654 and is conformally applied to, and follows the contours of, insulation or passivation layer 662. Conductive layer 660 extends into openings 658, and each opening 658 has a corresponding opening 664 formed in the backside of encapsulant 656. Accordingly, openings 664 are formed in multiple rows and are positioned as an array for vertical electrical connection through the backside of FO-WLCSP 652. Electrical connection through openings 664 is accomplished by depositing conductive material within the openings and on interconnect structure 654 as previously described. Openings 658 are positioned within 3-D FO-WLCSP 652 such that a bump or front side I/O interconnect 668 is formed over, and is vertically aligned with, each opening 658. The number and configuration of conductive and insulation or passivation layers within interconnect 654 varies with the complexity of circuit routing design and according to the design and function of 3-D FO-WLCSP 652. Accordingly, 3-D FO-WLCSP 652 provides 3-D electrical interconnection with an interconnect I/O array through vertical interconnects formed outside a footprint of semiconductor die 670 without the use of a backside RDL that extends within a footprint of the semiconductor die.

FIG. 25b, similar to FIG. 25a, shows 3-D FO-WLCSP 674 with a horizontally expanded interconnect structure 676. 3-D FO-WLCSP 674 differs from FO-WLCSP 652 in that a thin layer of insulation or passivation 678 remains in opening 680 between opening 684 formed in a backside of encapsulant 682 and conductive layer 686. In one embodiment insulation layer 678 is underdeveloped such that the thin layer of insulation layer 678 remains in opening 680. Accordingly, 3-D FO-WLCSP 674 provides 3-D electrical interconnection with an interconnect I/O array through vertical interconnects formed outside a footprint of semiconductor die 686 without the use of a backside RDL that extends within a footprint of the semiconductor die.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a first semiconductor die;
   forming a first insulating layer around the first semiconductor die;
   forming a second insulating layer over the first semiconductor die and first insulating layer;
   forming a second opening through the second insulating layer and extending into the first insulating layer;
   forming a conductive layer over the second insulating layer and extending into the second opening and to a contact pad of the first semiconductor die;
   forming a first opening in the first insulating layer after forming the first insulating layer, wherein the first opening extends to the conductive layer; and
   forming a first interconnect structure in the first opening.

2. The method of claim 1, wherein forming the first interconnect structure includes forming a solder bump.

3. The method of claim 1, further including disposing a second semiconductor die over the first semiconductor die.

4. The method of claim 1, further including forming a second interconnect structure over the conductive layer.

5. The method of claim 1, further including forming the first insulating layer to include a stepped portion over the first semiconductor die.

6. A method of making a semiconductor device, comprising:
   providing a first semiconductor die;
   disposing the semiconductor die on a carrier with an active surface of the first semiconductor die oriented toward the carrier;
   forming an insulating layer around the first semiconductor die including a surface of the insulating layer oriented toward the carrier and approximately coplanar with an active surface of the first semiconductor die;
   removing the first semiconductor die and insulating layer from the carrier;
   forming a conductive layer over the surface of the insulating layer and the active surface of the first semiconductor die after removing the first semiconductor die from the carrier; and forming a first interconnect structure through the insulating layer and coupled to the conductive layer.

7. The method of claim 6, further including:
forming a first opening in the insulating layer extending to the conductive layer; and
forming the first interconnect structure in the first opening.

8. The method of claim 7, wherein forming the interconnect structure includes forming a bump within the opening over the conductive layer.

9. The method of claim 6, further including disposing a second semiconductor die over the first semiconductor die.

10. The method of claim 6, further including forming a second interconnect structure over the first semiconductor die.

11. The method of claim 7, further including:
forming a second opening in the insulating layer; and
forming the conductive layer partially within the second opening.

12. The method of claim 6, further including forming the insulating layer to include a stepped portion over the first semiconductor die.

13. A method of making a semiconductor device, comprising:
providing a first semiconductor die;
forming an insulating layer around the first semiconductor die;
forming a second opening in the insulating layer;
forming a conductive layer over the insulating layer and partially within the second opening;
forming a first opening in the insulating layer extending to the conductive layer after forming the conductive layer; and
forming an interconnect structure in the first opening over the conductive layer.

14. The method of claim 13, wherein forming the interconnect structure includes forming a bump within the opening over the conductive layer.

15. The method of claim 13, further including disposing a second semiconductor die over the first semiconductor die.

16. The method of claim 13, further including forming an interconnect structure over the first semiconductor die.

17. The method of claim 13, further including forming the insulating layer to include a stepped portion over the first semiconductor die.

18. A method of making a semiconductor device, comprising:
providing a first semiconductor die;
forming an insulating layer around the first semiconductor die;
forming a first opening in the insulating layer and within a height of the first semiconductor die;
forming a first interconnect structure in the first opening in the insulating layer;
forming a second opening in the insulating layer; and
forming a conductive layer over the insulating layer and partially within the second opening.

19. The method of claim 18, further including disposing a second semiconductor die over the first semiconductor die.

20. The method of claim 18, further including forming a second interconnect structure over the first semiconductor die.

* * * * *